(12) United States Patent
Masuoka et al.

(10) Patent No.: US 8,896,056 B2
(45) Date of Patent: Nov. 25, 2014

(54) SURROUNDING GATE TRANSISTOR SEMICONDUCTOR DEVICE

(75) Inventors: Fujio Masuoka, Tokyo (JP); Tomohiko Kudo, Tokyo (JP)

(73) Assignee: Unisantis Electronics Singapore Pte Ltd., Singapore (SG)

( * ) Notice: Subject to any disclaimer, the term of this patent is extended or adjusted under 35 U.S.C. 154(b) by 477 days.

(21) Appl. No.: 12/704,306

(22) Filed: Feb. 11, 2010

(65) Prior Publication Data

US 2010/0207200 A1 Aug. 19, 2010

Related U.S. Application Data

(63) Continuation of application No. PCT/JP2007/073452, filed on Dec. 5, 2007.

(60) Provisional application No. 61/207,620, filed on Feb. 13, 2009.

(51) Int. Cl.
| | |
|---|---|
| H01L 29/66 | (2006.01) |
| H01L 29/423 | (2006.01) |
| H01L 29/78 | (2006.01) |
| H01L 29/06 | (2006.01) |
| H01L 29/49 | (2006.01) |
| H01L 29/51 | (2006.01) |

(52) U.S. Cl.
CPC ...... *H01L 29/42356* (2013.01); *H01L 29/7827* (2013.01); *H01L 29/0657* (2013.01); *H01L 29/495* (2013.01); *H01L 29/4966* (2013.01); *H01L 29/4975* (2013.01); *H01L 29/517* (2013.01); *H01L 29/518* (2013.01)
USPC .......................................................... 257/329

(58) Field of Classification Search
USPC .................... 257/190, 329, E21.411; 438/152
See application file for complete search history.

(56) References Cited

U.S. PATENT DOCUMENTS 5,136,350 A 8/1992 Itoh
5,155,054 A 10/1992 Itoh
(Continued)

FOREIGN PATENT DOCUMENTS

| EP | 2 219 210 | 8/2010 |
|---|---|---|
| JP | 01-232755 A | 9/1989 |

(Continued)

OTHER PUBLICATIONS

J. M. Hergenrother et al., The vertical replacement-gate (VRG) MOSFET, 2002, Solid-State Electronics 46 (2002), pp. 939-950.*

(Continued)

*Primary Examiner* — Anthony Ho
(74) *Attorney, Agent, or Firm* — Brinks Gilson & Lione

(57) ABSTRACT

It is intended to solve a problem of increase in power consumption and reduction in operating speed due to an increase in parasitic capacitance of a surrounding gate transistor (SGT) as a three-dimensional semiconductor device, to provide an SGT achieving an increase in speed and power consumption reduction in a semiconductor circuit. The semiconductor device comprises a second-conductive type impurity region (510) formed in a part of a first-conductive type semiconductor substrate (100), a first silicon pillar (810) of an arbitrary cross-sectional shape formed on the second-conductive type impurity region, a first insulating body (310) surrounding a part of a surface of the first silicon pillar, a gate (210) surrounding the first insulating body, and a second silicon pillar (820) which is formed on the first silicon pillar and which includes a second-conductive type impurity region (540). The gate is disposed to be separated from the semiconductor substrate by a second insulating body and is disposed to be separated from the second silicon pillar by the second insulating body. The capacitance between the gate and the semiconductor substrate is less than a gate capacitance, and the capacitance between the gate and the second silicon pillar is less than the gate capacitance.

11 Claims, 50 Drawing Sheets

(56) References Cited

U.S. PATENT DOCUMENTS

| | | | |
|---|---|---|---|
| 5,308,782 | A | 5/1994 | Mazuré et al. |
| 5,504,359 | A | 4/1996 | Rodder |
| 5,937,315 | A | 8/1999 | Xiang et al. |
| 5,943,574 | A | 8/1999 | Tehrani et al. |
| 5,994,735 | A | 11/1999 | Maeda et al. |
| 6,027,975 | A | 2/2000 | Hergenrother et al. |
| 6,127,209 | A | 10/2000 | Maeda et al. |
| 6,300,198 | B1 | 10/2001 | Aeugle et al. |
| 6,342,410 | B1 | 1/2002 | Yu |
| 6,420,751 | B1 | 7/2002 | Maeda et al. |
| 6,495,890 | B1 * | 12/2002 | Ono .............................. 257/387 |
| 6,724,025 | B1 | 4/2004 | Takashima et al. |
| 6,882,006 | B2 | 4/2005 | Maeda et al. |
| 6,885,041 | B2 | 4/2005 | Awano |
| 2002/0195652 | A1 | 12/2002 | Maeda et al. |
| 2004/0262681 | A1 * | 12/2004 | Masuoka et al. .............. 257/335 |
| 2005/0253143 | A1 | 11/2005 | Takaura et al. |
| 2005/0280061 | A1 | 12/2005 | Lee |
| 2006/0208283 | A1 | 9/2006 | Shimojo et al. |

FOREIGN PATENT DOCUMENTS

| | | | |
|---|---|---|---|
| JP | 03-114233 | A | 5/1991 |
| JP | 06-069441 | A | 3/1994 |
| JP | 06-310730 | A | 11/1994 |
| JP | 07-099311 | A | 4/1995 |
| JP | 08-227997 | A | 9/1996 |
| JP | 2000-022145 | A | 1/2000 |
| JP | 2000-068516 | A | 3/2000 |
| JP | 2000-091578 | A | 3/2000 |
| JP | 2001-102573 | A | 4/2001 |
| JP | 2003-101012 | A | 4/2003 |
| JP | 2006-261421 | A | 9/2006 |
| JP | 2006-294995 | A | 10/2006 |
| JP | 2007-123415 | A1 | 5/2007 |
| WO | WO 2004-021445 | A1 | 3/2004 |

OTHER PUBLICATIONS

Hergenrother, J.M. et al., "The vertical replacement-gate (VRG) MOSFET", Solid-State Electronics, vol. 46, 2002, pp. 939-950.

Extended European Search Report for European Application No. 07850094.9, dated Nov. 19, 2010, 9 pages.

International Search Report for International Application No. PCT/JP2007/073452, dated Mar. 4, 2008, 2 pages.

Written Opinion of the International Searching Authority for International Application No. PCT/JP2007/073452, dated Mar. 4, 2008, 4 pages.

Hergenrother, J.M. et al., "The Vertical Replacement-Gate (VRG) MOSFET: A 50-nm Vertical MOSFET with Lithography-Independent Gate Length," Bell Laboratories, Lucent Technologies, Murray Hill, NJ, IEEE, 1999, 4 pages.

Iwai, Makoto et al., "High Performance Buried Gate Surrounding Gate Transistor (BG-SGT) for Future Three-Dimensional Devices," Extended Abstracts of the 2003 International Conference on Solid State Devices and Materials, Tokyo, 2003, pp. 630-631.

Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

Office Action for Japanese Patent Application Serial No. 2009-544527, dated Nov. 28, 2012, 2 pages.

Written Opinion of the International Searching Authority for International Application No. PCT/JP2007/073935, dated Mar. 18, 2008, 3 pages.

International Search Report for International Application No. PCT/JP2007/073935, dated Mar. 18, 2008, 2 pages.

Bindal et al., "The Design of Dual Work Function CMOS Transistors and Circuits Using Silicon Nanowire Technology", *IEEE Transactions on Nanotechnology*, IEEE Service Center, NJ, vol. 6, No. 3, May 1, 2007, pp. 291-302.

Supplementary Partial Search Report for European Patent Application Serial No. 07 85 0486, dated Sep. 19, 2012, 8 pages.

* cited by examiner

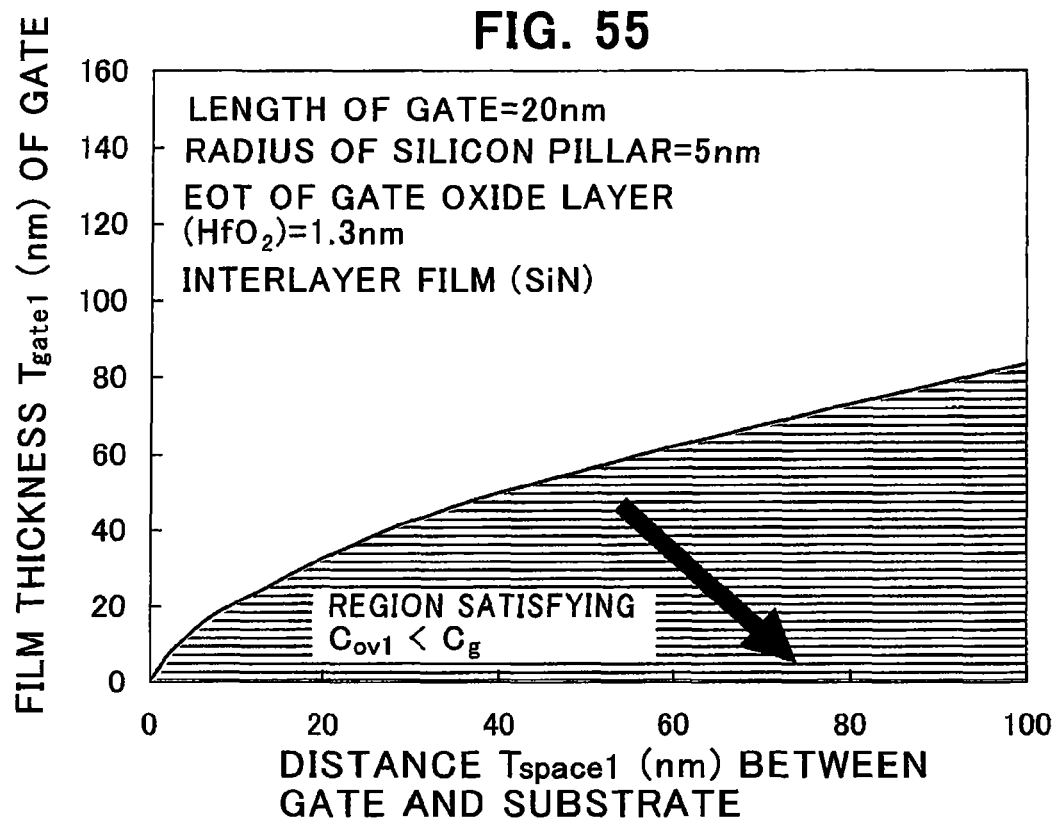
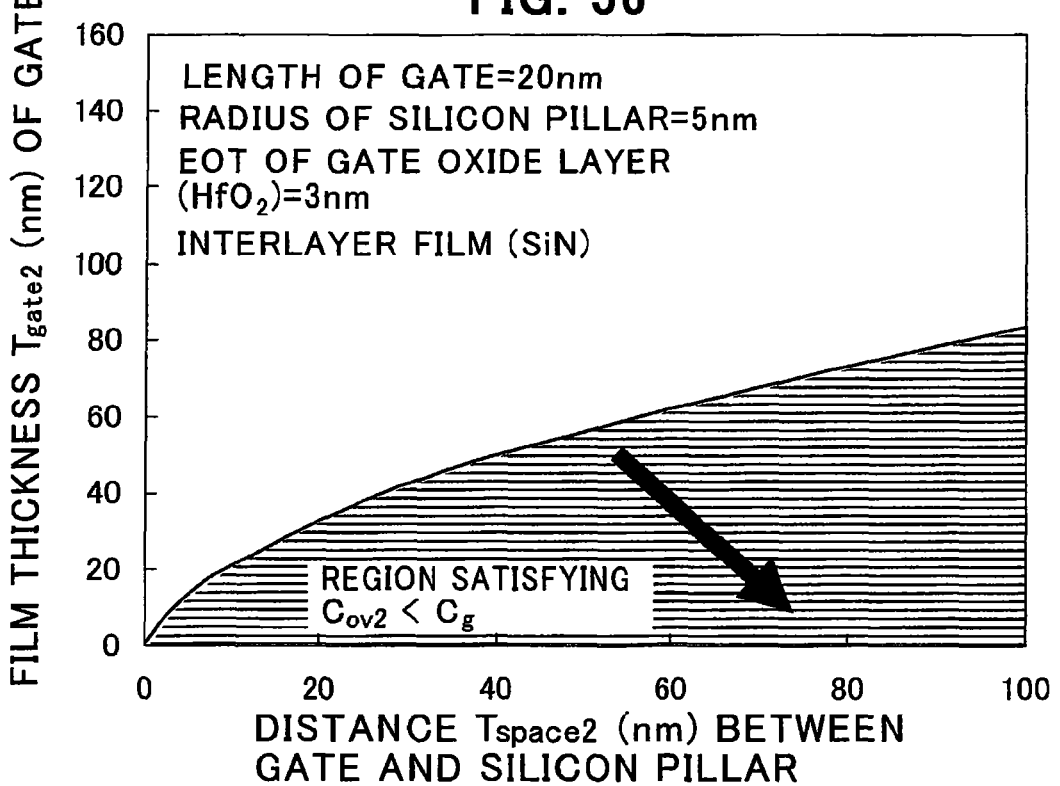

SURROUNDING GATE TRANSISTOR SEMICONDUCTOR DEVICE

RELATED APPLICATIONS

Pursuant to 35 U.S.C. §119(e), this application claims the benefit of the filing date of Provisional U.S. Patent Application Ser. No. 61/207,620 filed on Feb. 13, 2009. This application is a continuation application of PCT/JP2007/073452 filed on Dec. 5, 2007. The entire contents of these applications are hereby incorporated by reference.

BACKGROUND OF THE INVENTION

1. Field of the Invention

The present invention relates to a semiconductor device, and more specifically to a surrounding gate transistor (SGT) and a production method therefor.

2. Description of the Related Art

A miniaturized planar transistor is used in a wide range of fields, such as computers, communication apparatuses, measurement instruments, automatic control units and domestic appliances, as a fundamental element of low-power consumption, low-cost and high-throughput microprocessors, ASICs and microcomputers and low-cost and large-capacity memories. However, the planar transistor is formed on a semiconductor substrate in a planar configuration, i.e., in a configuration where a source, a gate and drain are horizontally arranged along a surface of a silicon substrate. In contrast, an SGT has a structure where a source, a gate and a drain are arranged in a direction perpendicular to a silicon substrate, and wherein the gate is disposed to surround a convex-shaped semiconductor layer (see, for example, the following Non-Patent Document 1; FIG. 113). Thus, as compared with the planar transistor, the SGT is capable of significantly reducing a transistor occupancy area. However, in a conventional SGT structure, along with the progress in reducing the scale of the SGT structure, an area ratio of a gate electrode to a total transistor occupancy area becomes larger. In addition, due to reducing the scale of a silicon pillar, a resistance in each of source and drain regions formed in the silicon pillar is increased, and thereby an ON current is reduced.

For this reason, a buried-gate SGT (BG-SGT) has been proposed which has an SGT structure where a gate is buried in a silicon pillar (see, for example, the following Non-Patent Document 2; FIG. 114). In this structure, a silicon pillar can be formed to have a small-diameter channel region and large-diameter source and drain regions, so as to simultaneously meet a need for suppressing short-channel effects and a need for reducing a resistance in each of the source and drain regions, i.e., achieve a reduction in OFF-current and an increase in ON-current.

However, as regards to a need for ensuring a low parasitic capacitance to achieve an increase in speed and power consumption reduction in an LSI circuit, the conventional BG-SGT is incapable of achieving such a low parasitic capacitance between the gate and the source or between the gate and the drain.

In this connection, as a technique for reducing a gate-drain parasitic capacitance and a gate-source parasitic capacitance to achieve an increase in speed of the circuit, a vertical replacement gate (VRG)-MOSFET has been known (see, for example, the following Non-Patent Document 3 and Patent Document 1; FIG. 115) and other techniques (see, for example, the following Patent Document 2; FIG. 116).

FIG. 115 shows the VRG-MOSFET (the Patent Document 1). A gate adjacent a silicon pillar faces not only a silicon pillar through a gate oxide layer but also each of a source region and a drain region through an interlayer insulating film. Thus, in addition to a gate capacitance between the gate and the silicon pillar, parasitic capacitances are produced between the gate and the source and between the gate and the drain, respectively. A structure proposed here is intended to increase a film thickness of the interlayer insulating film between the gate and the source to increase a distance therebetween and increase a film thickness of the interlayer insulating film between the gate and the drain to increase a distance therebetween, so as to reduce the respective parasitic capacitances.

FIG. 116 shows an SGT having a structure intended to reduce a parasitic capacitance between a gate and a source, as disclosed in the Patent Document 2. A gate adjacent a silicon pillar faces not only a silicon pillar through a gate oxide layer but also a source region through an interlayer insulating film. Thus, in addition to a gate capacitance between the gate and the silicon pillar, a parasitic capacitance is produced between the gate and the source. A structure proposed here is intended to increase a film thickness of the interlayer insulating film between the gate and the source to increase a distance between the gate and the source, so as to reduce the parasitic capacitance.

Non-Patent Document 1: H. Takato et al, IEEE transaction on electron devices, Vol. 38, No. 3, March 1991, p 573-578
Non-Patent Document 2: M. Iwai et al, Extended Abstracts of the 2003 International Conference on Solid State Devices and Materials, Tokyo, 2003, p 630-631
Non-Patent Document 3: IEDM 1999 John M. Hergenrother
Patent Document 1: U.S. Pat. No. 6,027,975 (Feb. 22, 2000, John M. Hergenrother)
Patent Document 2: U.S. Pat. No. 5,504,359 (Apr. 2, 1996, Mark S. Rodder)

SUMMARY OF THE INVENTION

In order to allow an SGT constituting an LST to actually achieve an increase in speed thereof, it is desirable that a parasitic capacitance be less than a gate capacitance. Although the SGT structure (such as the Patent Document 2) is intended to reduce a parasitic capacitance by a technique capable of reducing the parasitic capacitance as compared with the conventional structure (such as the Non-Patent Document 1), it may be assumed that the resulting parasitic capacitance is not less than a gate capacitance, or not sufficiently less than a gate capacitance. In the Patent Document 1 where the thickness of the interlayer film between the gate and the source is increased to reduce the parasitic capacitance as compared with the conventional structure, there is a problem that a parasitic capacitance less than a gate capacitance cannot be obtained without reducing an area of the gate facing the source region. In the Patent Document 2 where the thickness of the interlayer film between the gate and the source is greater than a thickness of the gate oxide film, there is also a problem that a parasitic capacitance less than a gate capacitance cannot be obtained without reducing an area of the gate facing the source region.

In view of the above problems, it is an object of the present invention to provide a semiconductor device designed to reduce a parasitic capacitance to solve the problem of reduction in operating speed of an SGT.

In order to achieve the above object, according to a first aspect of the present invention, there is provided a semiconductor device which comprises: a second-conductive type impurity region formed in a part of a first-conductive type semiconductor substrate; a first silicon pillar of an arbitrary cross-sectional shape formed on the second-conductive type impurity region; a first insulating body surrounding a part of a surface of the first silicon pillar; a gate surrounding the first insulating body; and a second silicon pillar which is formed on the first silicon pillar and which includes a second-conductive type impurity region, wherein: the gate is disposed to be separated from the semiconductor substrate by a second insulating body and is disposed to be separated from the second silicon pillar by the second insulating body; and the capacitance between the gate and the semiconductor substrate is less than a gate capacitance, or the capacitance between the gate and the second silicon pillar is less than the gate capacitance.

Preferably, the capacitance between the gate and the semiconductor substrate is sufficiently less than the gate capacitance, and the capacitance between the gate and the second silicon pillar is sufficiently less than the gate capacitance.

Preferably, a cross-sectional area (unit: $nm^2$) of the gate is less than the value derived by multiplying a distance (unit: nm) between the gate and the semiconductor substrate separated by the second insulating body, by $2 \times 10^9$, or is less than the value derived by multiplying a distance (unit: nm) between the gate and the second silicon pillar separated by the second insulating body, by $2 \times 10^9$.

In another embodiment of the present invention, the first silicon pillar is comprised of a cross-sectionally circular-shaped silicon pillar, and each of the first insulating body surrounding the part of the surface of the first silicon pillar and the gate surrounding the first insulating body has a cross-sectionally circular ring shape.

In this case, the thickness $T_{gate1}$ (unit: μm) of one of opposite ends of the gate, and a distance $T_{space1}$ (unit: μm) between the gate and the semiconductor substrate separated by the second insulating body, satisfy the following relational expression:

$$2.0e6 \cdot T_{space1} > \pi T_{gate1}^2 + 1.0e2 T_{gate1}, \text{ and}$$

the thickness $T_{gate2}$ (unit: μm) of the other end of the gate and a distance $T_{space2}$ (unit: μm) between the gate and the second silicon pillar separated by the second insulating body satisfy the following relational expression:

$$2.0e6 \cdot T_{space2} > \pi T_{gate2}^2 + 1.0e2 T_{gate2}.$$

The one end and the other end of the gate may be a semiconductor substrate-side end and a second silicon pillar-side end of the gate, respectively.

In yet another embodiment of the present invention, the first silicon pillar is comprised of a cross-sectionally square-shaped silicon pillar, and each of the first insulating body surrounding the part of the surface of the first silicon pillar and the gate surrounding the first insulating body has a cross-sectionally square shape.

In this case, the thickness $T_{gate1}$ (unit: μm) of one of opposite ends of the gate and a distance $T_{space1}$ (unit: μm) between the gate and the semiconductor substrate separated by the second insulating body satisfy the following relational expression:

$$2.0e6 \cdot T_{space1} > 4 T_{gate1}^2 + 1.0e2 T_{gate1}, \text{ and}$$

the thickness $T_{gate2}$ (unit: μm) of the other end of the gate and a distance $T_{space2}$ (unit: μm) between the gate and the second silicon pillar separated by the second insulating body satisfy the following relational expression:

$$2.0e6 \cdot T_{space2} > 4 T_{gate2}^2 + 1.0e2 T_{gate2}.$$

In still another embodiment of the present invention, the first silicon pillar is comprised of a cross-sectionally rectangular-shaped silicon pillar and each of the first insulating body surrounding the part of the surface of the first silicon pillar, and the gate surrounding the first insulating body has a cross-sectionally rectangular shape.

In this case, the thickness $T_{gate1}$ (unit: μm) of one of opposite ends of the gate and a distance $T_{space1}$ (unit: μm) between the gate and the semiconductor substrate separated by the second insulating body satisfy the following relational expression:

$$3.0e6 \cdot T_{space1} > 4 T_{gate1}^2 + 1.5e2 T_{gate1}, \text{ and}$$

the thickness $T_{gate2}$ (unit: μm) of the other end of the gate and a distance $T_{space2}$ (unit: μm) between the gate and the second silicon pillar separated by the second insulating body satisfy the following relational expression:

$$3.0e6 \cdot T_{space2} > 4 T_{gate2}^2 + 1.5e2 T_{gate2}.$$

In a preferred embodiment of the present invention, the second insulating body may be made of $SiO_2$ or $SiN$, or has a layered structure of $SiO_2$ and $SiN$.

The first insulating body may be made of one selected from the group consisting of $SiO_2$, $HfO_2$, and $SiON$.

The gate may be made of a material selected from the group consisting of TaN, TiN, NiSi, $Ni_3Si$, $Ni_2Si$, PtSi, $Pt_3Si$, and W.

In a preferred embodiment of the present invention, the first silicon pillar may include a second-conductive type high-concentration impurity region adjacent the second-conductive type impurity region formed in the part of the semiconductor substrate, and a second-conductive type high-concentration impurity region adjacent the second silicon pillar.

The semiconductor device may further comprise a second-conductive type high-concentration impurity region formed in a part of the second silicon pillar.

The semiconductor device may further comprise a silicide region formed in a part of the second-conductive type impurity region formed in the part of the semiconductor substrate, and a silicide region formed in a part of a second-conductive type high-concentration impurity region of the second silicon pillar.

The present invention can reduce a parasitic capacitance of a semiconductor device to provide a semiconductor device for a high-speed and low-power consumption ULSI (ultra large-scale integration) circuit.

BRIEF DESCRIPTION OF THE DRAWINGS

FIG. 55 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 50 where a gate oxide layer is made of $HfO_2$ and an interlayer film is made of SiN.

FIG. 56 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 50 where a gate oxide layer is made of $HfO_2$, and an interlayer film is made of SiN.

DETAILED DESCRIPTION OF THE PREFERRED EMBODIMENTS

With reference to the drawings, a semiconductor device of the present invention will now be specifically described. As shown in the following Table, first to sixteen embodiments are different from each other in at least one of a cross-sectional shape of a first silicon pillar, a material of a second insulating body (interlayer film), and a material of a first insulating body (gate oxide layer).

TABLE

| Embodiment | Cross-sectional shape of first silicon pillar | Second insulating body (interlayer film) 610, 620 | First insulating body (gate oxide layer) 310, 320 | FIGS. |
| --- | --- | --- | --- | --- |
| 1 | Arbitrary shape | $SiO_2$ | $SiO_2$ | 1-7 |
| 2 | | SiN | $SiO_2$ | 8-14 |
| 3 | | $SiO_2$ | $HfO_2$ | 15-21 |
| 4 | | SiN | $HfO_2$ | 22-28 |
| 5 | Circular shape | $SiO_2$ | $SiO_2$ | 29-35 |
| 6 | | SiN | $SiO_2$ | 36-42 |
| 7 | | $SiO_2$ | $HfO_2$ | 43-49 |
| 8 | | SiN | $HfO_2$ | 50-56 |
| 9 | Square shape | $SiO_2$ | $SiO_2$ | 57-63 |
| 10 | | SiN | $SiO_2$ | 64-70 |
| 11 | | $SiO_2$ | $HfO_2$ | 71-77 |
| 12 | | SiN | $HfO_2$ | 78-84 |
| 13 | Rectangular shape | $SiO_2$ | $SiO_2$ | 85-91 |
| 14 | | SiN | $SiO_2$ | 92-98 |
| 15 | | $SiO_2$ | $HfO_2$ | 99-105 |
| 16 | | SiN | $HfO_2$ | 106-112 |

First Embodiment

Semiconductor Device

Figure 1:
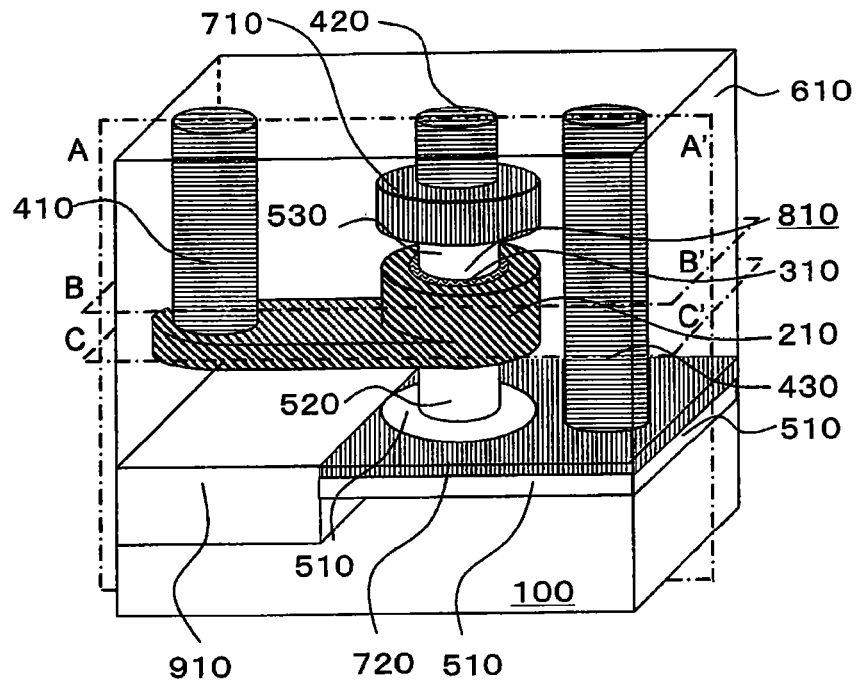
FIG. 1 is a bird's-eye view showing a semiconductor device according to a first embodiment of the present invention.
Figure 2:
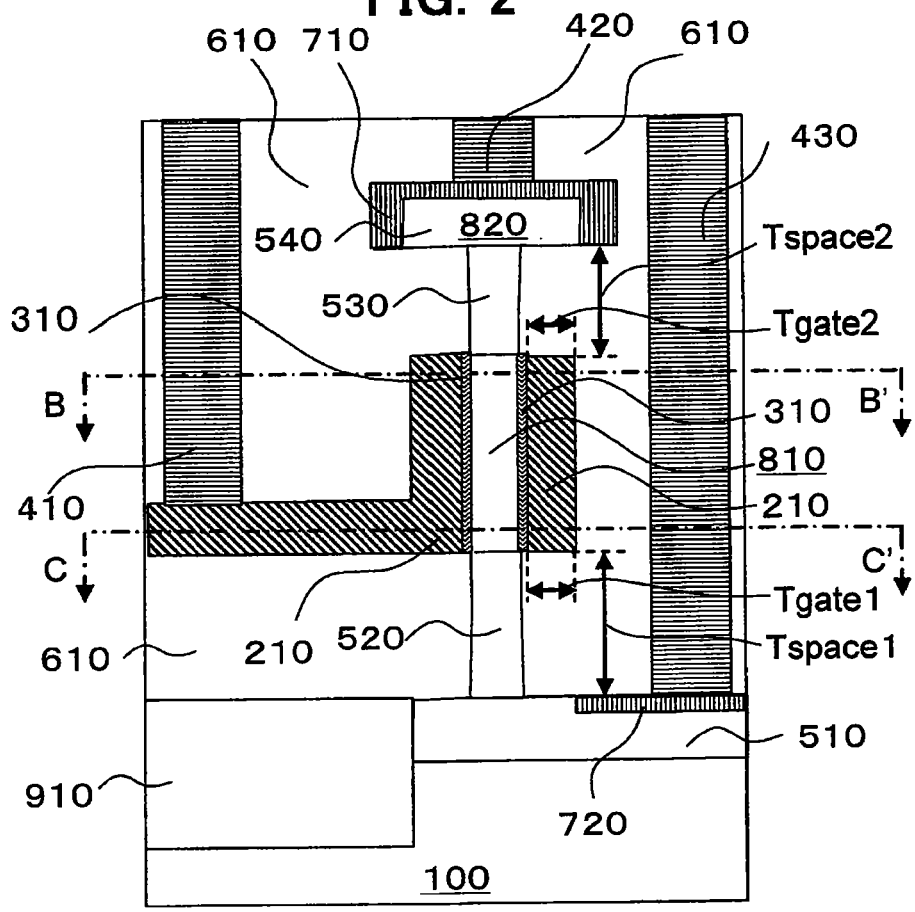
FIG. 2 is a sectional view of the semiconductor device, taken along the line A-A' in FIG. 1.
Figure 3:
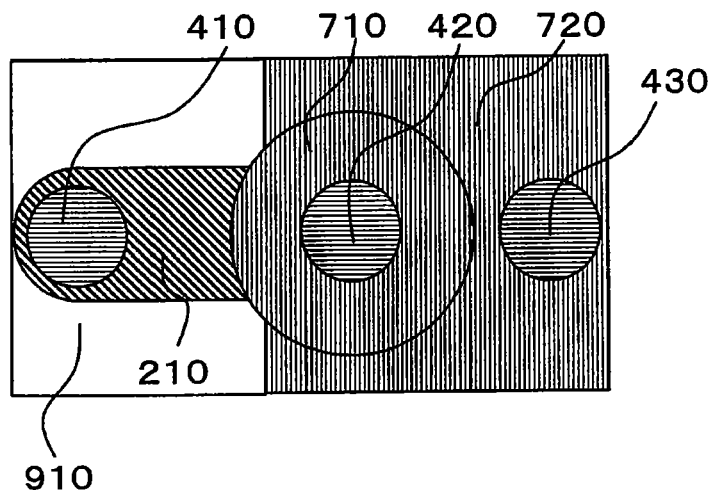
FIG. 3 is a top view of the semiconductor device in FIG. 1.
Figure 4:
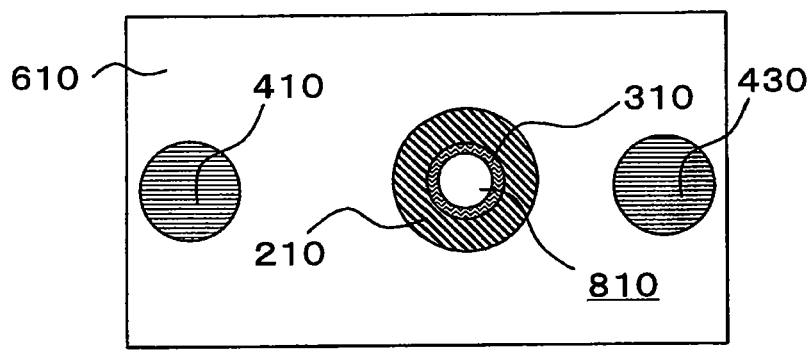
FIG. 4 is a sectional view of the semiconductor device, taken along the line B-B' in FIG. 2.
Figure 5:
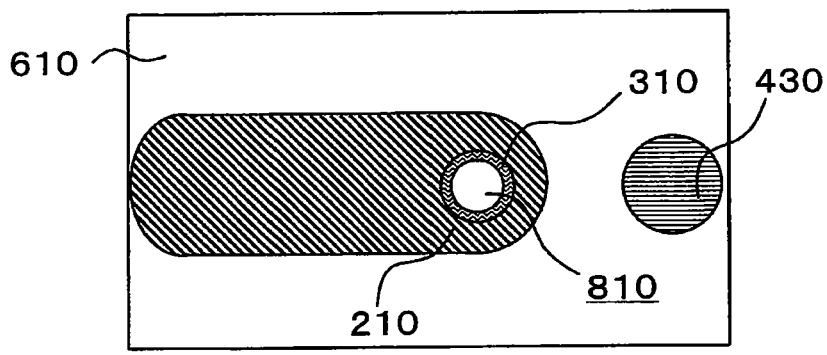
FIG. 5 is a sectional view of the semiconductor device, taken along the line C-C' in FIG. 2.

Each of first to fourth embodiments of the present invention is an example where a first silicon pillar 810 has an arbitrary shape in cross-section. FIG. 1 is a schematic bird's-eye view showing a transistor in a semiconductor device according to the first embodiment of the present invention. FIG. 2 is a schematic sectional view taken along the cutting-plane line A-A' in FIG. 1, and FIG. 3 is a top view of the transistor in FIG. 1. FIG. 4 is a schematic sectional view taken along the cutting-plane line B-B' in FIG. 2, and FIG. 5 is a schematic sectional view taken along the cutting-plane line C-C' in FIG. 2. The semiconductor device according to the first embodiment comprises a first silicon pillar 810 of an arbitrary cross-sectional shape formed on a first-conductive type semiconductor substrate 100, a first insulating body 310 surrounding a part of a surface of the first silicon pillar 810, a gate 210 surrounding the first insulating body 310, and a second silicon pillar 820 formed on a top of the first silicon pillar 810. The gate 210 is disposed to be separated from the semiconductor substrate 100 by a second insulating body 610. Further, the gate 210 is disposed to be separated from the second silicon pillar 820 by the second insulating body 610.

The semiconductor device further comprises a second-conductive type high-concentration impurity region 520 formed in a part of the first silicon pillar 810, a second-conductive type high-concentration impurity region 530 formed in a part of the first silicon pillar 810, a second-conductive type high-concentration impurity region 510 formed in a part of the semiconductor substrate 100, a second-conductive type high-concentration impurity region 540 formed in a part of the second silicon pillar 820, a silicide region 720 formed in a part of the second-conductive type high-concentration impurity region 510, a silicide region 710 formed in the second-conductive type high-concentration impurity region 540, a contact 430 formed on the silicide region 720, a contact 420 formed on the silicide region 710, a contact 410 formed on the gate 210, and an element isolation region 910 formed in the semiconductor substrate 100. Thus, the first silicon pillar 810 includes the high-concentration impurity region 520 and the high-concentration impurity region 530. The second silicon pillar 820 includes the high-concentration impurity region 540 and the silicide region 710. The first insulating body 310 (gate oxide layer) is made of $SiO_2$, and the second insulating body 610 (interlayer film) is made of $SiO_2$.

In order to reduce a parasitic capacitance in the first embodiment, it is desirable that a parasitic capacitance $C_{ov1}$ between the gate 210 and the semiconductor substrate 100 is less than a gate capacitance $C_g$, as shown in the following formula (1-1):

$$C_{ov1} < C_g \quad (1\text{-}1)$$

Specifically, given that: a length of the gate 210 is 20 nm; a peripheral length of the first silicon pillar 810 is 31.4 nm; an equivalent film thickness $T_{ox}$ of the gate oxide layer 310 is 1 nm; and the interlayer film is made of $SiO_2$. A relationship of the capacitance $C_{ov1}$ between the gate 210 and the semiconductor substrate 100, a dielectric constant $\varepsilon_X$ of the interlayer film 610, a cross-sectional area S1 of a first one of opposite ends of the gate 210, and a distance $T_{space1}$ between the gate 210 and the semiconductor substrate 100, is expressed as the following formula (1-2), and then the formula (1-2) is assigned to the formula (1-1) to obtain the following formula (1-3):

$$C_{ov1} = \frac{\varepsilon_x S1}{T_{space1}} \quad (1\text{-}2)$$

$$S1 < \frac{C_g}{\varepsilon_x} T_{space1} \quad (1\text{-}3)$$

The gate capacitance $C_g$ is expressed as the following formula (1-4) which is a relational expression of a dielectric constant $\varepsilon_{0X}$ of $SiO_2$ which is a material of the gate oxide layer 310, the length l of the gate 210, the peripheral length w of the first silicon pillar 810, and the equivalent film thickness $T_{ox}$ of the gate oxide layer 310, and then the formula (1-4) is assigned to the formula (1-3) to obtain the following conditional formula (1-5) representing a relationship between the cross-sectional area S1 of the gate 210, and the distance $T_{space1}$ between the gate 210 and the semiconductor substrate 100:

$$C_g \approx \frac{\varepsilon_{ox} l w}{T_{ox}} \quad (1\text{-}4)$$

$$S1 < \frac{\varepsilon_{ox} l w}{\varepsilon_x T_{ox}} T_{space1} = 6.3e2 T_{space1} \quad (1\text{-}5)$$

As used herein, the term "gate capacitance" means the capacitance between two electrodes made up of the gate 210 and the first silicon pillar 810 through the gate oxide layer 310 interposed therebetween.

If the conditional formula (1-5) is satisfied, the formula (1-1) is satisfied. Thus, the following formula (1-6) is obtained (unit in the formulas (1-5) and (1-6): nm) (FIG. 6):

$$S1 < 6.3e2 T_{space1} \Rightarrow C_{ov1} < C_g \quad (1\text{-}6)$$

Typically, the peripheral length of the first silicon pillar 810 is set in the range of 1 nm to 100 μm, and the equivalent film thickness of the gate oxide layer 310 is set in the range of 0.5 to 100 nm, because an $SiO_2$ film or a high-dielectric constant film is used as the gate oxide layer 310. Further, the length of the gate 210 is set in the range of 5 nm to 10 μm, and the dielectric constant $\varepsilon_X$ of the interlayer film is set in the range of 3.8 to 7.6, because the interlayer film is made of $SiO_2$ or SiN. In this structure, conditions satisfying the formula (1-1) will be calculated. Given that: the peripheral length of the first silicon pillar 810 is 100 μm; the film thickness of the gate oxide layer 310 is 0.5 nm; the length of the gate 210 is 10 μm, and the dielectric constant $\varepsilon_X$ of the interlayer film is 3.9. The gate capacitance $C_g$ is expressed as the following formula (1-8) which is a relational expression of the dielectric constant $\varepsilon_{0X}$ of $SiO_2$ which is a material of the gate oxide layer 310, the length l of the gate 210, the peripheral length w of the first silicon pillar 810, and the equivalent film thickness $T_{ox}$ of the gate oxide layer 310, and then the formula (1-8) is assigned to the formula (1-3) to obtain the following conditional formula (1-9) representing a relationship between the cross-sectional area S1 of the gate 210, and the distance $T_{space1}$ between the gate 210 and the semiconductor substrate 100:

$$C_g \approx \frac{\varepsilon_{ox} l w}{T_{ox}} \quad (1\text{-}8)$$

$$S1 < \frac{l w}{T_{ox}} T_{space1} = 2e9 T_{space1} \quad (1\text{-}9)$$

wherein 2e9 is $2 \times 10^9$.

If the conditional formula (1-9) is satisfied, the formula (1-1) is satisfied. Thus, the following formula (1-10) is obtained, and then the following formula (1-11) is obtained from the formula (1-10) (unit in the formulas (1-9), (1-10) and (1-11): nm):

$$S1 < 2e9 T_{space1} \Rightarrow C_{ov1} < C_g \quad (1\text{-}10)$$

$$S1 \ll 2e9 T_{space1} \Rightarrow C_{ov1} \ll C_g \quad (1\text{-}11)$$

Figure 6:
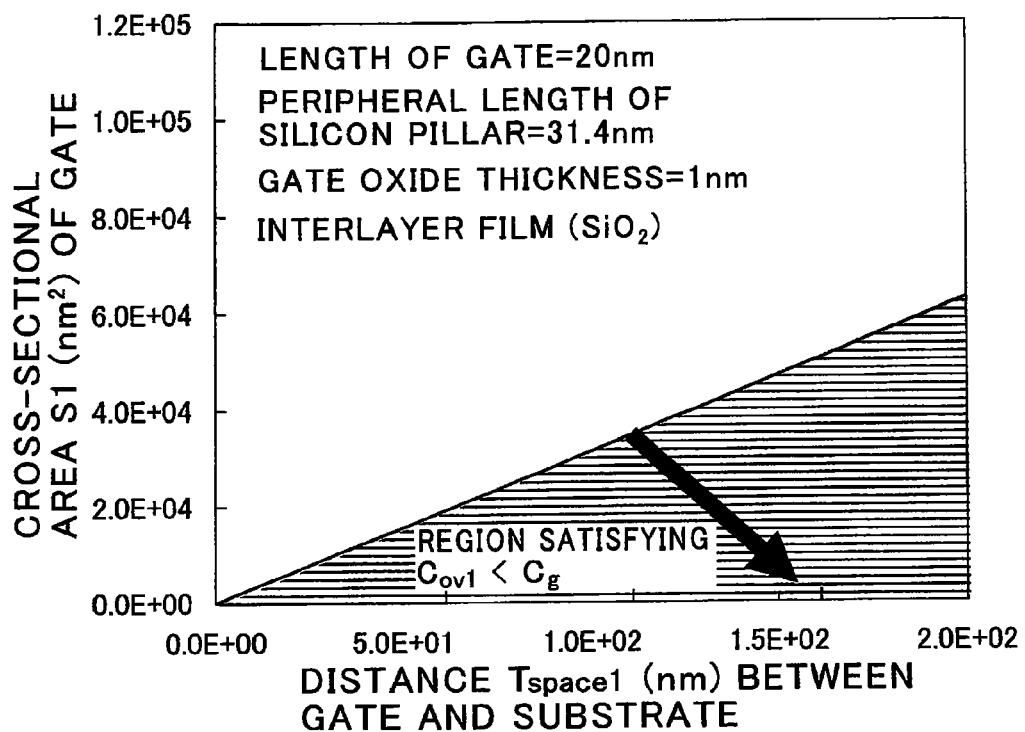
FIG. 6 is a graph showing a relationship between a cross-sectional area Si of a gate, and a distance $T_{space1}$ between the gate and a semiconductor substrate, which is required for satisfying the condition: $C_{ov1} < C_g$, in the semiconductor device in FIG. 1.

In FIG. 6, $C_{ov1}$ becomes less than $C_g$ in a region on the side of the arrowed direction.

Further, in order to reduce the parasitic capacitance in the first embodiment, it is desirable that a parasitic capacitance $C_{ov2}$ between the gate 210 and the second silicon pillar 820 is less than the gate capacitance $C_g$, as shown in the following formula (1-12):

$$C_{ov2} < C_g \quad (1\text{-}12)$$

Specifically, given that: the length of the gate 210 is 20 nm; the peripheral length of the first silicon pillar 810 is 31.4 nm; the equivalent film thickness $T_{ox}$ of the gate oxide layer 310 is 1 nm; and the interlayer film is made of $SiO_2$. A relationship of the capacitance $C_{ov2}$ between the gate 210 and the second silicon pillar 820, the dielectric constant $\varepsilon_X$ of the interlayer film 610, a cross-sectional area S2 of the other, second, end of the gate 210, and a distance $T_{space2}$ between the gate 210 and the second silicon pillar 820, is expressed as the following formula (1-13), and then the formula (1-13) is assigned to the formula (1-12) to obtain the following formula (1-14):

$$C_{ov2} = \frac{\varepsilon_x S2}{T_{space2}} \quad (1\text{-}13)$$

$$S2 < \frac{C_g}{\varepsilon_x} T_{space2} \quad (1\text{-}14)$$

The gate capacitance $C_g$ is expressed as the following formula (1-15) which is a relational expression of the dielectric constant $\varepsilon_{0X}$ of $SiO_2$ as a material of the gate oxide layer 310, the length l of the gate 210, the peripheral length w of the first silicon pillar 810, and the equivalent film thickness $T_{ox}$ of the gate oxide layer 310, and then the formula (1-15) is assigned to the formula (1-14) to obtain the following conditional formula (1-16) representing a relationship of the cross-sectional area S2 of the gate 210, and the distance $T_{space2}$ between the gate 210 and the second silicon pillar 820 (unit in the formula (1-16): nm) (FIG. 7):

$$C_g \approx \frac{\varepsilon_{ox} l w}{T_{ox}} \quad (1\text{-}15)$$

$$S2 < \frac{\varepsilon_{ox} l w}{\varepsilon_x T_{ox}} T_{space2} = 6.3e2 T_{space2} \quad (1\text{-}16)$$

Typically, the peripheral length of the first silicon pillar 810 is set in the range of 1 nm to 100 μm, and the equivalent film thickness of the gate oxide layer 310 is set in the range of 0.5 to 100 nm, because an $SiO_2$ film or a high-dielectric constant film is used as the gate oxide layer 310. Further, the length of the gate 210 is set in the range of 5 nm to 10 μm, and the dielectric constant $\varepsilon_X$ of the interlayer film is set in the range of 3.8 to 7.6, because the interlayer film is made of $SiO_2$ or SiN. In this structure, conditions satisfying the formula (1-12) will be calculated. Given that: the peripheral length of the first silicon pillar 810 is 100 μm; the film thickness of the gate oxide layer 310 is 0.5 nm; the length of the gate 210 is 10 μm, and the dielectric constant $\varepsilon_X$ of the interlayer film is 3.9. The gate capacitance $C_g$ is expressed as the following formula (1-17) which is a relational expression of the dielectric constant $\varepsilon_{0X}$ of $SiO_2$ as a material of the gate oxide layer 310, the length l of the gate 210, the peripheral length w of the first silicon pillar 810, and the equivalent film thickness $T_{ox}$ of the gate oxide layer 310, and then the formula (1-17) is assigned to the formula (1-14) to obtain the following conditional formula (1-18) representing a relationship of the cross-sectional area S2 of the gate 210, and the distance $T_{space2}$ between the gate 210 and the second silicon pillar 820:

$$C_g \approx \frac{\varepsilon_{ox} l w}{T_{ox}} \quad (1\text{-}17)$$

$$S2 < \frac{l w}{T_{ox}} T_{space2} = 2e9 T_{space2} \quad (1\text{-}18)$$

If the conditional formula (1-18) is satisfied, the formula (1-12) is satisfied. Thus, the following formula (1-19) is obtained, and then the following formula (1-20) is obtained from the formula (1-19) (unit in the formulas (1-18), (1-19) and (1-20): nm):

$$S2 < 2e9 T_{space2} \Rightarrow C_{ov2} < C_g \quad (1\text{-}19)$$

$$S2 << 2e9 T_{space2} \Rightarrow C_{ov2} << C_g \quad (1\text{-}20)$$

Figure 7:
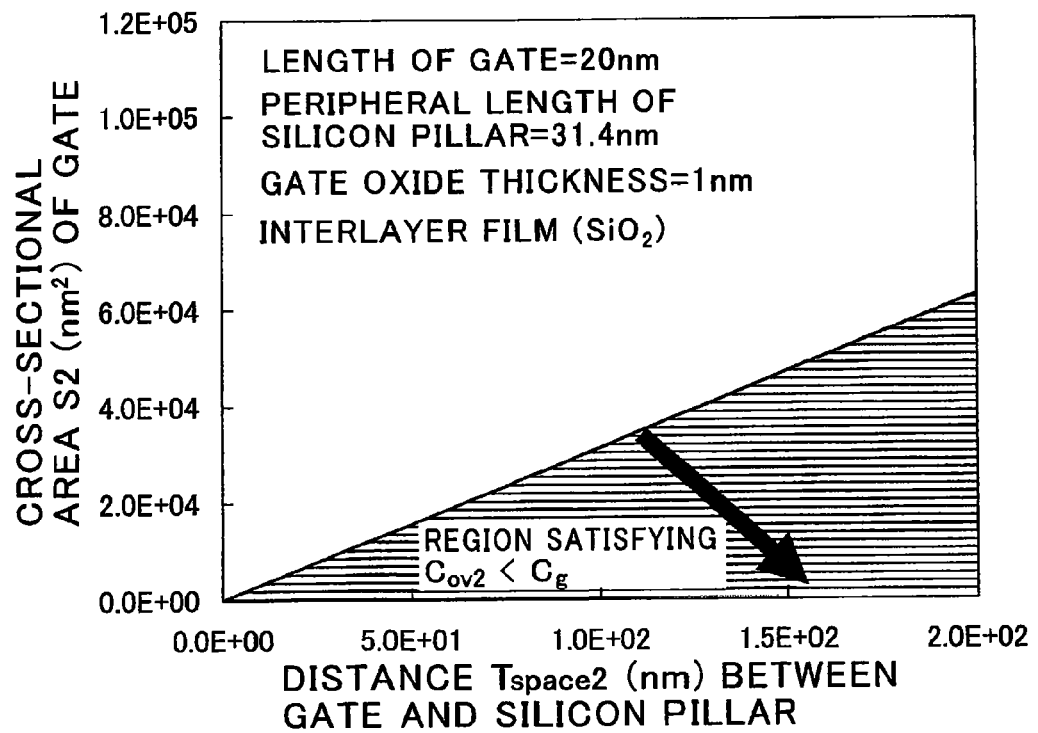
FIG. 7 is a graph showing a relationship between a cross-sectional area S2 of the gate, and a distance $T_{space2}$ between the gate and a second silicon pillar, which is required for satisfying the condition: $C_{ov2} < C_g$, in the semiconductor device in FIG. 1.

In FIG. 7, $C_{ov2}$ becomes less than $C_g$ in a region on the side of the arrowed direction.

Second Embodiment

Semiconductor Device

Figure 8:
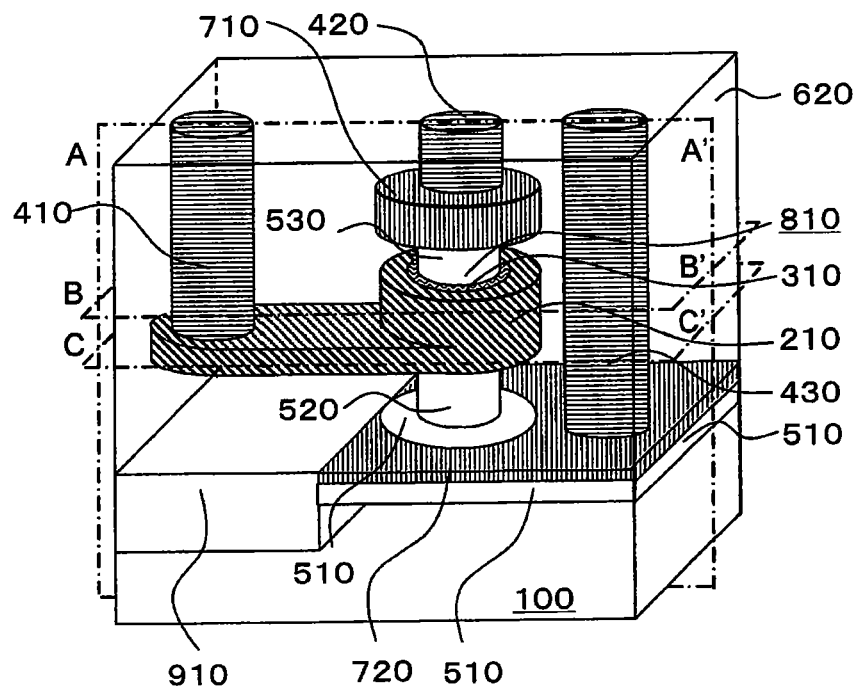
FIG. 8 is a bird's-eye view showing a semiconductor device according to a second embodiment of the present invention.
Figure 9:
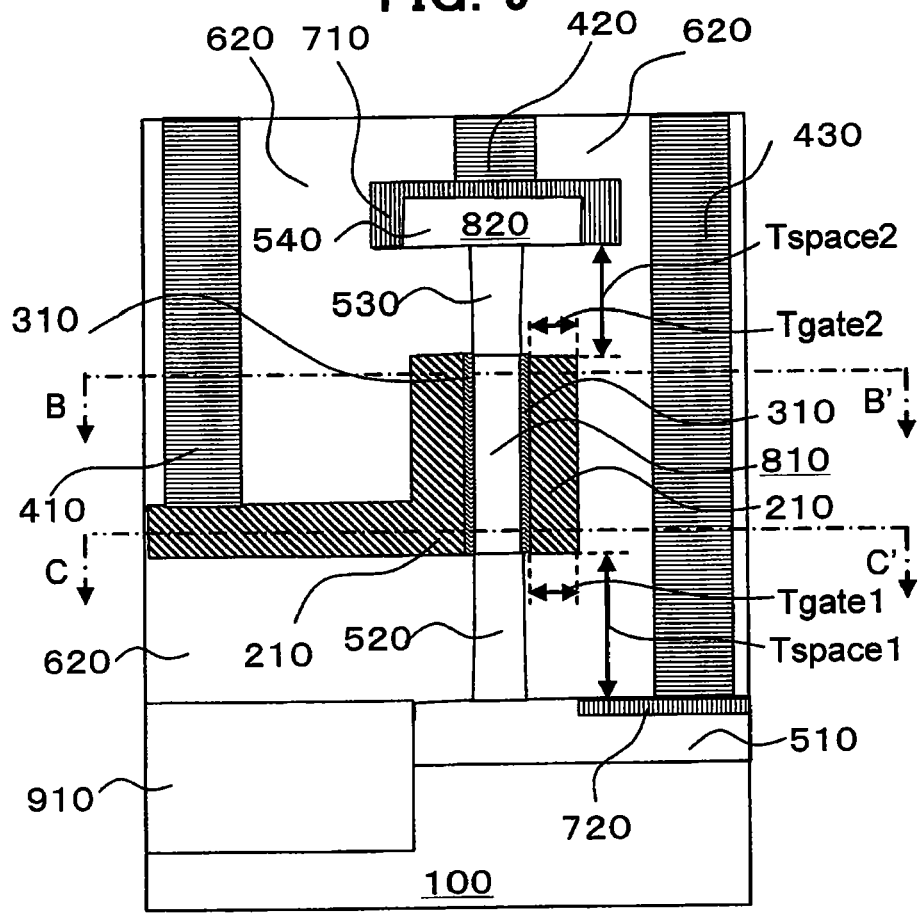
FIG. 9 is a sectional view of the semiconductor device, taken along the line A-A' in FIG. 8.
Figure 10:
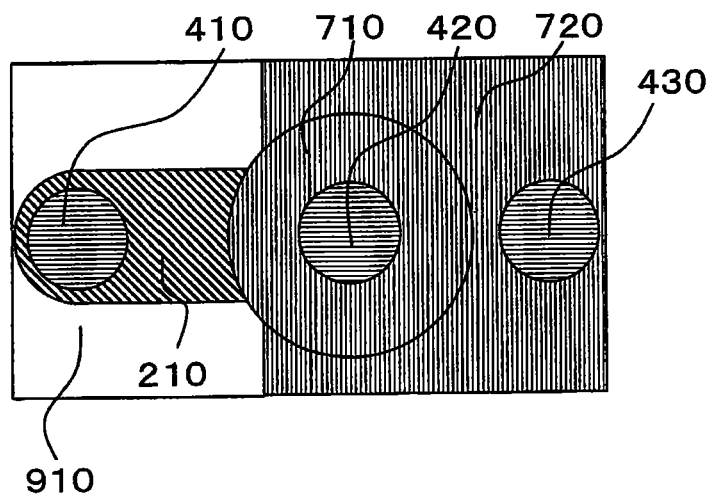
FIG. 10 is a top view of the semiconductor device in FIG. 8.
Figure 11:
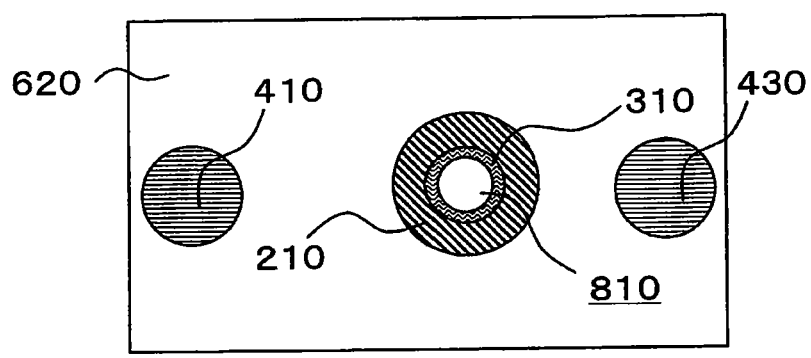
FIG. 11 is a sectional view of the semiconductor device, taken along the line B-B' in FIG. 9.
Figure 12:
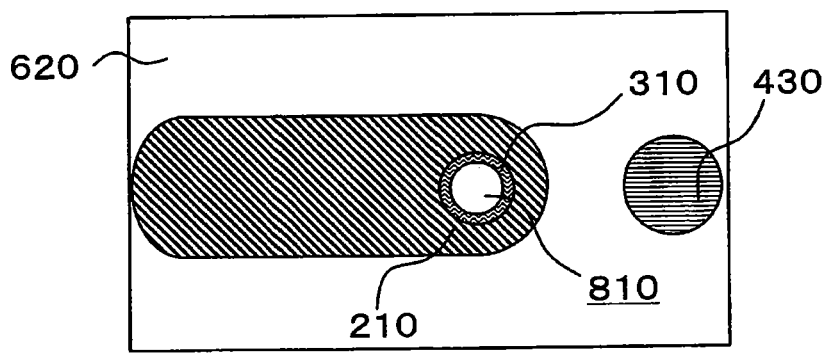
FIG. 12 is a sectional view of the semiconductor device, taken along the line C-C' in FIG. 9.

FIG. 8 is a schematic bird's-eye view showing a transistor in a semiconductor device according to the second embodiment of the present invention, wherein the semiconductor device according to the second embodiment is the same as that in the first embodiment, except that the interlayer film (second insulating body) 610 made of $SiO_2$ is replaced by an interlayer film 620 made of SiN. FIG. 9 is a schematic sectional view taken along the cutting-plane line A-A' in FIG. 8, and FIG. 10 is a top view of the transistor in FIG. 8. FIG. 11 is a schematic sectional view taken along the cutting-plane line B-B' in FIG. 9, and FIG. 12 is a schematic sectional view taken along the cutting-plane line C-C' in FIG. 9. As with the first embodiment, in order to reduce a parasitic capacitance in the second embodiment, it is desirable that the parasitic capacitance $C_{ov1}$ between the gate 210 and the semiconductor substrate 100 is less than the gate capacitance $C_g$, as shown in the following formula (2-1):

$$C_{ov1} < C_g \quad (2\text{-}1)$$

Specifically, given that: the length of the gate 210 is 20 nm; the peripheral length of the first silicon pillar 810 is 31.4 nm; the equivalent film thickness $T_{ox}$ of the gate oxide layer 310 is 1 nm; and the interlayer film is made of SiN. Based on the formula (1-5) in the first embodiment, the following conditional formula (2-2) representing a relationship of the cross-sectional area S1 of the gate 210, and the distance $T_{space1}$ between the gate 210 and the semiconductor substrate 100, is obtained (unit in the formulas (2-2): nm) (FIG. 13):

$$S1 < \frac{\varepsilon_{ox} l w}{\varepsilon_x T_{ox}} T_{space1} = 3.1e2 T_{space1} \quad (2\text{-}2)$$

Figure 13:
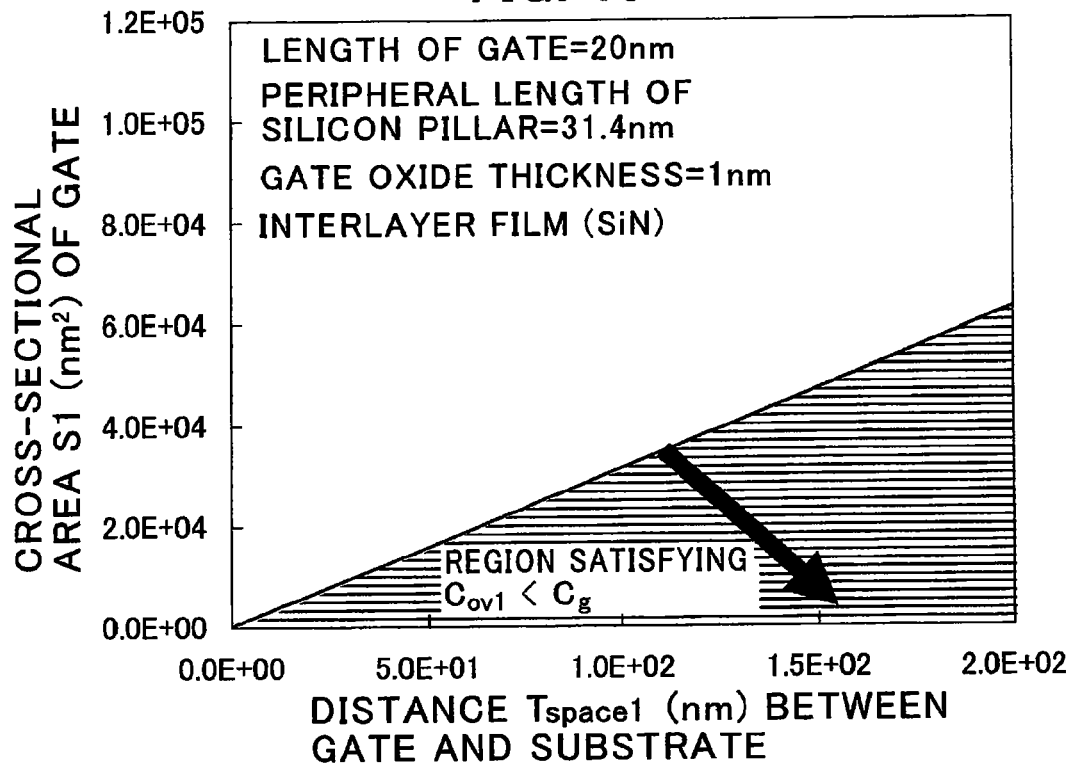
FIG. 13 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 9 where an interlayer film is made of SiN.

In FIG. 13, $C_{ov1}$ becomes less than $C_g$ in a region on the side of the arrowed direction.

Further, as with the first embodiment, in order to reduce the parasitic capacitance in the second embodiment where the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (2-3):

$$C_{ov2} < C_g \quad (2\text{-}3)$$

Based on the formula (1-16) in the first embodiment, the following conditional formula (2-4) representing a relationship between the cross-sectional area S2 of the gate 210, and the distance $T_{space2}$ between the gate 210 and the second silicon pillar 820, is obtained (unit in the formula (2-4): nm (FIG. 14):

$$S2 < \frac{\varepsilon_{ox} l w}{\varepsilon_x T_{ox}} T_{space2} = 3.1e2 T_{space2} \quad (2\text{-}4)$$

Figure 14:
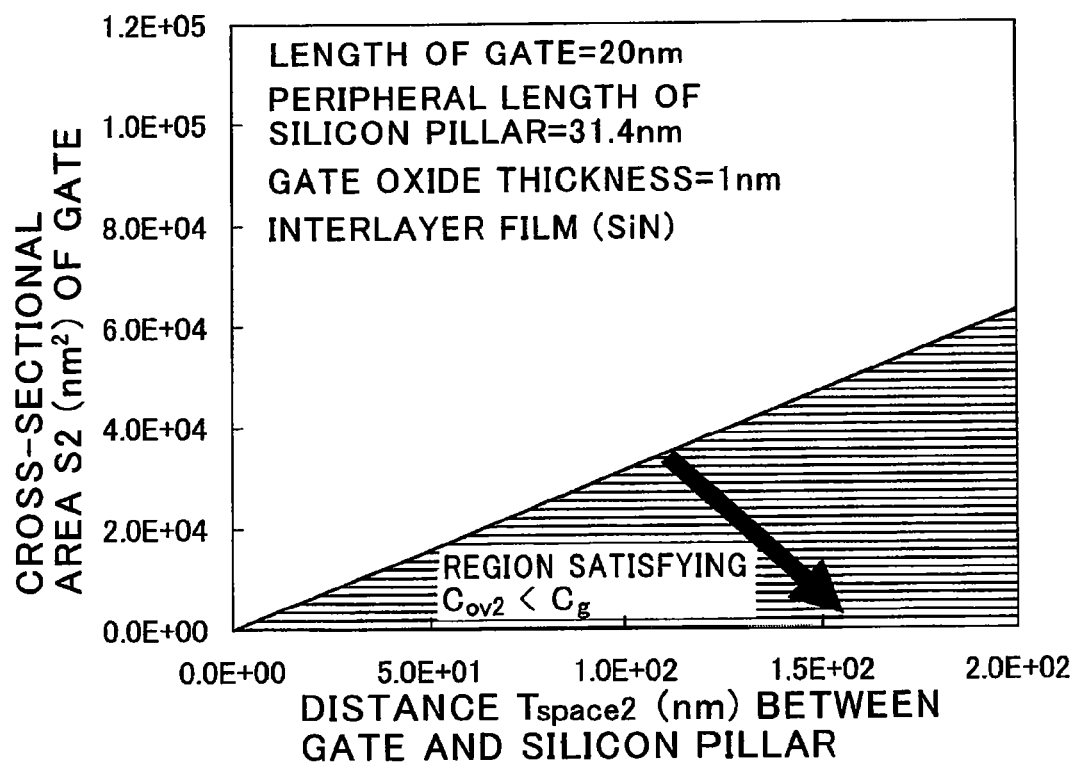
FIG. 14 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 9 where an interlayer film is made of SiN.

In FIG. 14, $C_{ov2}$ becomes less than $C_g$ in a region on the side of the arrowed direction.

Third Embodiment

Semiconductor Device

Figure 15:
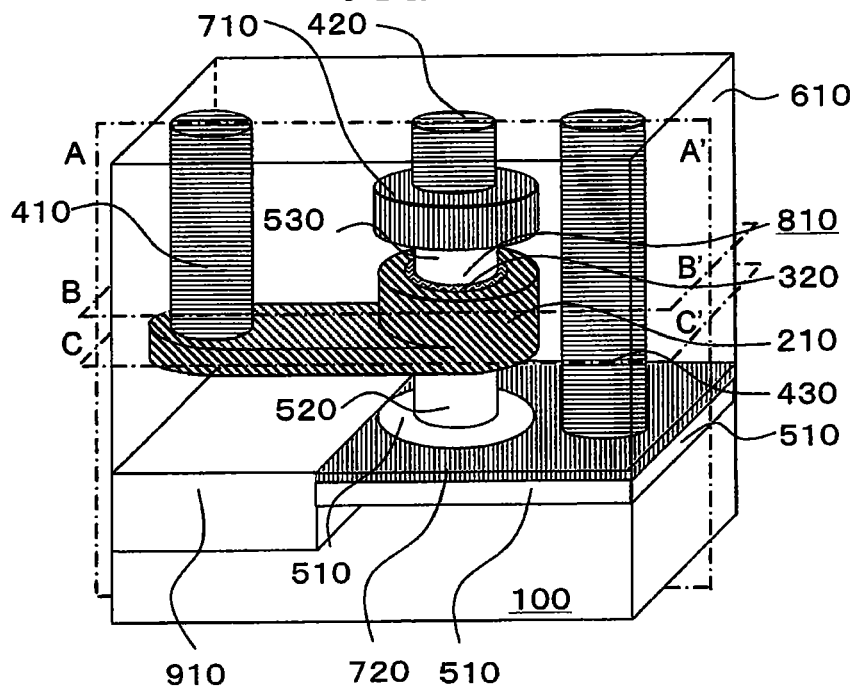
FIG. 15 is a bird's-eye view showing a semiconductor device according to a third embodiment of the present invention.
Figure 16:
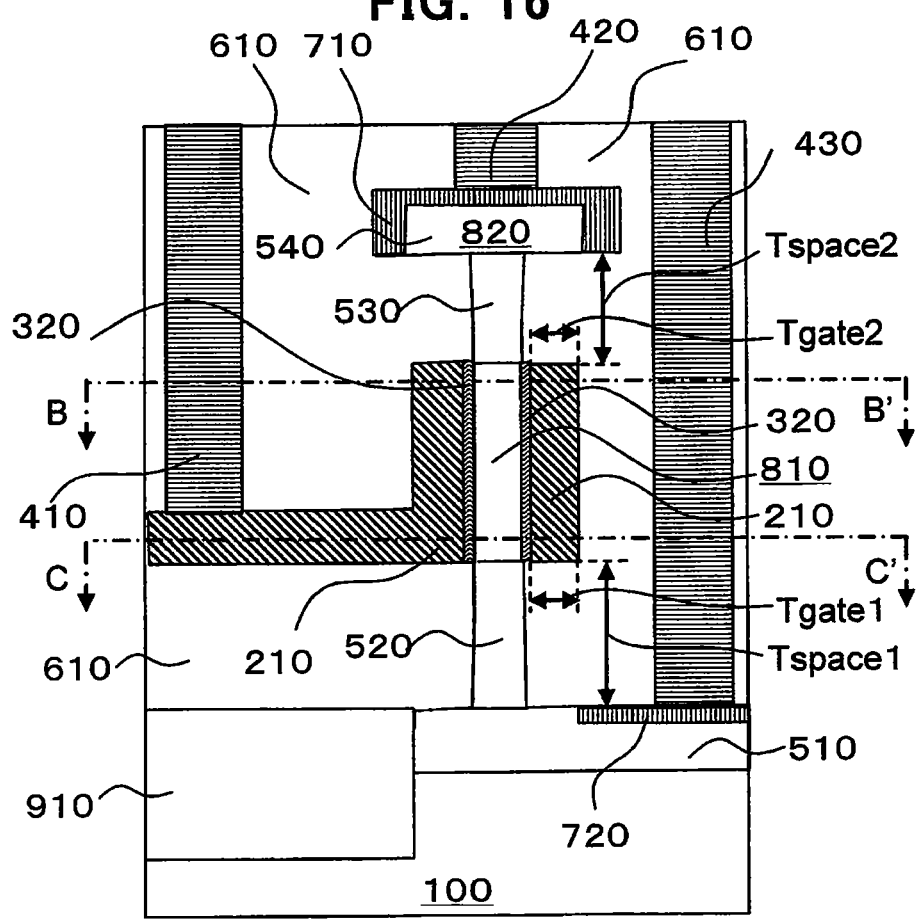
FIG. 16 is a sectional view of the semiconductor device, taken along the line A-A' in FIG. 15.
Figure 17:
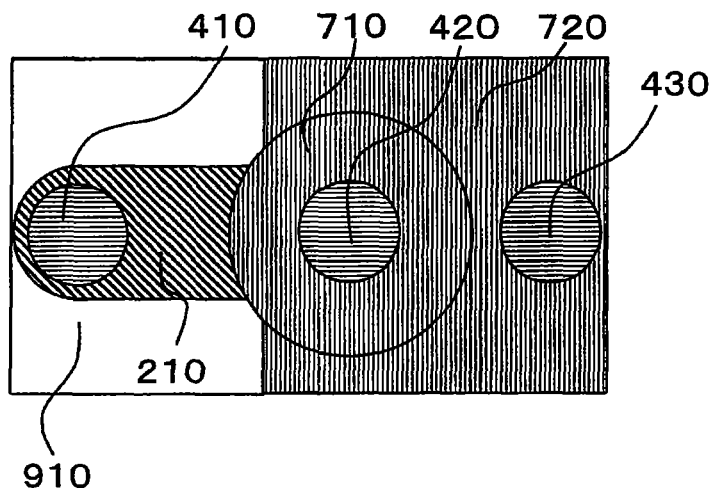
FIG. 17 is a top view of the semiconductor device in FIG. 15.
Figure 18:
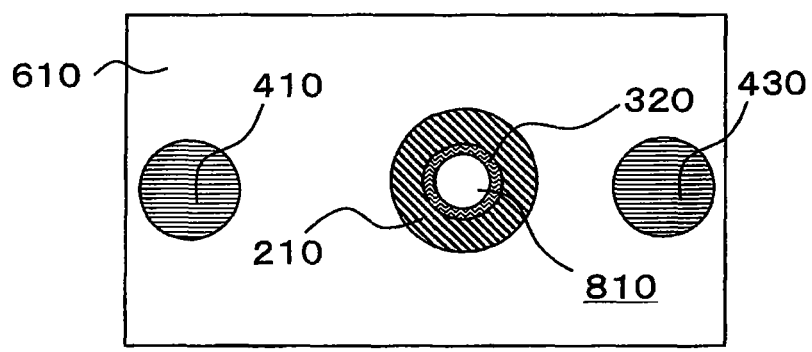
FIG. 18 is a sectional view of the semiconductor device, taken along the line B-B' in FIG. 16.
Figure 19:
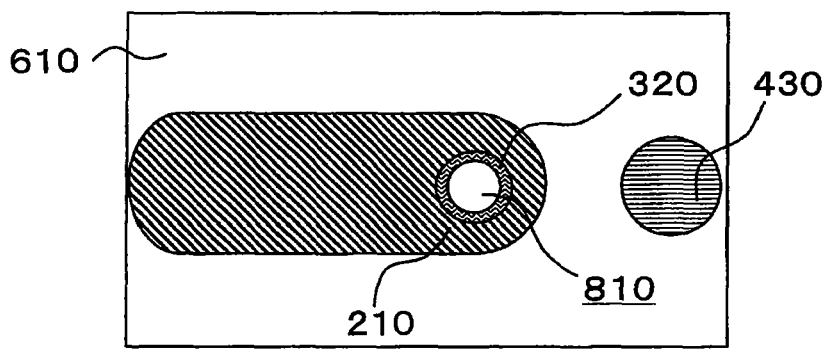
FIG. 19 is a sectional view of the semiconductor device, taken along the line C-C' in FIG. 16.

FIG. 15 is a schematic bird's-eye view showing a transistor in a semiconductor device according to the third embodiment of the present invention, wherein the semiconductor device according to the third embodiment is the same as that in the first embodiment, except that the gate oxide layer (first insulating body) 310 made of $SiO_2$ is replaced by a gate oxide layer 320 made of $HfO_2$. FIG. 16 is a schematic sectional view taken along the cutting-plane line A-A' in FIG. 15, and FIG. 17 is a top view of the transistor in FIG. 15. FIG. 18 is a schematic sectional view taken along the cutting-plane line B-B' in FIG. 16, and FIG. 19 is a schematic sectional view taken along the cutting-plane line C-C' in FIG. 16. As with the first embodiment, in order to reduce a parasitic capacitance in the third embodiment, it is desirable that the parasitic capacitance $C_{ov1}$ between the gate 210 and the semiconductor substrate 100 is less than the gate capacitance $C_g$, as shown in the following formula (3-1):

$$C_{ov1} < C_g \qquad (3\text{-}1)$$

Specifically, given that: the length of the gate 210 is 20 nm; the peripheral length of the first silicon pillar 810 is 31.4 nm; the equivalent film thickness $T_{ox}$ of the gate oxide layer 320 is 1 nm; and the interlayer film is made of $SiO_2$. Based on the formula (1-5) in the first embodiment, the following conditional formula (3-2) representing a relationship between the cross-sectional area S1 of the gate 210, and the distance $T_{space1}$ between the gate 210 and the semiconductor substrate 100, is obtained (unit in the formulas (3-2): nm) (FIG. 20):

$$S1 < \frac{\varepsilon_{ox} l w}{\varepsilon_x T_{ox}} T_{space1} = 6.3e2 T_{space1} \qquad (3\text{-}2)$$

Figure 20:
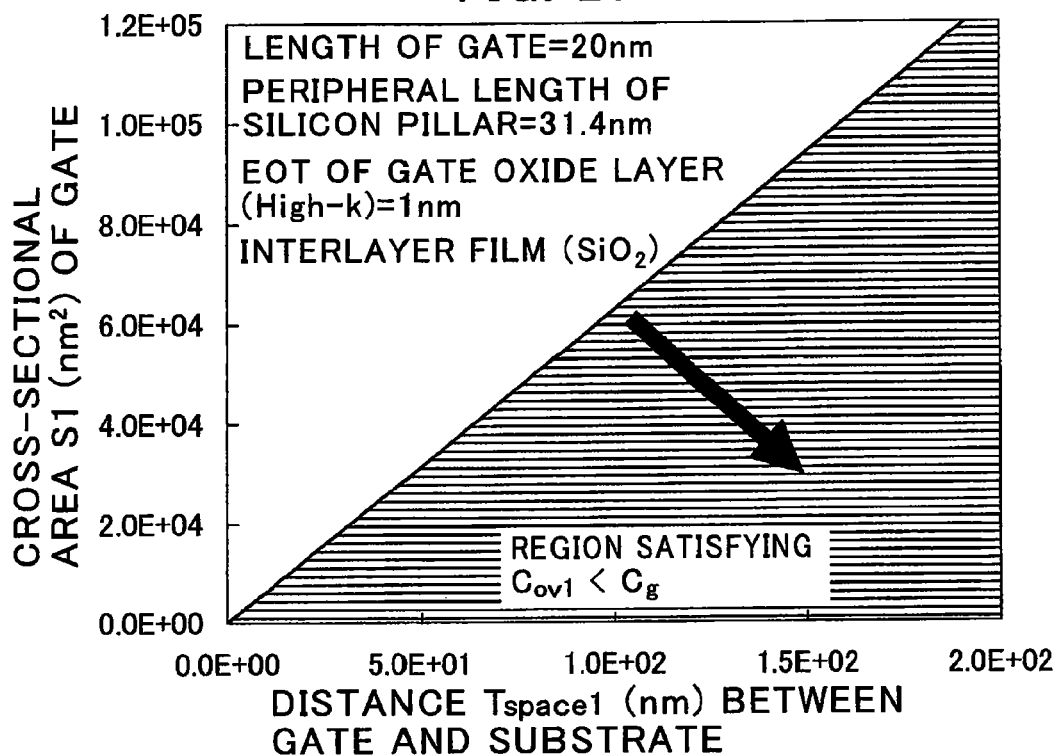
FIG. 20 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 15 where a gate oxide layer is made of $HfO_2$.

In FIG. 20, $C_{ov1}$ becomes less than $C_g$ in a region on the side of the arrowed direction.

Further, as with the first embodiment, in order to reduce the parasitic capacitance in the third embodiment where the interlayer film 610 is made of $SiO_2$ and the gate oxide layer 320 is made of $HfO_2$, it is desirable that the parasitic capacitance $C_{ov2}$ between the gate 210 and the second silicon pillar 820 is less than the gate capacitance $C_g$, as shown in the following formula (3-3):

$$C_{ov2} < C_g \qquad (3\text{-}3)$$

Based on the formula (1-16) in the first embodiment, the following conditional formula (3-4) representing a relationship between the cross-sectional area S2 of the gate 210, and the distance $T_{space2}$ between the gate 210 and the second silicon pillar 820, is obtained (unit in the formula (3-4): nm) (FIG. 21):

$$S2 < \frac{\varepsilon_{ox} l w}{\varepsilon_x T_{ox}} T_{space2} = 6.3e2 T_{space2} \qquad (3\text{-}4)$$

Figure 21:
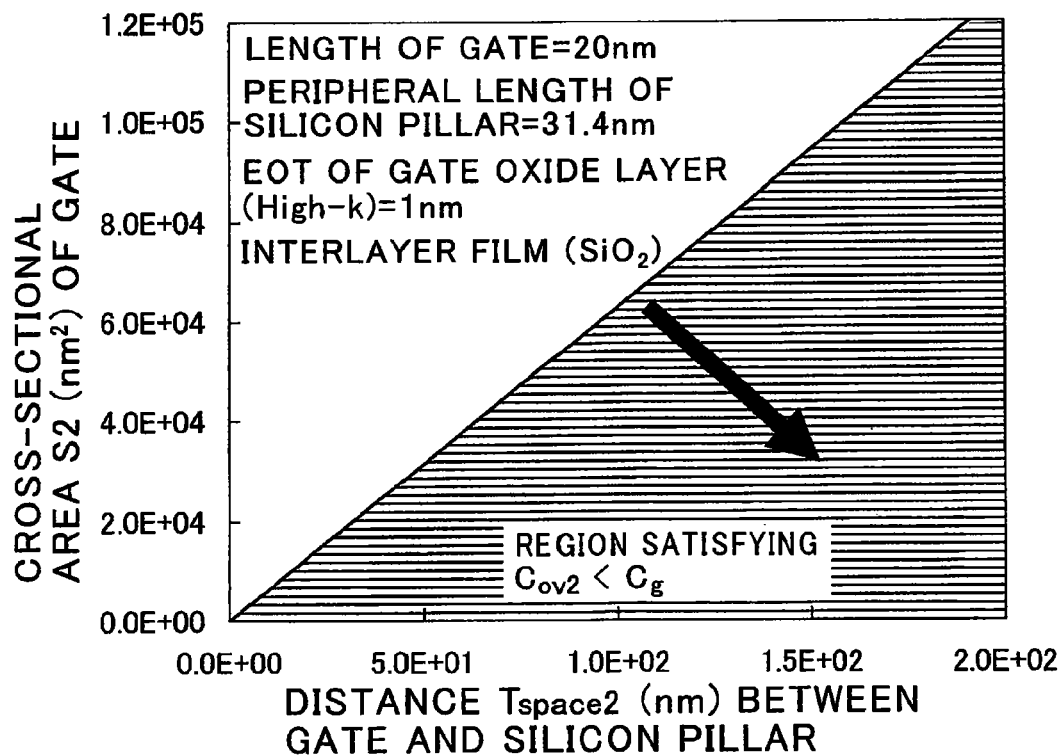
FIG. 21 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 15 where a gate oxide layer is made of $HfO_2$.

In FIG. 21, $C_{ov2}$ becomes less than $C_g$ in a region on the side of the arrowed direction.

Fourth Embodiment

Semiconductor Device

Figure 22:
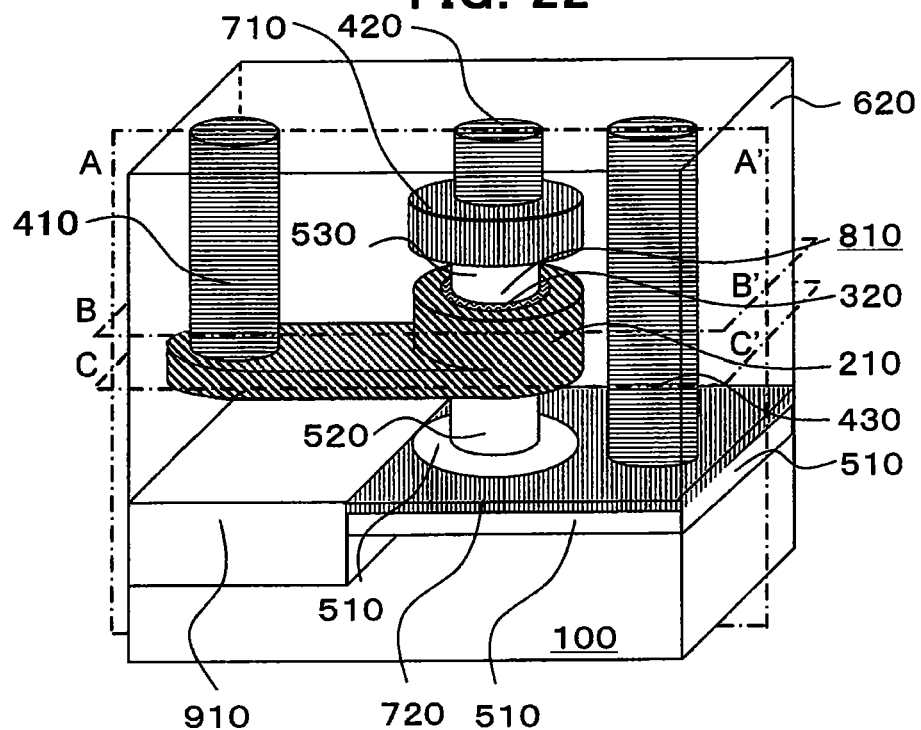
FIG. 22 is a bird's-eye view showing a semiconductor device according to a fourth embodiment of the present invention.
Figure 23:
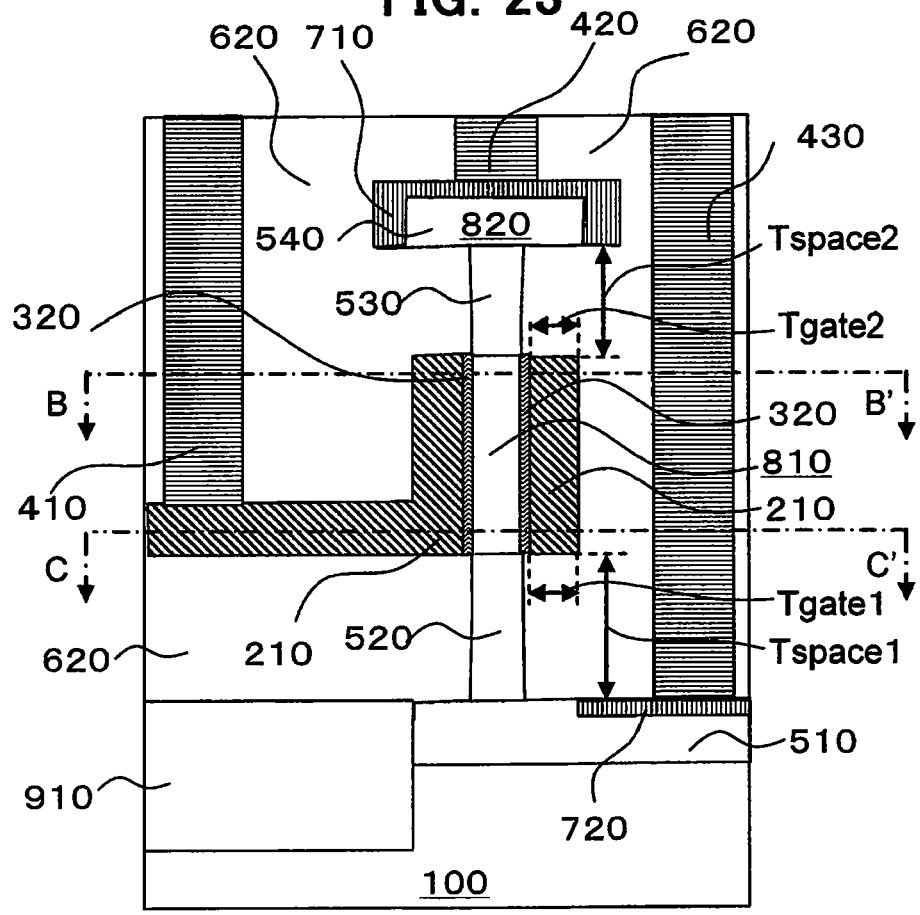
FIG. 23 is a sectional view of the semiconductor device, taken along the line A-A' in FIG. 22.
Figure 24:
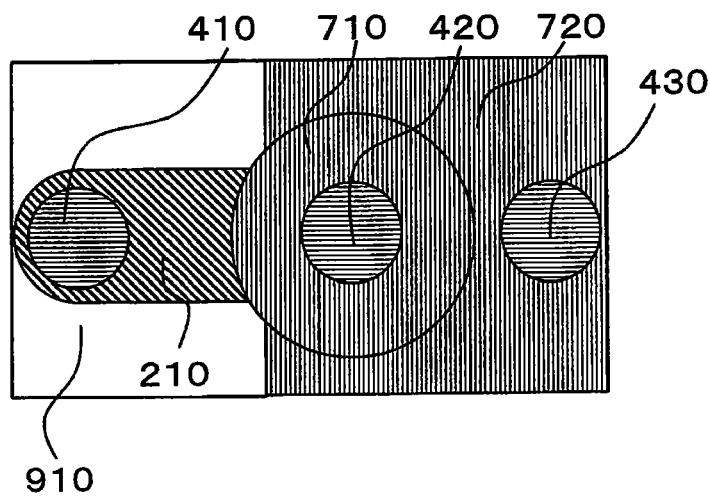
FIG. 24 is a top view of the semiconductor device in FIG. 22.
Figure 25:
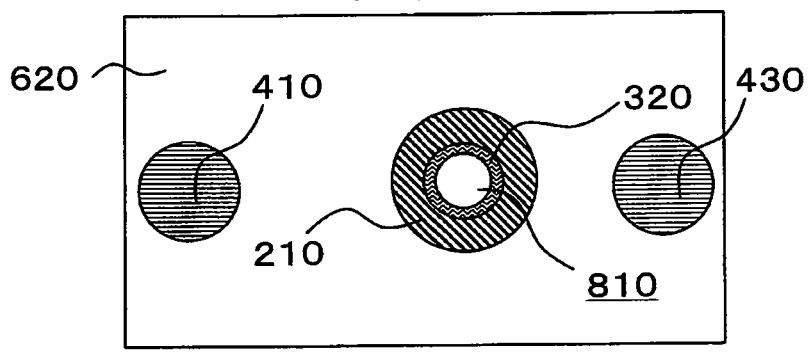
FIG. 25 is a sectional view of the semiconductor device, taken along the line B-B' in FIG. 23.
Figure 26:
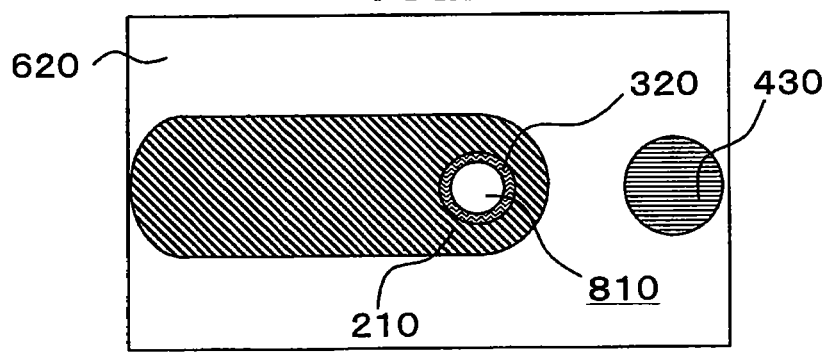
FIG. 26 is a sectional view of the semiconductor device, taken along the line C-C' in FIG. 23.

FIG. 22 is a schematic bird's-eye view showing a transistor in a semiconductor device according to the fourth embodiment of the present invention, wherein the semiconductor device according to the fourth embodiment is the same as that in the first embodiment, except that the interlayer film 610 made of $SiO_2$ is replaced by an interlayer film 620 made of SiN, and the gate oxide layer 310 made of $SiO_2$ is replaced by a gate oxide layer 320 made of $HfO_2$. FIG. 23 is a schematic sectional view taken along the cutting-plane line A-A' in FIG. 22, and FIG. 24 is a top view of the transistor in FIG. 22. FIG. 25 is a schematic sectional view taken along the cutting-plane line B-B' in FIG. 23, and FIG. 26 is a schematic sectional view taken along the cutting-plane line C-C' in FIG. 23. As with the first embodiment, in order to reduce a parasitic capacitance in the fourth embodiment, it is desirable that the parasitic capacitance $C_{ov1}$ between the gate 210 and the semiconductor substrate 100 is less than the gate capacitance $C_g$, as shown in the following formula (4-1):

$$C_{ov1} < C_g \qquad (4\text{-}1)$$

Specifically, given that: the length of the gate 210 is 20 nm; the peripheral length of the first silicon pillar 810 is 31.4 nm; the equivalent film thickness $T_{ox}$ of the gate oxide layer 320 is 1 nm; and the interlayer film is made of SiN. Based on the formula (1-5) in the first embodiment, the following conditional formula (4-2) representing a relationship between the cross-sectional area S1 of the gate 210, and the distance $T_{space1}$ between the gate 210 and the semiconductor substrate 100, is obtained (unit in the formulas (4-2): nm) (FIG. 27):

$$S1 < \frac{\varepsilon_{ox} l w}{\varepsilon_x T_{ox}} T_{space1} = 3.1e2 T_{space1} \qquad (4\text{-}2)$$

Figure 27:
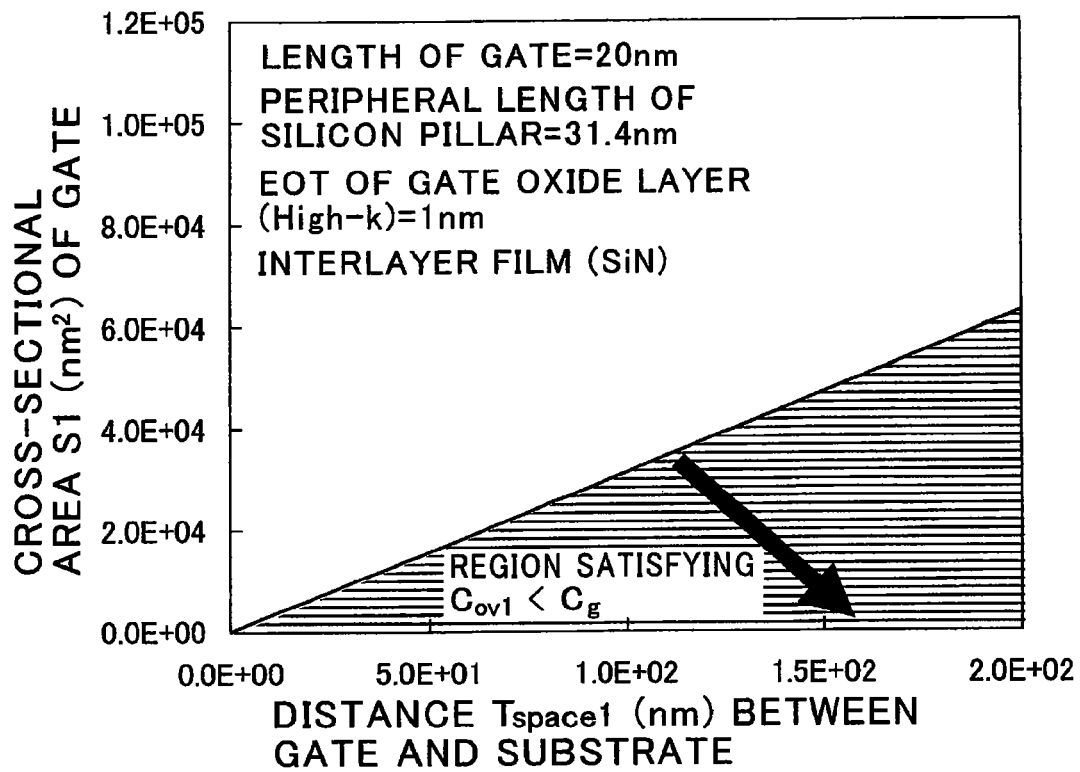
FIG. 27 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 22 where a gate oxide layer is made of $HfO_2$ and an interlayer film is made of SiN.

In FIG. 27, $C_{ov1}$ becomes less than $C_g$ in a region on the side of the arrowed direction.

Further, as with the first embodiment, in order to reduce the parasitic capacitance in the fourth embodiment where the interlayer film 620 is made of SiN and the gate oxide layer 320 is made of $HfO_2$, it is desirable that the parasitic capacitance $C_{ov2}$ between the gate 210 and the second silicon pillar 820 is less than the gate capacitance $C_g$, as shown in the following formula (4-3):

$$C_{ov2} < C_g \qquad (4\text{-}3)$$

Based on the formula (1-16) in the first embodiment, the following conditional formula (4-4) representing a relationship between the cross-sectional area S2 of the gate 210, and the distance $T_{space2}$ between the gate 210 and the second silicon pillar 820, is obtained (unit in the formula (4-4): nm) (FIG. 28):

$$S2 < \frac{\varepsilon_{ox} l w}{\varepsilon_x T_{ox}} T_{space2} = 3.1e2 T_{space2} \qquad (4\text{-}4)$$

Figure 28:
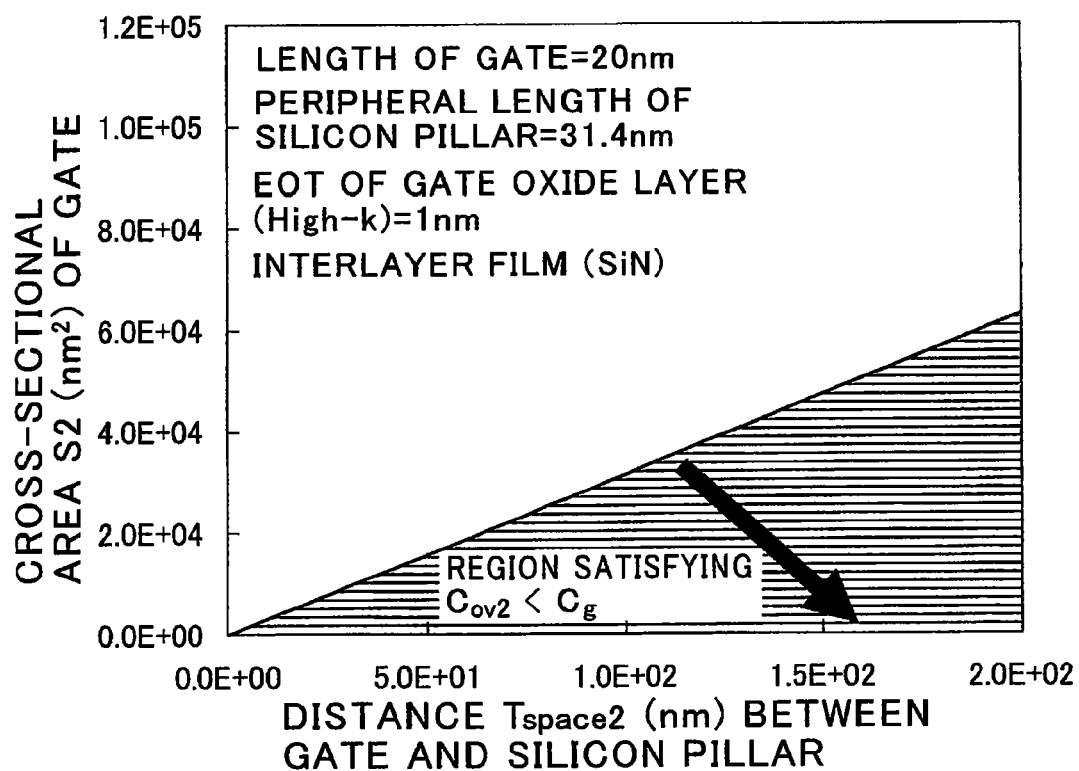
FIG. 28 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 22 where a gate oxide layer is made of $HfO_2$, and an interlayer film is made of SiN.

In FIG. 28, $C_{ov2}$ becomes less than $C_g$ in a region on the side of the arrowed direction.

Fifth Embodiment

Semiconductor Device

Each of fifth to eighth embodiments of the present invention is an example where a first silicon pillar 810 has a circular shape in cross-section.

In the fifth embodiment, an after-mentioned first insulating body 310 (gate oxide layer) is made of $SiO_2$, and an after-mentioned second insulating body 610 (interlayer film) is made of $SiO_2$.

Figure 29:
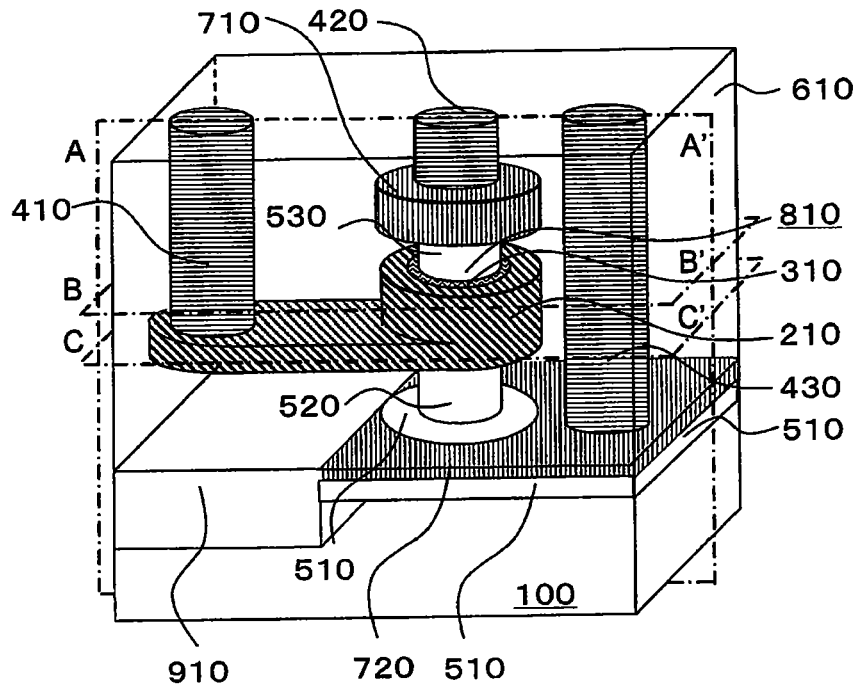
FIG. 29 is a bird's-eye view showing a semiconductor device according to a fifth embodiment of the present invention.
Figure 30:
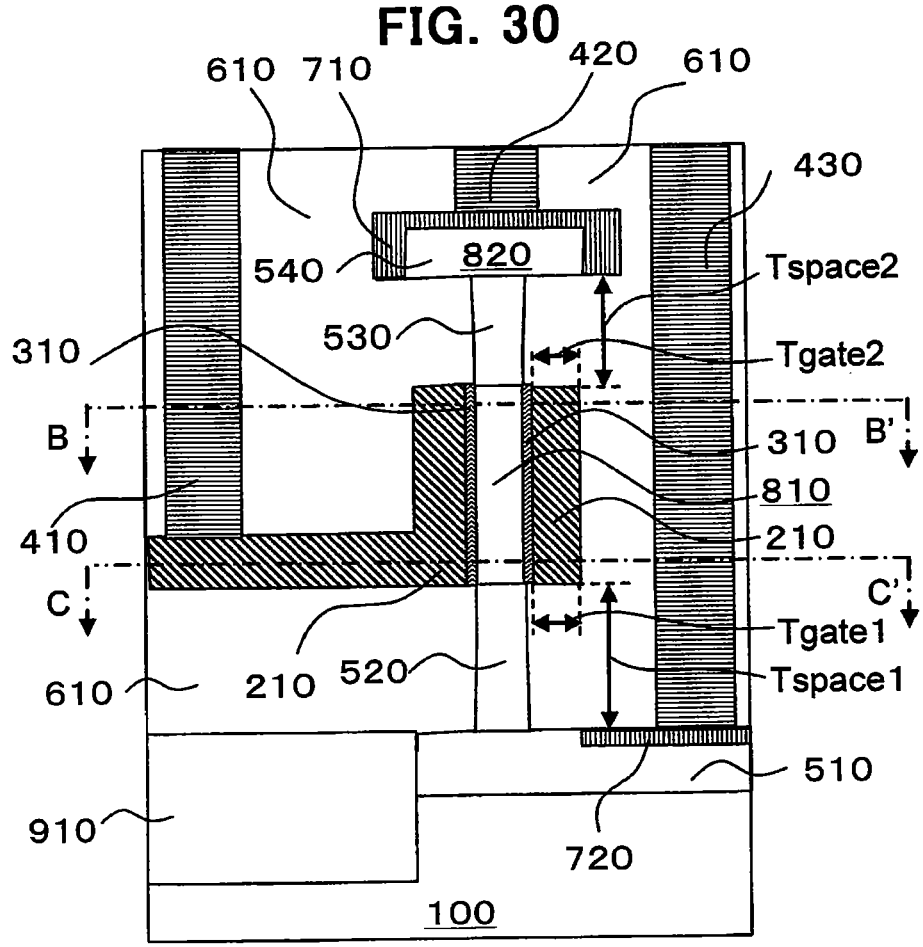
FIG. 30 is a sectional view of the semiconductor device, taken along the line A-A' in FIG. 29.
Figure 31:
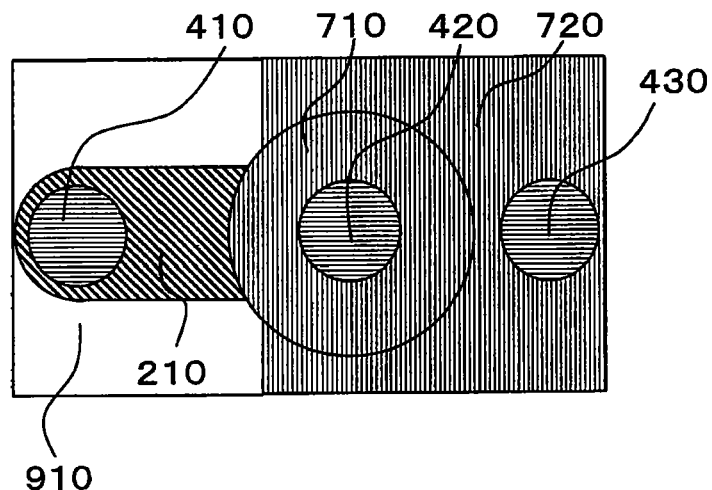
FIG. 31 is a top view of the semiconductor device in FIG. 29.
Figure 32:
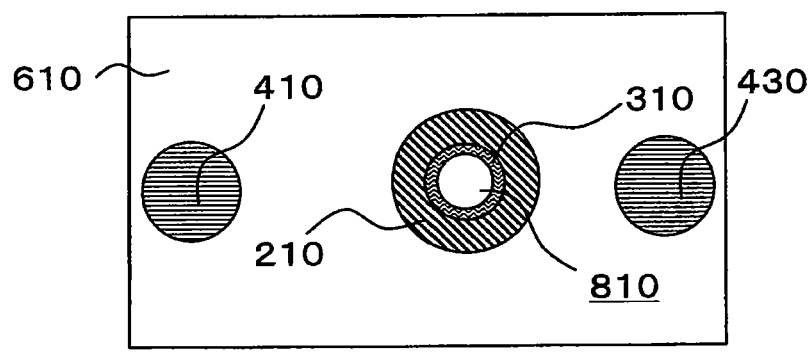
FIG. 32 is a sectional view of the semiconductor device, taken along the line B-B' in FIG. 30.
Figure 33:
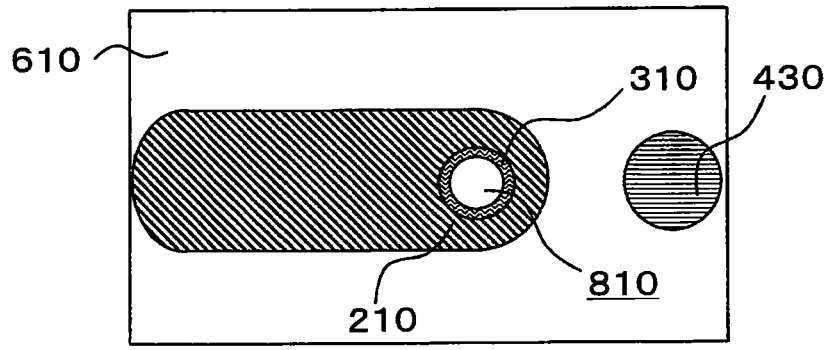
FIG. 33 is a sectional view of the semiconductor device, taken along the line C-C' in FIG. 30.

FIG. 29 is a schematic bird's-eye view showing a transistor in a semiconductor device according to the fifth embodiment of the present invention. FIG. 30 is a schematic sectional view taken along the cutting-plane line A-A' in FIG. 29, and FIG. 31 is a top view of the transistor in FIG. 29. FIG. 32 is a schematic sectional view taken along the cutting-plane line B-B' in FIG. 30, and FIG. 33 is a schematic sectional view taken along the cutting-plane line C-C' in FIG. 30. The semiconductor device according to the fifth embodiment comprises a cross-sectionally circular-shaped first silicon pillar 810 formed on a first-conductive type semiconductor substrate 100, a first insulating body 310 surrounding a part of a surface of the first silicon pillar 810, a gate 210 surrounding the first insulating body 310, and a second silicon pillar 820 formed on a top of the first silicon pillar 810. The gate 210 is disposed to be separated from the semiconductor substrate 100 by a second insulating body 610. Further, the gate 210 is disposed to be separated from the second silicon pillar 820 by the second insulating body 610.

The semiconductor device further comprises a second-conductive type high-concentration impurity region 520 formed in a part of the first silicon pillar 810, a second-conductive type high-concentration impurity region 530 formed in a part of the first silicon pillar 810, a second-conductive type high-concentration impurity region 510 formed in a part of the semiconductor substrate 100, a second-conductive type high-concentration impurity region 540 formed in a part of the second silicon pillar 820, a silicide region 720 formed in a part of the second-conductive type high-concentration impurity region 510, a silicide region 710 formed in the second-conductive type high-concentration impurity region 540, a contact 430 formed on the silicide region 720, a contact 420 formed on the silicide region 710, a contact 410 formed on the gate 210, and an element isolation region 910 formed in the semiconductor substrate 100.

In order to reduce a parasitic capacitance in the fifth embodiment, it is desirable that a parasitic capacitance $C_{ov1}$ between the gate 210 and the semiconductor substrate 100 is less than a gate capacitance $C_g$, as shown in the following formula (5-1):

$$C_{ov1} < C_g \quad (5\text{-}1)$$

Specifically, given that: a length of the gate 210 is 20 nm; a diameter of the first silicon pillar 810 is 10 nm; a film thickness $T_{ox}$ of the gate oxide layer 310 is 1 nm; and the interlayer film is made of $SiO_2$. A relationship of the capacitance $C_{ov1}$ between the gate 210 and the semiconductor substrate 100, a dielectric constant $\epsilon_X$ of the interlayer film 610, a cross-sectional area S1 of the gate 210, and a distance $T_{space1}$ between the gate 210 and the semiconductor substrate 100, is expressed as the following formula (5-2), and then the formula (5-2) is assigned to the formula (5-1) to obtain the following formula (5-3):

$$C_{ov1} = \frac{\epsilon_X S1}{T_{space1}} \quad (5\text{-}2)$$

$$S1 < \frac{C_g}{\epsilon_X} T_{space1} \quad (5\text{-}3)$$

The gate capacitance $C_g$ is expressed as the following formula (5-4) which is a relational expression of a dielectric constant $\epsilon_{OX}$ of the gate oxide layer 310, the length l of the gate 210, a radius R of the first silicon pillar 810, and the film thickness $T_{ox}$ of the gate oxide layer 310, and the cross-sectional area S1 of the gate 210 is expressed as the following formula (5-5) which is a relational expression of a gate film thickness $T_{gate1}$ of a first one of opposite ends of the gate, the radius R of the first silicon pillar 810 and the film thickness $T_{ox}$ of the gate oxide layer 310. Thus, the formulas (5-4) and (5-5) are assigned to the formula (5-3) to obtain the following conditional formula (5-6) representing a relationship between the cross-sectional area S1 of the gate 210, and the distance $T_{space1}$ between the gate 210 and the semiconductor substrate 100:

$$C_g = \frac{\epsilon_{ox} \cdot 2\pi R l}{R \cdot \ln\left(1 + \frac{T_{ox}}{R}\right)} \quad (5\text{-}4)$$

$$S1 = \pi(R + T_{ox} + T_{gate1})^2 - \pi(R + T_{ox})^2 \quad (5\text{-}5)$$

$$\pi(R + T_{ox} + T_{gate1})^2 - \pi(R + T_{ox})^2 < \frac{\epsilon_{ox} \cdot 2\pi R l}{\epsilon_{ox} \cdot R \cdot \ln\left(1 + \frac{T_{ox}}{R}\right)} T_{space1} \quad (5\text{-}6)$$

If the conditional formula (5-6) is satisfied, the formula (5-1) is satisfied. Thus, the following formula (5-7) is obtained (unit in the formula (5-7: nm) (FIG. 34):

$$6.9e2 \cdot T_{space1} > \pi(6 + T_{gate1})^2 - 1.1e2 \Rightarrow C_{ov1} < C_g$$

Typically, the peripheral length of the first silicon pillar 810 is set in the range of 1 nm to 100 μm, and the film thickness of the gate oxide layer 310 is set in the range of 0.5 to 100 nm. Further, the length of the gate 210 is set in the range of 5 nm to 10 μm, and the dielectric constant $\epsilon_X$ of the interlayer film is set in the range of 3.9 to 7.6. In this structure, conditions satisfying the formula (5-1) will be calculated. Given that: the peripheral length of the first silicon pillar 810 is 100 μm; the film thickness of the gate oxide layer 310 is 0.5 nm; the length of the gate 210 is 10 μm, and the dielectric constant $\epsilon_X$ of the interlayer film is 3.9. The gate capacitance $C_g$ is expressed as the following formula (5-8) which is a relational expression of the dielectric constant $\epsilon_{OX}$ of the gate oxide layer 310, the length l of the gate 210, the radius R of the first silicon pillar 810, and the film thickness $T_{ox}$ of the gate oxide layer 310, and the cross-sectional area S1 of the gate 210 is expressed as the following formula (5-9) which is a relational expression of the gate film thickness $T_{gate1}$ the radius R of the first silicon pillar 810 and the film thickness $T_{ox}$ of the gate oxide layer 310. Thus, the formulas (5-8) and (5-9) are assigned to the formula (5-1) to obtain the following conditional formula (5-10) representing a relationship between the cross-sectional area S1 of the gate 210, and the distance $T_{space1}$ between the gate 210 and the semiconductor substrate 100:

$$S1 = \pi(R + T_{ox} + T_{gate2})^2 - \pi(R + T_{ox})^2 \quad (5\text{-}8)$$

$$C_g = \frac{\epsilon_{ox} \cdot 2\pi R l}{R \cdot \ln\left(1 + \frac{T_{ox}}{R}\right)} \quad (5\text{-}9)$$

$$\pi(R + T_{ox} + T_{gate1})^2 - \pi(R + T_{ox})^2 < \frac{\epsilon_{ox} \cdot 2\pi R l}{\epsilon_{ox} \cdot R \cdot \ln\left(1 + \frac{T_{ox}}{R}\right)} T_{space1} \quad (5\text{-}10)$$

If the conditional formula (5-10) is satisfied, the formula (5-1) is satisfied. Thus, the following formula (5-11) is obtained, and then the following formula (5-12) is obtained from the formula (5-11) (unit in the formulas (5-11) and (5-12): μm):

$$2.0e6 \cdot T_{space1} > \pi T_{gate1}^2 + 1.0e2 T_{gate1} \Rightarrow C_{ov1} < C_g \quad (5\text{-}11)$$

$$2.0e6 \cdot T_{space1} >> \pi T_{gate1}^2 + 1.0e2 T_{gate1} \Rightarrow C_{ov1} << C_g \quad (5\text{-}12)$$

Figure 34:
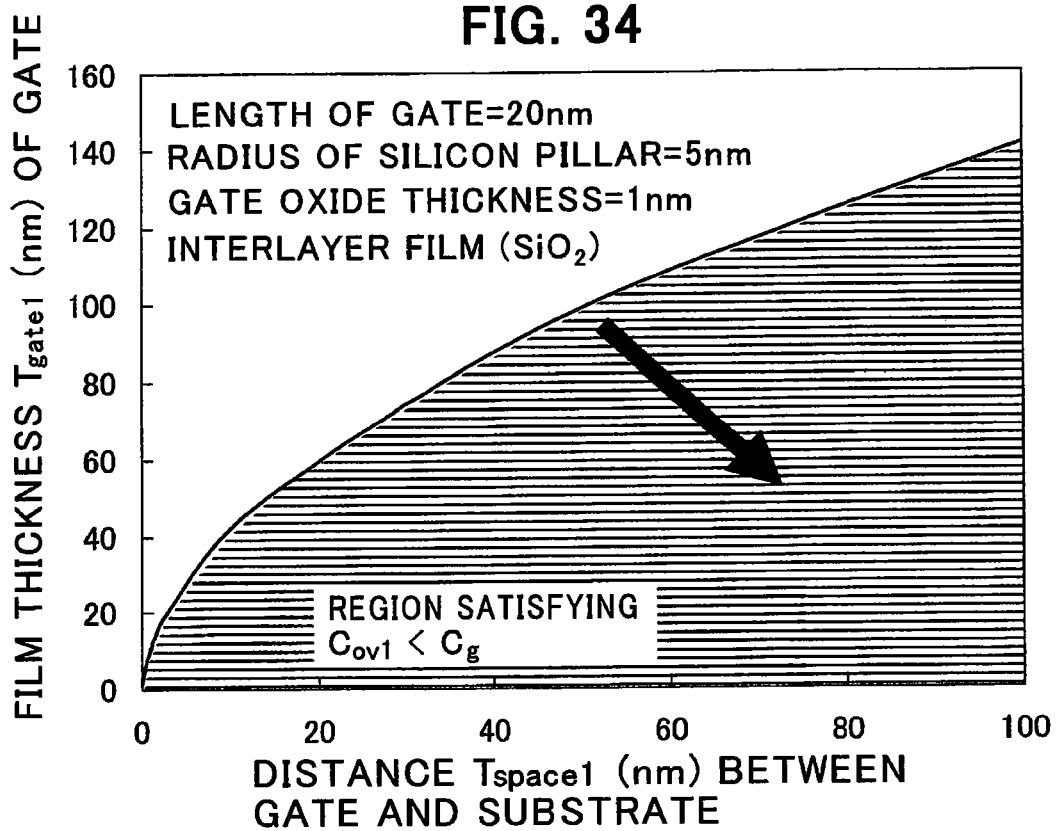
FIG. 34 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 29.

In FIG. 34, $C_{ov1}$ becomes less than $C_g$ in a region on the side of the arrowed direction.

Further, in order to reduce the parasitic capacitance in the fifth embodiment, it is desirable that a parasitic capacitance $C_{ov2}$ between the gate 210 and the second silicon pillar 820 is less than the gate capacitance $C_g$, as shown in the following formula (5-13):

$$C_{ov2} < C_g \qquad (5\text{-}13)$$

Specifically, given that: the length of the gate 210 is 20 nm; the diameter of the first silicon pillar 810 is 10 nm; the film thickness $T_{ox}$ of the gate oxide layer 310 is 1 nm; and the interlayer film is made of $SiO_2$. A relationship of the capacitance $C_{ov2}$ between the gate 210 and the second silicon pillar 820, the dielectric constant $\epsilon_X$ of the interlayer film 610, a cross-sectional area S2 of the gate 210, and a distance $T_{space2}$ between the gate 210 and the second silicon pillar 820, is expressed as the following formula (5-14), and then the formula (5-14) is assigned to the formula (5-13) to obtain the following formula (5-15):

$$C_{ov2} = \frac{\varepsilon_x S2}{T_{space2}} \qquad (5\text{-}14)$$

$$S2 < \frac{C_g}{\varepsilon_x} T_{space2} \qquad (5\text{-}15)$$

The gate capacitance $C_g$ is expressed as the following formula (5-16) which is a relational expression of the dielectric constant $\epsilon_{0X}$ of the gate oxide layer 310, the length l of the gate 210, the radius R of the first silicon pillar 810, and the film thickness $T_{ox}$ of the gate oxide layer 310, and the cross-sectional area S2 of the gate 210 is expressed as the following formula (5-17) which is a relational expression of a gate film thickness $T_{gate2}$ of the other, second end of the gate 210, the radius R of the first silicon pillar 810 and the film thickness $T_{ox}$ of the gate oxide layer 310. Thus, the formulas (5-16) and (5-17) are assigned to the formula (5-15) to obtain the following conditional formula (5-18) representing a relationship between the cross-sectional area S2 of the gate 210, and the distance $T_{space2}$ between the gate 210 and the second silicon pillar 820:

$$C_g = \frac{\varepsilon_{ox} \cdot 2\pi R l}{R \cdot \ln\left(1 + \frac{T_{ox}}{R}\right)} \qquad (5\text{-}16)$$

$$S2 = \pi(R + T_{ox} + T_{gate1})^2 - \pi(R + T_{ox})^2 \qquad (5\text{-}17)$$

$$\pi(R + T_{ox} + T_{gate2})^2 - \pi(R + T_{ox})^2 < \frac{\varepsilon_{ox} \cdot 2\pi R l}{\varepsilon_{ox} \cdot R \cdot \ln\left(1 + \frac{T_{ox}}{R}\right)} T_{space2} \qquad (5\text{-}18)$$

If the conditional formula (5-18) is satisfied, the formula (5-13) is satisfied. Thus, the following formula (5-19) is obtained (unit in the formulas (5-19): nm (FIG. 35):

$$6.9e2 \cdot T_{space2} > \pi(6 + T_{gate2})^2 - 1.1e2 \Rightarrow C_{ov2} < C_g \qquad (5\text{-}19)$$

Typically, the peripheral length of the first silicon pillar 810 is set in the range of 1 nm to 100 μm, and the film thickness of the gate oxide layer 310 is set in the range of 0.5 to 100 nm. Further, the length of the gate 210 is set in the range of 5 nm to 10 μm, and the dielectric constant $\epsilon_X$ of the interlayer film is set in the range of 3.9 to 7.6. In this structure, conditions satisfying the formula (5-13) will be calculated. Given that: the peripheral length of the first silicon pillar 810 is 100 μm; the film thickness of the gate oxide layer 310 is 0.5 nm; the length of the gate 210 is 10 μm, and the dielectric constant $\epsilon_X$ of the interlayer film is 3.9. The gate capacitance $C_g$ is expressed as the following formula (5-20) which is a relational expression of the dielectric constant $\epsilon_{0X}$ of the gate oxide layer 310, the length l of the gate 210, the radius R of the first silicon pillar 810, and the film thickness $T_{ox}$ of the gate oxide layer 310, and the cross-sectional area S2 of the gate 210 is expressed as the following formula (5-21) which is a relational expression of the gate film thickness $T_{gate2}$, the radius R of the first silicon pillar 810 and the film thickness $T_{ox}$ of the gate oxide layer 310. Thus, the formulas (5-20) and (5-21) are assigned to the formula (5-13) to obtain the following conditional formula (5-22) representing a relationship between the cross-sectional area S2 of the gate 210, and the distance $T_{space2}$ between the gate 210 and the second silicon pillar 820:

$$S2 = \pi(R + T_{ox} + T_{gate2})^2 - \pi(R + T_{ox})^2 \qquad (5\text{-}20)$$

$$C_g = \frac{\varepsilon_{ox} \cdot 2\pi R l}{R \cdot \ln\left(1 + \frac{T_{ox}}{R}\right)} \qquad (5\text{-}21)$$

$$\pi(R + T_{ox} + T_{gate2})^2 - \pi(R + T_{ox})^2 < \frac{\varepsilon_{ox} \cdot 2\pi R l}{\varepsilon_{ox} \cdot R \cdot \ln\left(1 + \frac{T_{ox}}{R}\right)} T_{space2} \qquad (5\text{-}22)$$

If the conditional formula (5-22) is satisfied, the formula (5-13) is satisfied. Thus, the following formula (5-23) is obtained, and then the following formula (5-24) is obtained from the formula (5-23) (unit in the formulas (5-23) and (5-24): μm):

$$2.0e6 \cdot T_{space2} > \pi T_{gate2}^2 + 1.0e2 T_{gate2} \Rightarrow C_{ov2} < C_g \qquad (5\text{-}23)$$

$$2.0e6 \cdot T_{space2} >> \pi T_{gate2}^2 + 1.0e2 T_{gate2} \Rightarrow C_{ov2} << C_g \qquad (5\text{-}24)$$

Figure 35:
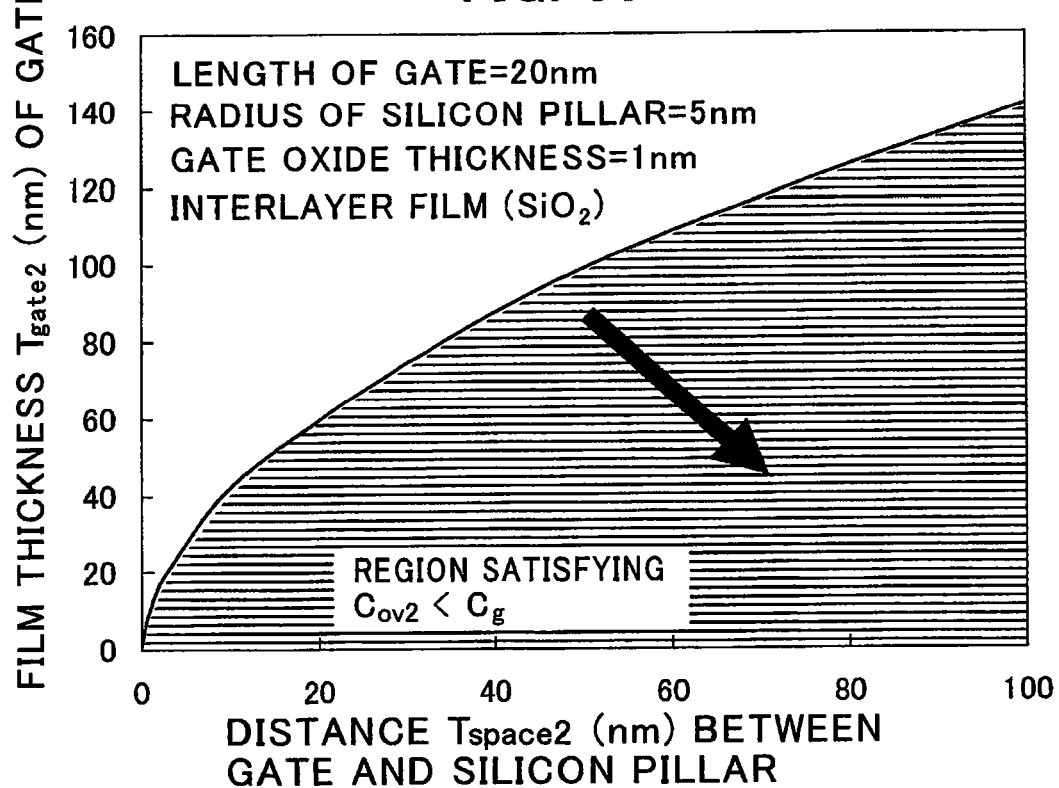
FIG. 35 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 29.

In FIG. 35, $C_{ov2}$ becomes less than $C_g$ in a region on the side of the arrowed direction.

Sixth Embodiment

Semiconductor Device

Figure 36:
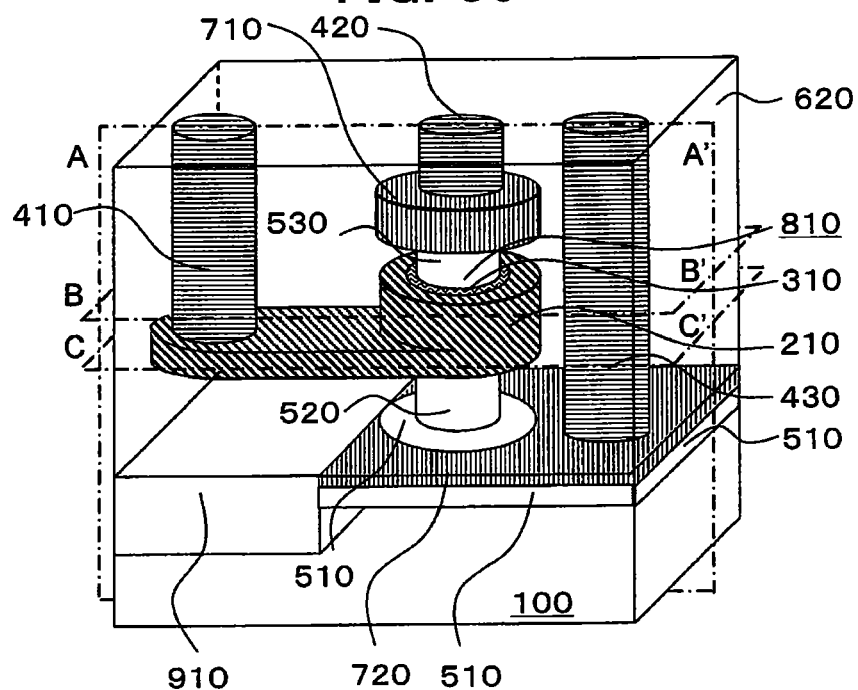
FIG. 36 is a bird's-eye view showing a semiconductor device according to a sixth embodiment of the present invention.
Figure 37:
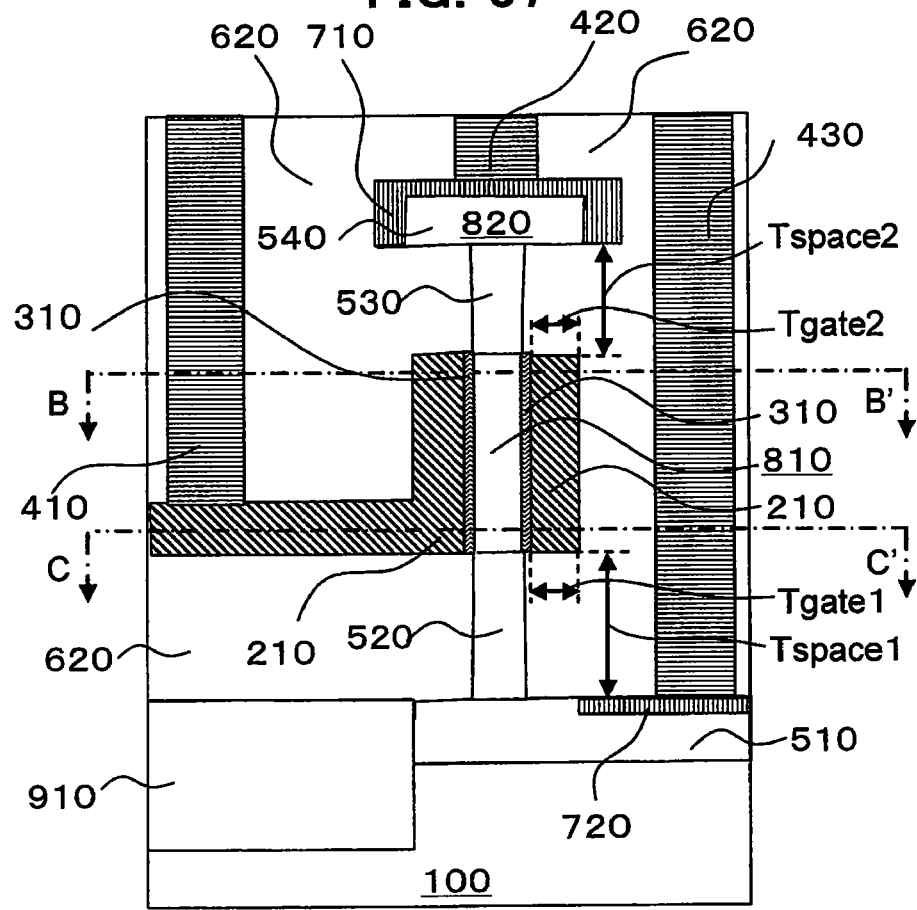
FIG. 37 is a sectional view of the semiconductor device, taken along the line A-A' in FIG. 36.
Figure 38:
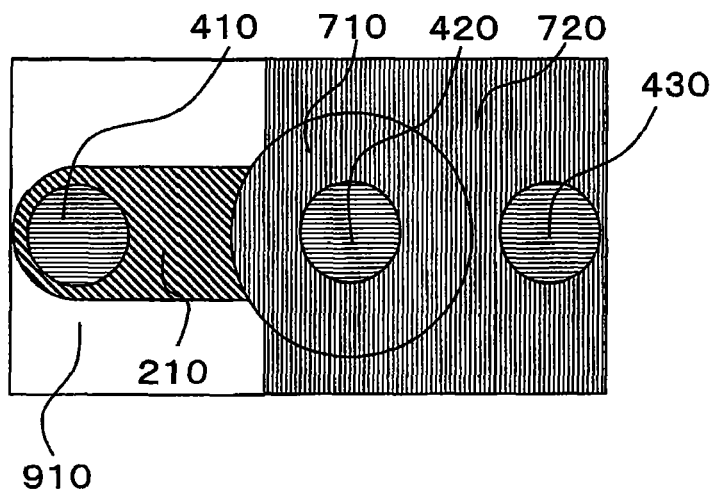
FIG. 38 is a top view of the semiconductor device in FIG. 36.
Figure 39:
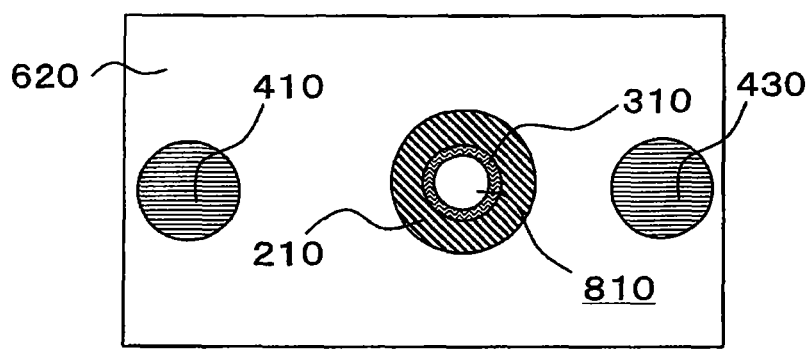
FIG. 39 is a sectional view of the semiconductor device, taken along the line B-B' in FIG. 37.
Figure 40:
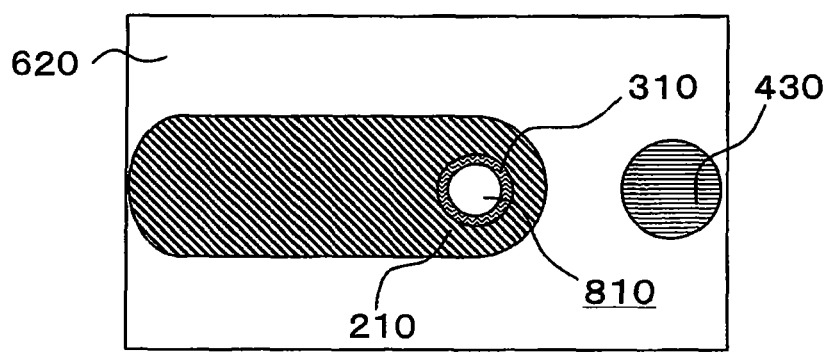
FIG. 40 is a sectional view of the semiconductor device, taken along the line C-C' in FIG. 37.

FIG. 36 is a schematic bird's-eye view showing a transistor in a semiconductor device according to the sixth embodiment of the present invention, wherein the semiconductor device according to the sixth embodiment is the same as that in the fifth embodiment, except that the interlayer film 610 made of $SiO_2$ is replaced by an interlayer film 620 made of SiN. FIG. 37 is a schematic sectional view taken along the cutting-plane line A-A' in FIG. 36, and FIG. 38 is a top view of the transistor in FIG. 36. FIG. 39 is a schematic sectional view taken along the cutting-plane line B-B' in FIG. 37, and FIG. 40 is a schematic sectional view taken along the cutting-plane line C-C' in FIG. 37. As with the fifth embodiment, in order to reduce a parasitic capacitance in the sixth embodiment, it is desirable that the parasitic capacitance $C_{ov1}$ between the gate 210 and the semiconductor substrate 100 is less than the gate capacitance $C_g$, as shown in the following formula (6-1):

$$C_{ov1} < C_g \qquad (6\text{-}1)$$

Specifically, given that: the length of the gate 210 is 20 nm; the diameter of the first silicon pillar 810 is 10 nm; and the film thickness $T_{ox}$ of the gate oxide layer 310 made of $SiO_2$ is 1.0 nm. Based on the formula (5-6) in the fifth embodiment, the following conditional formula (6-2) representing a relationship between the film thickness T the gate 210, and the distance $T_{space1}$ between the gate 210 and the semiconductor substrate 100, is obtained (unit in the formulas (6-2): nm) (FIG. 41):

$$3.4e2 \cdot T_{space1} > \pi(6+T_{gate1})^2 - 1.1e2 \Rightarrow C_{ov1} < C_g \quad (6\text{-}2)$$

Figure 41:
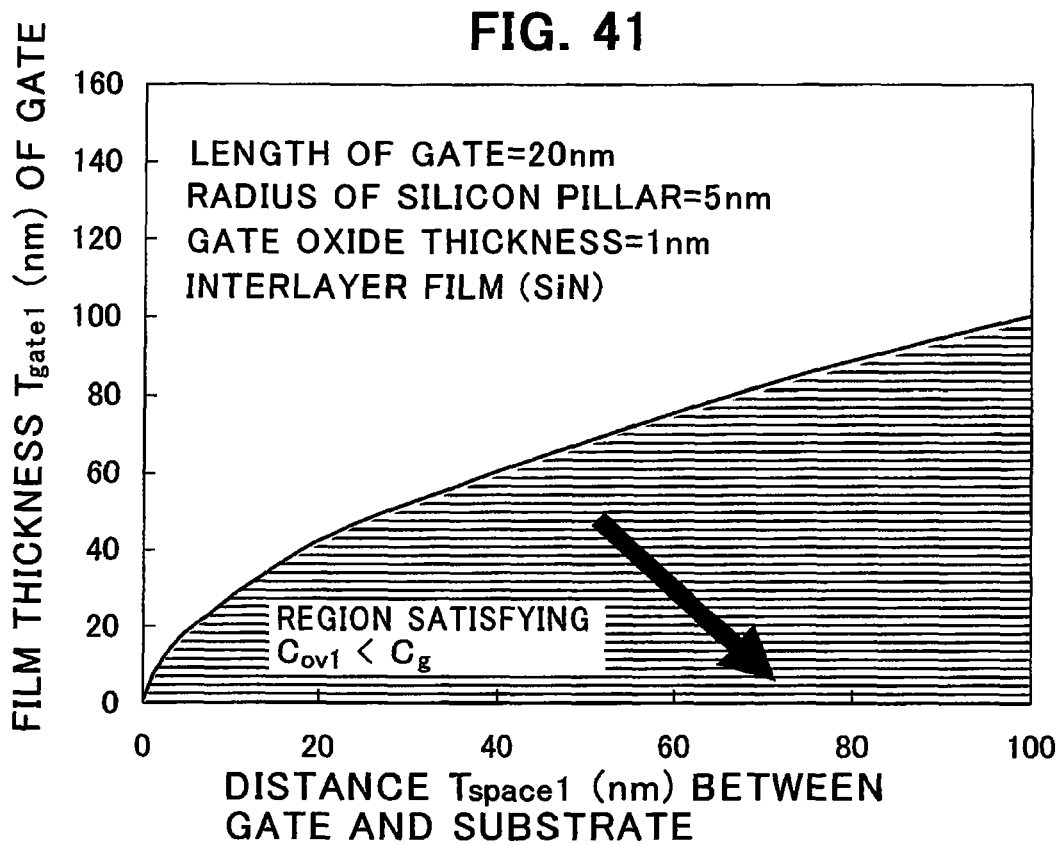
FIG. 41 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 36 where an interlayer film is made of SiN.

In FIG. 41, $C_{ov1}$ becomes less than $C_g$ in a region on the side of the arrowed direction.

Further, as with the fifth embodiment, in order to reduce the parasitic capacitance in the sixth embodiment where the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (6-3):

$$C_{ov2} < C_g \quad (6\text{-}3)$$

Based on the formula (5-18) in the fifth embodiment, the following conditional formula (6-4) representing a relationship between the film thickness $T_{gate2}$ of the gate 210, and the distance $T_{space2}$ between the gate 210 and the second silicon pillar 820, is obtained (unit in the formula (6-4): nm) (FIG. 42):

$$3.4e2 \cdot T_{space2} > \pi(6+T_{gate2})^2 - 1.1e2 \Rightarrow C_{ov2} < C_g \quad (6\text{-}4)$$

Figure 42:
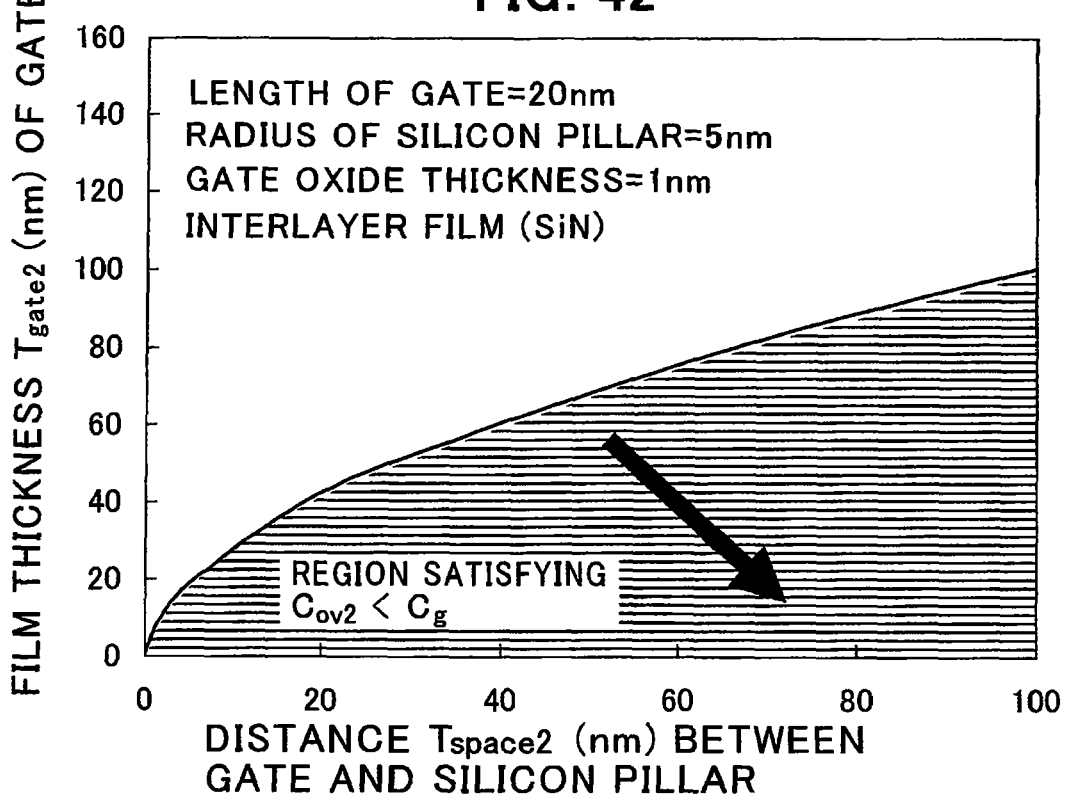
FIG. 42 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 36 where an interlayer film is made of SiN.

In FIG. 42, $C_{ov2}$ becomes less than $C_g$ in a region on the side of the arrowed direction.

Seventh Embodiment

Semiconductor Device

Figure 43:
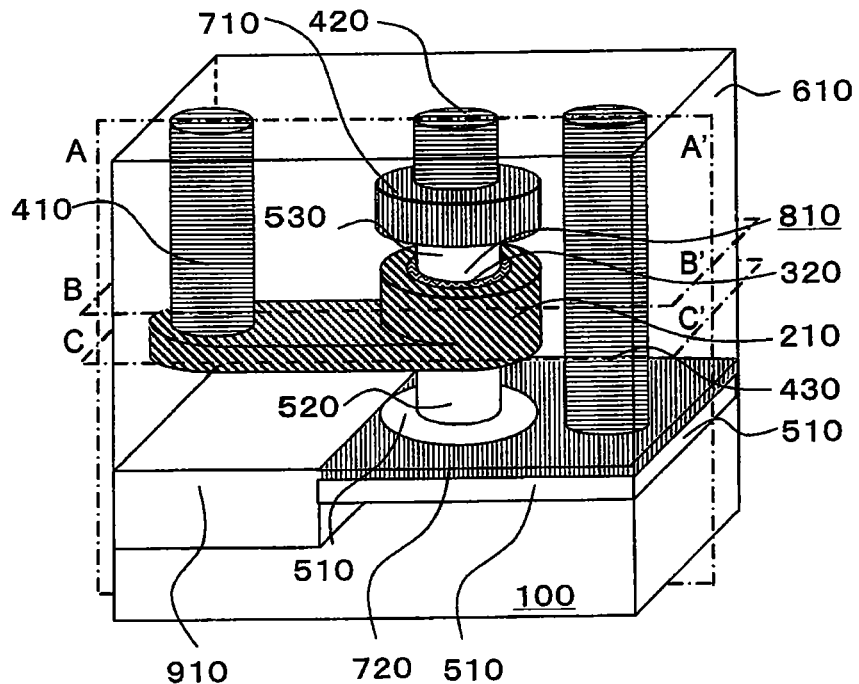
FIG. 43 is a bird's-eye view showing a semiconductor device according to a seventh embodiment of the present invention.
Figure 44:
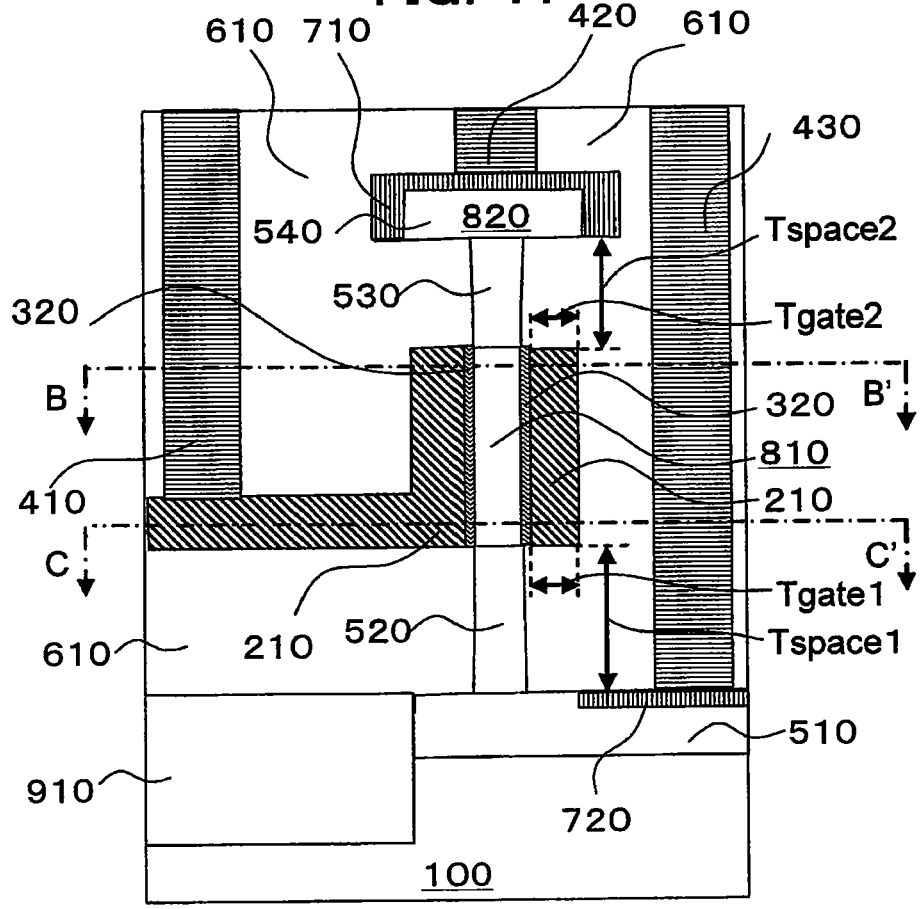
FIG. 44 is a sectional view of the semiconductor device, taken along the line A-A' in FIG. 43.
Figure 45:
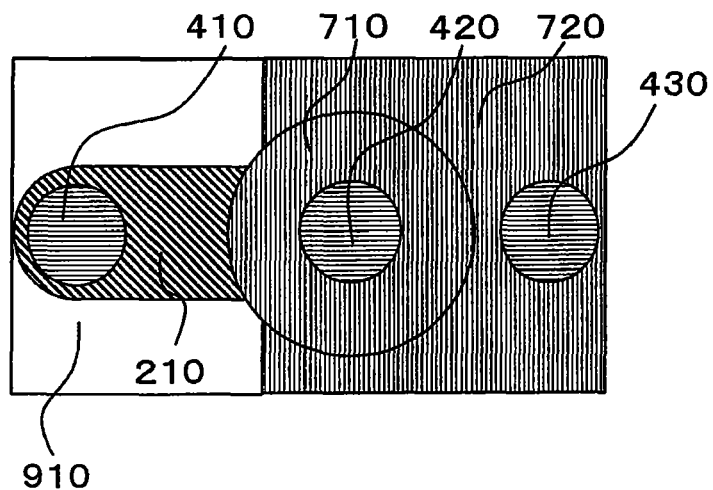
FIG. 45 is a top view of the semiconductor device in FIG. 43.
Figure 46:
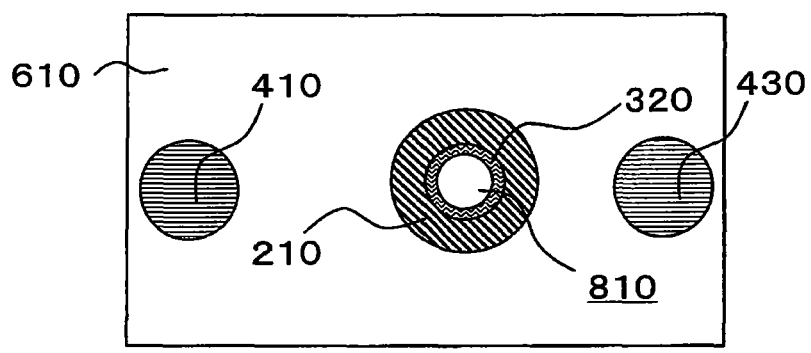
FIG. 46 is a sectional view of the semiconductor device, taken along the line B-B' in FIG. 44.
Figure 47:
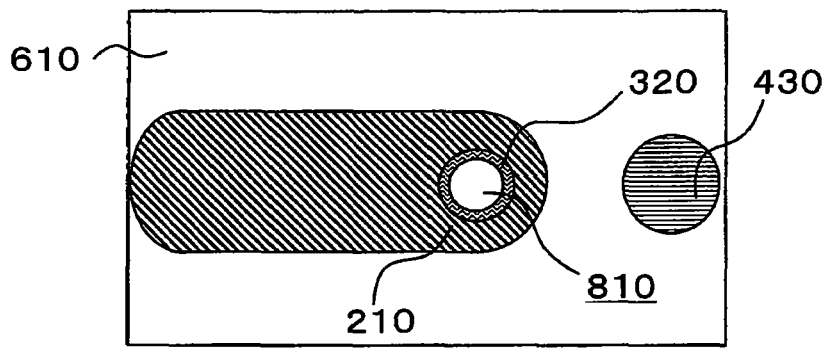
FIG. 47 is a sectional view of the semiconductor device, taken along the line C-C' in FIG. 44.

FIG. 43 is a schematic bird's-eye view showing a transistor in a semiconductor device according to the seventh embodiment of the present invention, wherein the semiconductor device according to the seventh embodiment is the same as that in the fifth embodiment, except that the gate oxide layer 310 made of $SiO_2$ is replaced by a gate oxide layer 320 made of $HfO_2$. FIG. 44 is a schematic sectional view taken along the cutting-plane line A-A' in FIG. 43, and FIG. 45 is a top view of the transistor in FIG. 43. FIG. 46 is a schematic sectional view taken along the cutting-plane line B-B' in FIG. 44, and FIG. 47 is a schematic sectional view taken along the cutting-plane line C-C' in FIG. 44. As with the fifth embodiment, in order to reduce a parasitic capacitance in the seventh embodiment, it is desirable that the parasitic capacitance $C_{ov1}$ between the gate 210 and the semiconductor substrate 100 is less than the gate capacitance $C_g$, as shown in the following formula (7-1):

$$C_{ov1} < C_g \quad (7\text{-}1)$$

Specifically, given that: the length of the gate 210 is 20 nm; the diameter of the first silicon pillar 810 is 10 nm; and the film thickness $T_{ox}$ of the gate oxide layer 320 made of $HfO_2$ is 1.3 nm (equivalent oxide thickness (EOT)). Based on the formula (5-6) in the fifth embodiment, the following conditional formula (7-2) representing a relationship between the film thickness $T_{gate1}$ of the gate 210, and the distance $T_{space1}$ between the gate 210 and the semiconductor substrate 100, is obtained (unit in the formulas (7-2): nm) (FIG. 48):

$$5.4e2 \cdot T_{space1} > \pi(10+T_{gate1})^2 - 3.3e2 \Rightarrow C_{ov1} < C_g \quad (7\text{-}2)$$

Figure 48:
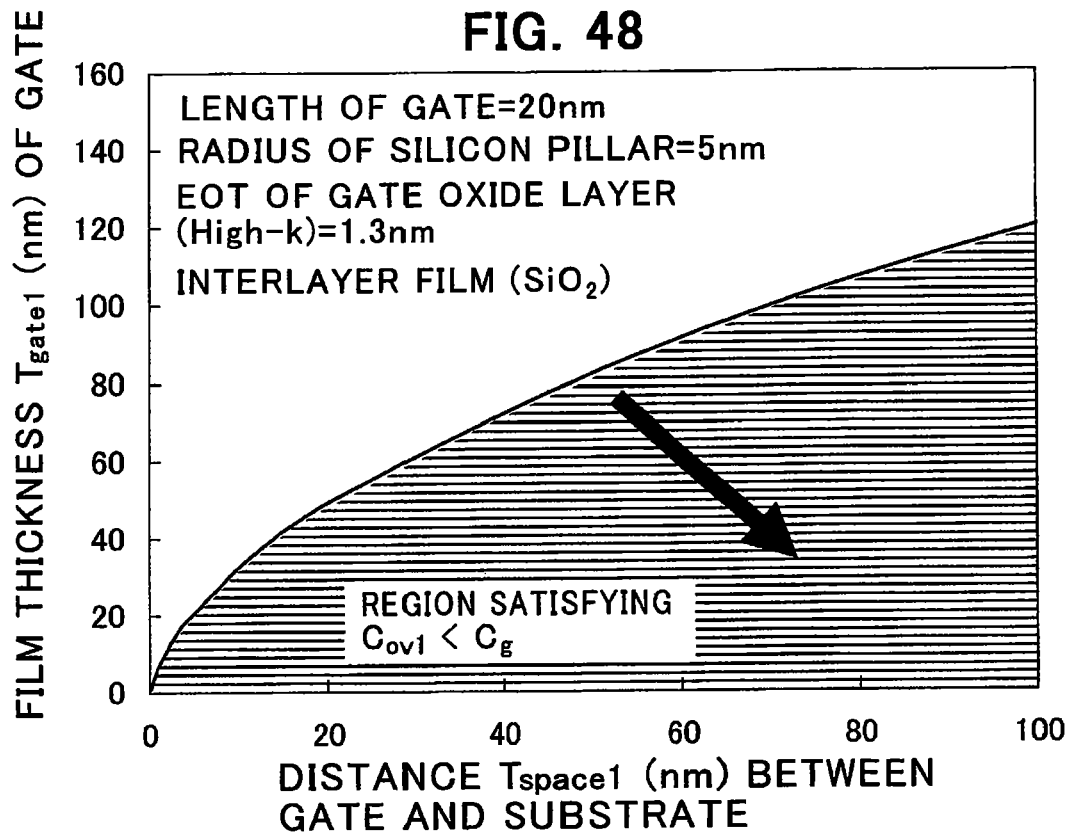
FIG. 48 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 43 where a gate oxide layer is made of $HfO_2$.

In FIG. 48, $C_{ov1}$ becomes less than $C_g$ in a region on the side of the arrowed direction.

Further, as with the fifth embodiment, in order to reduce the parasitic capacitance in the seventh embodiment where the gate oxide layer 320 is made of $HfO_2$, instead of $SiO_2$, it is desirable that the parasitic capacitance $C_{ov2}$ between the gate 210 and the second silicon pillar 820 is less than the gate capacitance $C_g$, as shown in the following formula (7-3):

$$C_{ov2} < C_g \quad (7\text{-}3)$$

Based on the formula (5-18) in the fifth embodiment, the following conditional formula (7-4) representing a relationship between the film thickness $T_{gate2}$ of the gate 210, and the distance $T_{space2}$ between the gate 210 and the second silicon pillar 820, is obtained (unit in the formula (7-4): nm) (FIG. 49):

$$5.4e2 \cdot T_{space2} > \pi(10+T_{gate2})^2 - 3.3e2 \Rightarrow C_{ov2} < C_g \quad (7\text{-}4)$$

Figure 49:
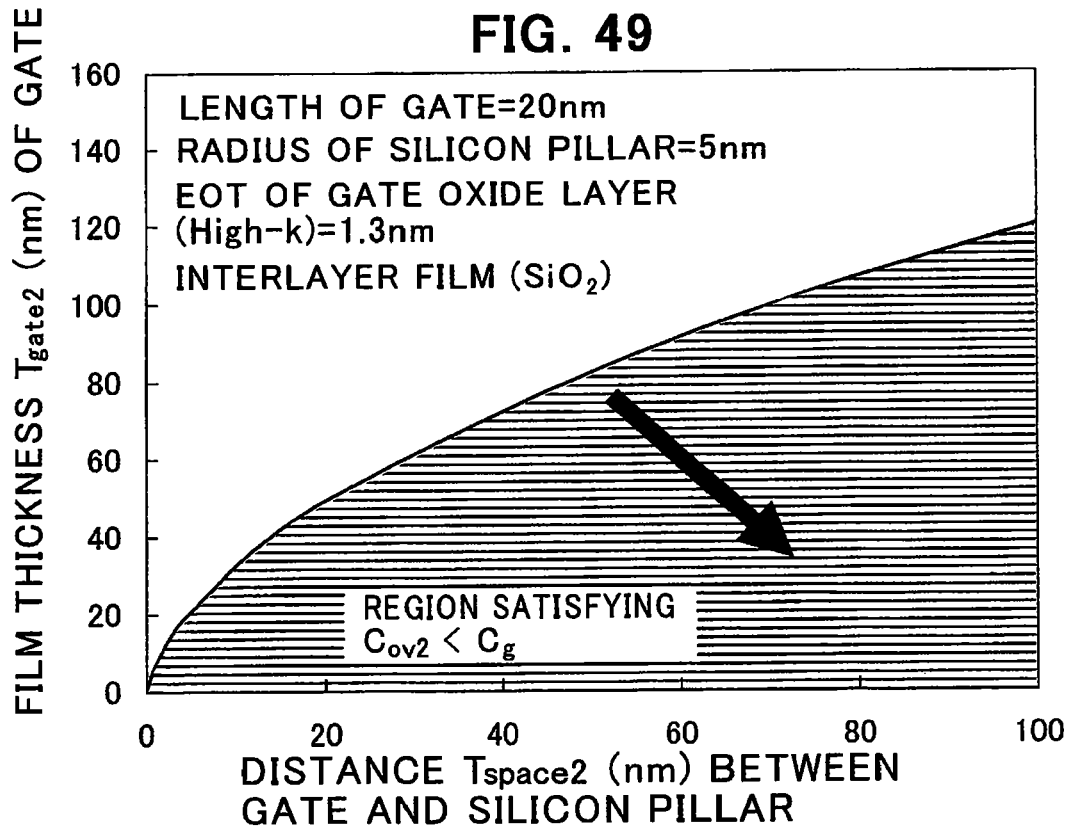
FIG. 49 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 43 where a gate oxide layer is made of $HfO_2$.

In FIG. 49, $C_{ov2}$ becomes less than $C_g$ in a region on the side of the arrowed direction.

Eighth Embodiment

Semiconductor Device

Figure 50:
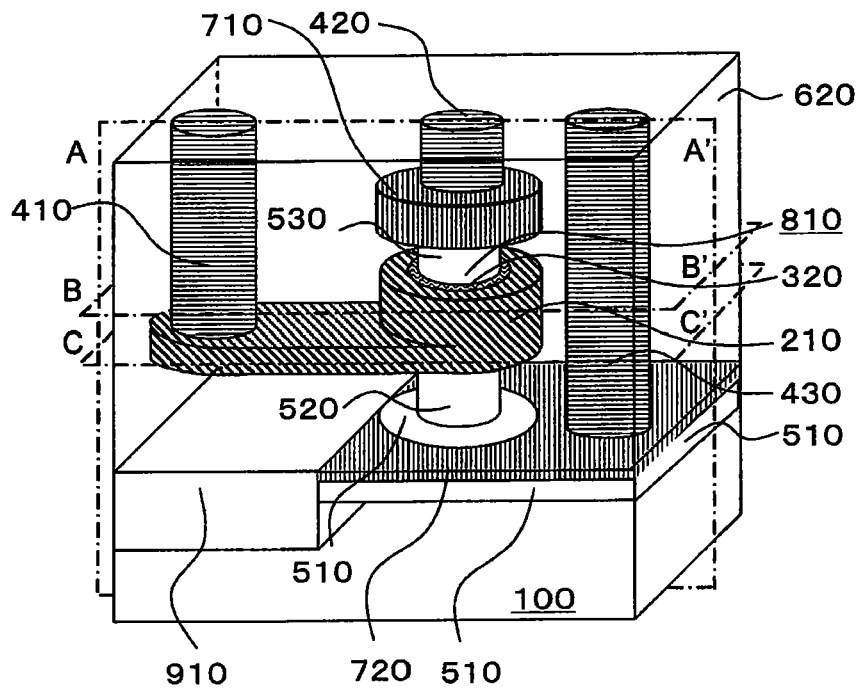
FIG. 50 is a bird's-eye view showing a semiconductor device according to an eighth embodiment of the present invention.
Figure 51:
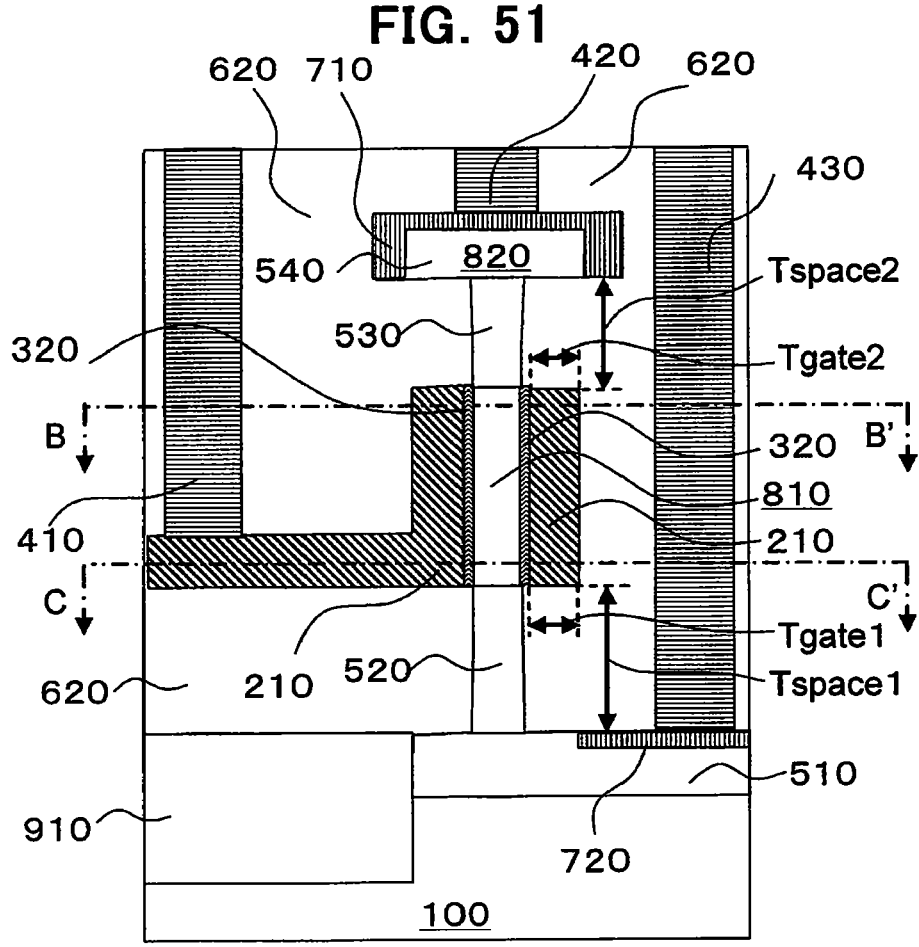
FIG. 51 is a sectional view of the semiconductor device, taken along the line A-A' in FIG. 50.
Figure 52:
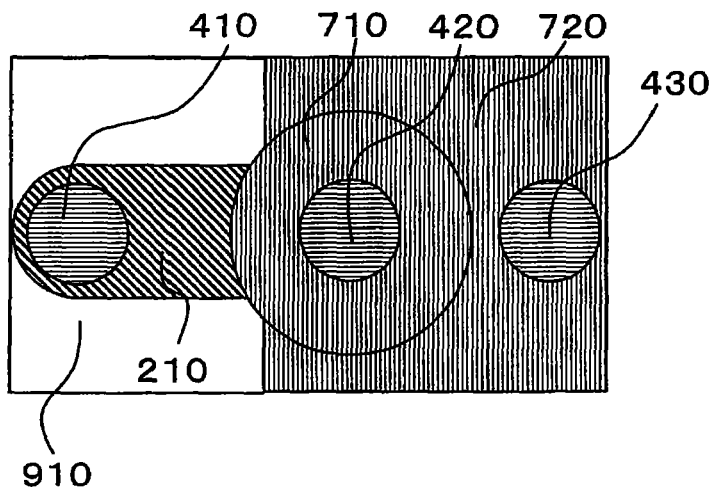
FIG. 52 is a top view of the semiconductor device in FIG. 50.
Figure 53:
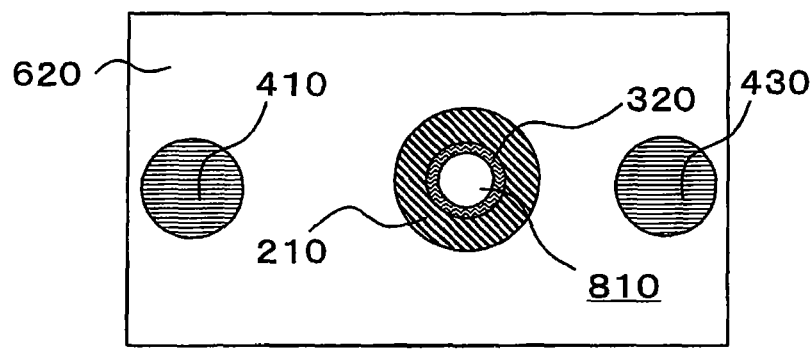
FIG. 53 is a sectional view of the semiconductor device, taken along the line B-B' in FIG. 51.
Figure 54:
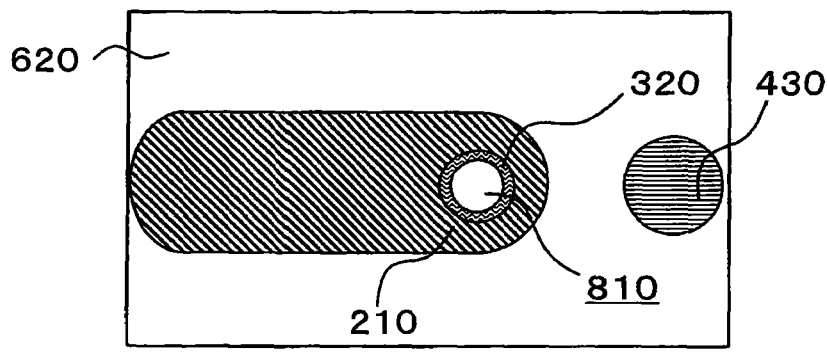
FIG. 54 is a sectional view of the semiconductor device, taken along the line C-C' in FIG. 51.

FIG. 50 is a schematic bird's-eye view showing a transistor in a semiconductor device according to the eighth embodiment of the present invention, wherein the semiconductor device according to the eighth embodiment is the same as that in the fifth embodiment, except that the interlayer film 610 made of $SiO_2$ is replaced by an interlayer film 620 made of SiN, and the gate oxide layer 310 made of $SiO_2$ is replaced by a gate oxide layer 320 made of $HfO_2$. FIG. 51 is a schematic sectional view taken along the cutting-plane line A-A' in FIG. 50, and FIG. 52 is a top view of the transistor in FIG. 50. FIG. 53 is a schematic sectional view taken along the cutting-plane line B-B' in FIG. 51, and FIG. 54 is a schematic sectional view taken along the cutting-plane line C-C' in FIG. 51. As with the fifth embodiment, in order to reduce a parasitic capacitance in the eighth embodiment, it is desirable that the parasitic capacitance $C_{ov1}$ between the gate 210 and the semiconductor substrate 100 is less than the gate capacitance $C_g$, as shown in the following formula (8-1):

$$C_{ov1} < C_g \quad (8\text{-}1)$$

Specifically, given that: the length of the gate 210 is 20 nm; the diameter of the first silicon pillar 810 is 10 nm; and the film thickness $T_{ox}$ of the gate oxide layer 320 made of $HfO_2$ is 1.3 nm (EOT). Based on the formula (5-6) in the fifth embodiment, the following conditional formula (8-2) representing a relationship between the film thickness $T_{gate1}$ of the gate 210, and the distance $T_{space1}$ between the gate 210 and the semiconductor substrate 100, is obtained (unit in the formulas (8-2): nm) (FIG. 55):

$$2.8e2 \cdot T_{space1} > \pi(10+T_{gate1})^2 - 3.3e2 \Rightarrow C_{ov1} < C_g \quad (8\text{-}2)$$

In FIG. 55, $C_{ov1}$ becomes less than $C_g$ in a region on the side of the arrowed direction.

Further, as with the fifth embodiment, in order to reduce the parasitic capacitance in the seventh embodiment where the interlayer film 620 is made of SiN, instead of $SiO_2$, and the gate oxide layer 320 is made of $HfO_2$, instead of $SiO_2$, it is desirable that the parasitic capacitance $C_{ov2}$ between the gate 210 and the second silicon pillar 820 is less than the gate capacitance $C_g$, as shown in the following formula (8-3):

$$C_{ov2} < C_g \quad (8\text{-}3)$$

Based on the formula (5-18) in the fifth embodiment, the following conditional formula (8-4) representing a relationship between the film thickness $T_{gate2}$ of the gate 210, and the distance $T_{space2}$ between the gate 210 and the second silicon pillar 820, is obtained (unit in the formula (8-4): nm) (FIG. 56):

$$2.8e2 \cdot T_{space2} > \pi(10+T_{gate2})^2 - 3.3e2 \Rightarrow C_{ov2} < C_g \quad (8\text{-}4)$$

In FIG. 56, $C_{ov2}$ becomes less than $C_g$ in a region on the side of the arrowed direction.

Ninth Embodiment

Semiconductor Device

Each of ninth to twelfth embodiments of the present invention is an example where a first silicon pillar 810 has a square shape in cross-section.

Figure 57:
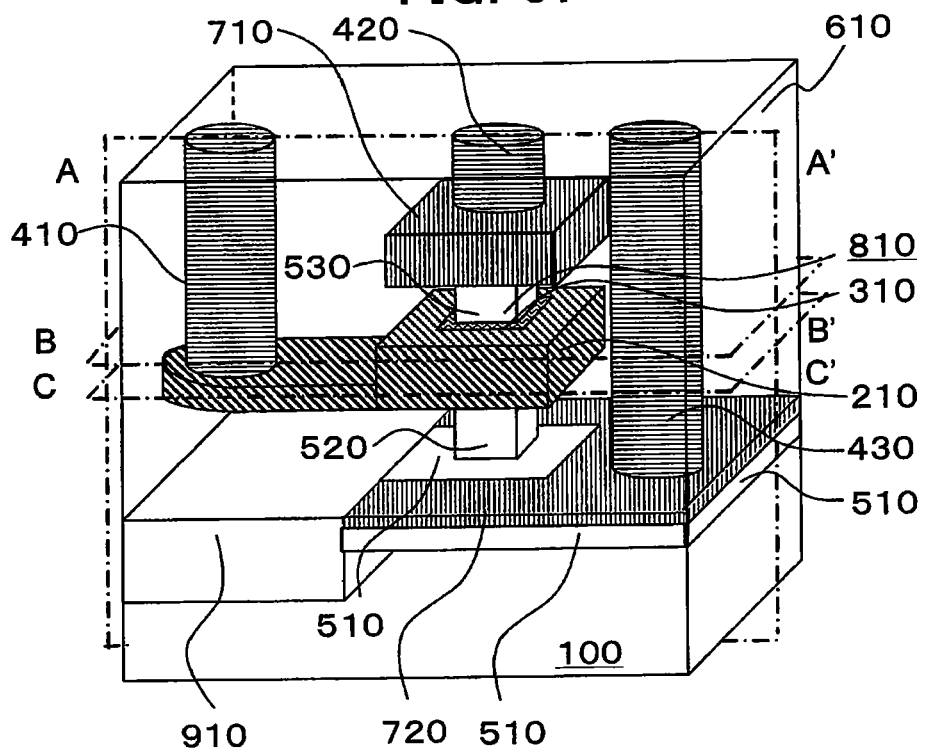
FIG. 57 is a bird's-eye view showing a semiconductor device according to a ninth embodiment of the present invention.
Figure 58:
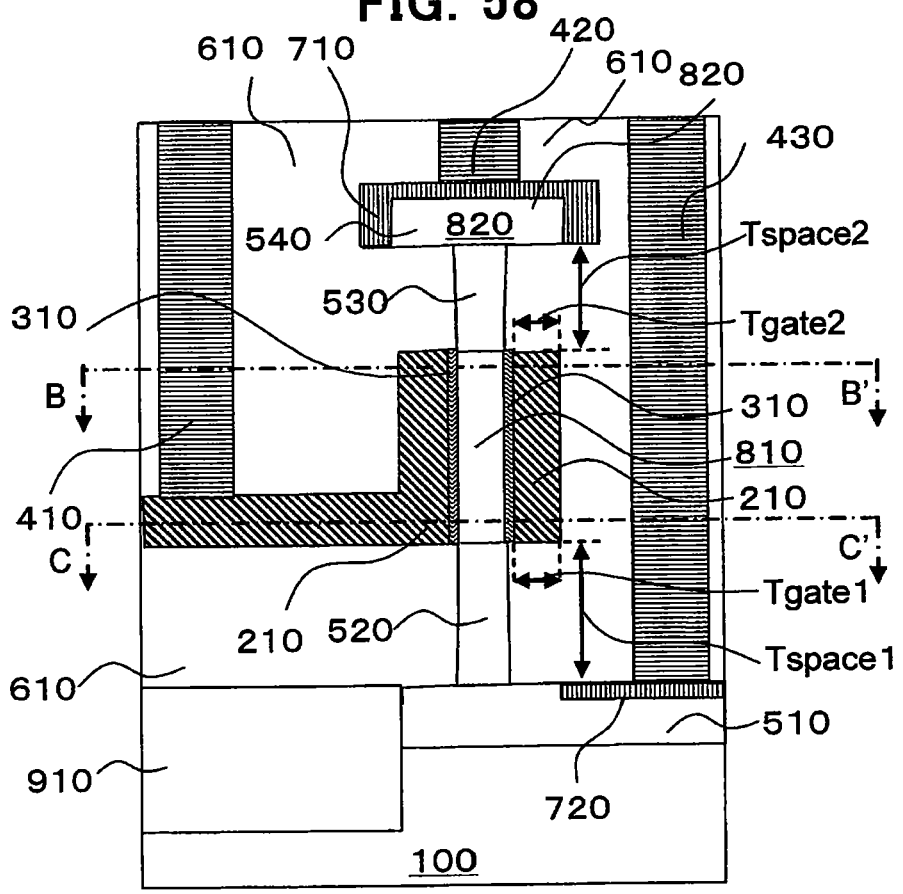
FIG. 58 is a sectional view of the semiconductor device, taken along the line A-A' in FIG. 57.
Figure 59:
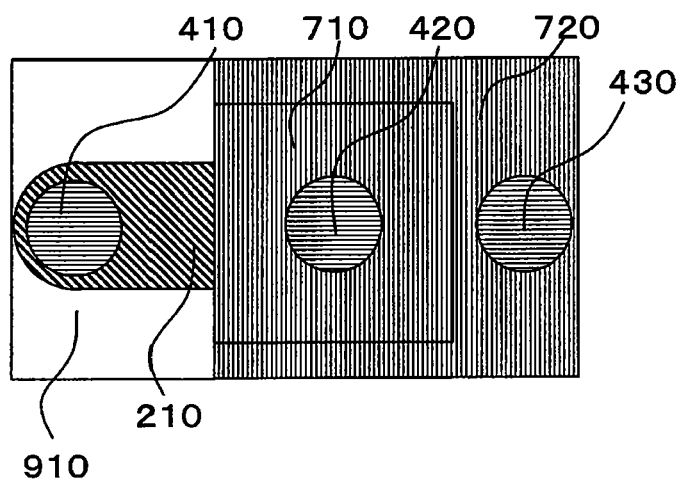
FIG. 59 is a top view of the semiconductor device in FIG. 57.
Figure 60:
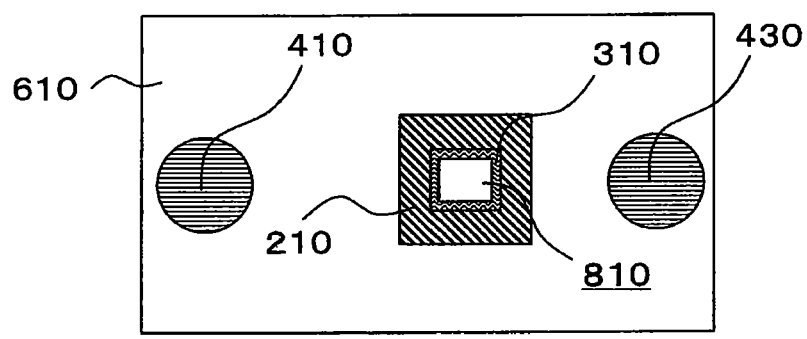
FIG. 60 is a sectional view of the semiconductor device, taken along the line B-B' in FIG. 58.
Figure 61:
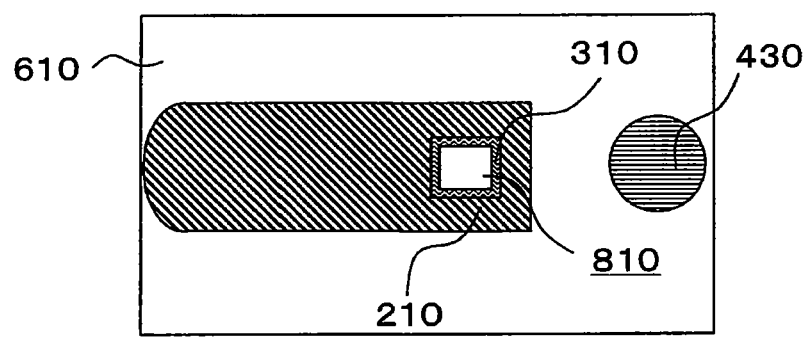
FIG. 61 is a sectional view of the semiconductor device, taken along the line C-C' in FIG. 58.

In the ninth embodiment, an after-mentioned first insulating body 310 (gate oxide layer) is made of $SiO_2$, and an after-mentioned second insulating body 610 (interlayer film) is made of $SiO_2$. FIG. 57 is a schematic bird's-eye view showing a transistor in a semiconductor device according to the ninth embodiment of the present invention. FIG. 58 is a schematic sectional view taken along the cutting-plane line A-A' in FIG. 57, and FIG. 59 is a top view of the transistor in FIG. 57. FIG. 60 is a schematic sectional view taken along the cutting-plane line B-B' in FIG. 58, and FIG. 61 is a schematic sectional view taken along the cutting-plane line C-C' in FIG. 58. The semiconductor device according to the ninth embodiment comprises a cross-sectionally square-shaped first silicon pillar 810 formed on a first-conductive type semiconductor substrate 100, a first insulating body 310 surrounding a part of a surface of the first silicon pillar 810, a gate 210 surrounding the first insulating body 310, and a second silicon pillar 820 formed on a top of the first silicon pillar 810. The gate 210 is disposed to be separated from the semiconductor substrate 100 by a second insulating body 610. Further, the gate 210 is disposed to be separated from the second silicon pillar 820 by the second insulating body 610.

The semiconductor device further comprises a second-conductive type high-concentration impurity region 520 formed in a part of the first silicon pillar 810, a second-conductive type high-concentration impurity region 530 formed in a part of the first silicon pillar 810, a second-conductive type high-concentration impurity region 510 formed in a part of the semiconductor substrate 100, a second-conductive type high-concentration impurity region 540 formed in a part of the second silicon pillar 820, a silicide region 720 formed in a part of the second-conductive type high-concentration impurity region 510, a silicide region 710 formed in the second-conductive type high-concentration impurity region 540, a contact 430 formed on the silicide region 720, a contact 420 formed on the silicide region 710, a contact 410 formed on the gate 210, and an element isolation region 910 formed in the semiconductor substrate 100.

In order to reduce a parasitic capacitance in the ninth embodiment, it is desirable that a parasitic capacitance $C_{ov1}$ between the gate 210 and the semiconductor substrate 100 is less than a gate capacitance $C_g$, as shown in the following formula (9-1):

$$C_{ov1} < C_g \tag{9-1}$$

Specifically, given that: a length of the gate 210 is 20 nm; one side of the first silicon pillar 810 is 10 nm; a film thickness $T_{ox}$ of the gate oxide layer 310 is 1 nm; and the interlayer film is made of $SiO_2$. A relationship of the capacitance $C_{ov1}$ between the gate 210 and the semiconductor substrate 100, a dielectric constant $\epsilon_X$ of the interlayer film 610, a cross-sectional area S1 of the gate 210, and a distance $T_{space1}$ between the gate 210 and the semiconductor substrate 100, is expressed as the following formula (9-2), and then the formula (9-2) is assigned to the formula (9-1) to obtain the following formula (9-3):

$$S1 < \frac{C_g}{\epsilon_x} T_{space1} \tag{9-2}$$

$$C_{ov1} = \frac{\epsilon_x S1}{T_{space1}} \tag{9-3}$$

The gate capacitance $C_g$ is expressed as the following formula (9-4) which is a relational expression of a dielectric constant $\epsilon_{OX}$ of the gate oxide layer 310, the length l of the gate 210, a length R of one side of the first silicon pillar 810, and the film thickness $T_{ox}$ of the gate oxide layer 310, and the cross-sectional area S1 of the gate 210 is expressed as the following formula (9-5). Thus, the formulas (9-4) and (9-5) are assigned to the formula (9-1) to obtain the following conditional formula (9-6) representing a relationship between the cross-sectional area S1 of the gate 210, and the distance $T_{space1}$ between the gate 210 and the semiconductor substrate 100:

$$C_g = \frac{\epsilon_{ox} \cdot 4R \cdot l}{T_{ox}} \tag{9-4}$$

$$S1 = (R + 2T_{ox} + 2T_{gate1})^2 - R + 2T_{ox}{}^2 \tag{9-5}$$

$$(R + 2T_{ox} + 2T_{gate1})^2 - (R + 2T_{ox})^2 < \frac{\epsilon_x \cdot 4Rl}{\epsilon_x \cdot T_{ox}} \cdot T_{space1} \tag{9-6}$$

If the conditional formula (9-6) is satisfied, the formula (9-1) is satisfied. Thus, the above values are assigned to the formula (9-6) to obtain the following formula (9-7) (unit in the formula (9-7): nm) (FIG. 62):

$$800 \cdot T_{space1} > 4T_{gate1}{}^2 + 48T_{gate1} \Rightarrow C_{ov1} < C_g \tag{9-7}$$

Typically, the length of one side of the first silicon pillar 810 is set in the range of 0.25 nm to 25 μm, and the film thickness of the gate oxide layer 310 is set in the range of 0.5 to 100 nm. Further, the length of the gate 210 is set in the range of 5 nm to 10 μm, and the dielectric constant $\epsilon_X$ of the interlayer film is set in the range of 3.9 to 7.6. In this structure, conditions satisfying the formula (9-1) will be calculated. Given that: the length R of one side of the first silicon pillar 810 is 25 μm; the film thickness of the gate oxide layer 310 is 0.5 nm; the length of the gate 210 is 10 μm, and the dielectric constant $\epsilon_X$ of the interlayer film is 3.9. The gate capacitance $C_g$ is expressed as the following formula (9-8) which is a relational expression of the dielectric constant $\epsilon_{OX}$ of the gate oxide layer 310, the length l of the gate 210, the length R of one side of the first silicon pillar 810, and the film thickness $T_{ox}$ of the gate oxide layer 310, and the cross-sectional area S1 of the gate 210 is expressed as the following formula (9-9). Thus, the formulas (9-8) and (9-9) are assigned to the formula (9-3) to obtain the following conditional formula (9-10) representing a relationship between a film thickness $T_{gate1}$ of the gate 210, and the distance $T_{space1}$ between the gate 210 and the semiconductor substrate 100:

$$C_g = \frac{\epsilon_{ox} \cdot 4R \cdot l}{T_{ox}} \tag{9-8}$$

$$S1 = (R + 2T_{ox} + 2T_{gate1})^2 - (R + 2T_{ox})^2 \tag{9-9}$$

$$(R + 2T_{ox} + 2T_{gate1})^2 - (R + 2T_{ox})^2 < \frac{\epsilon_x \cdot 4Rl}{\epsilon_x \cdot T_{ox}} \cdot T_{space1} \tag{9-10}$$

If the conditional formula (9-10) is satisfied, the formula (9-1) is satisfied. Thus, the above values are assigned to the formula (9-10) to obtain the following formula (9-11), and then the following formula (9-12) is obtained from the formula (9-11) (unit in the formulas (9-11) and (9-12): μm):

$$2.0e6 \cdot T_{space1} > 4T_{gate1}^2 + 1.0e2T_{gate1} \Rightarrow C_{ov1} < C_g \quad (9\text{-}11)$$

$$2.0e6 \cdot T_{space1} >> 4T_{gate1}^2 + 1.0e2T_{gate1} \Rightarrow C_{ov1} << C_g \quad (9\text{-}12)$$

Figure 62:
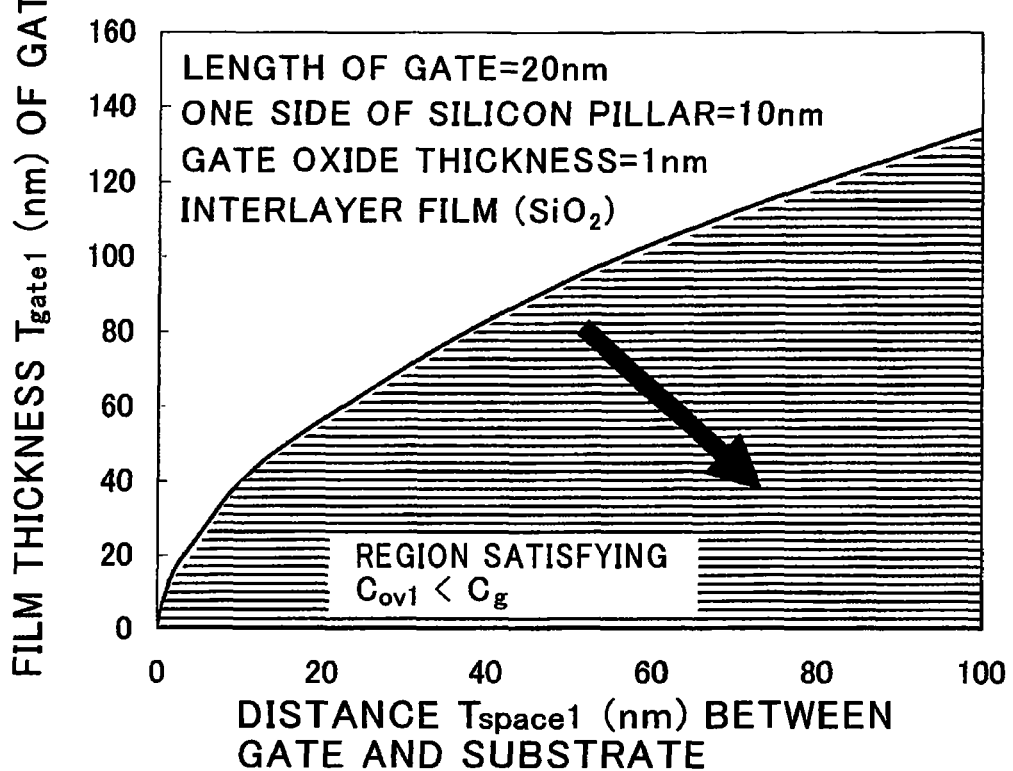
FIG. 62 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 57.

In FIG. 62, $C_{ov1}$ becomes less than $C_g$ in a region on the side of the arrowed direction.

Further, in order to reduce the parasitic capacitance in the ninth embodiment, it is desirable that a parasitic capacitance $C_{ov2}$ between the gate 210 and the second silicon pillar 820 is less than the gate capacitance $C_g$, as shown in the following formula (9-13):

$$C_{ov2} < C_g \quad (9\text{-}13)$$

Specifically, given that: the length of the gate 210 is 20 nm; one side of the first silicon pillar 810 is 10 nm; the film thickness $T_{ox}$ of the gate oxide layer 310 is 1 nm; and the interlayer film is made of $SiO_2$. A relationship of the capacitance $C_{ov2}$ between the gate 210 and the second silicon pillar 820, the dielectric constant $\epsilon_X$ of the interlayer film 610, a cross-sectional area S2 of the gate 210, and a distance $T_{space2}$ between the gate 210 and the second silicon pillar 820, is expressed as the following formula (9-14), and then the formula (9-14) is assigned to the formula (9-13) to obtain the following formula (9-15):

$$S2 < \frac{C_g}{\epsilon_x} T_{space2} \quad (9\text{-}14)$$

$$C_{ov2} = \frac{\epsilon_x S2}{T_{space2}} \quad (9\text{-}15)$$

The gate capacitance $C_g$ is expressed as the following formula (9-16) which is a relational expression of the dielectric constant $\epsilon_{OX}$ of the gate oxide layer 310, the length l of the gate 210, a peripheral length w of the first silicon pillar 810, and the film thickness $T_{ox}$ of the gate oxide layer 310, and the cross-sectional area S2 of the gate 210 is expressed as the following formula (9-17). Thus, the formulas (9-16) and (9-17) are assigned to the formula (9-13) to obtain the following conditional formula (9-18) representing a relationship between the cross-sectional area S2 of the gate 210, and the distance $T_{space2}$ between the gate 210 and the second silicon pillar 820:

$$C_g = \frac{\epsilon_{ox} \cdot 4R \cdot l}{T_{ox}} \quad (9\text{-}16)$$

$$S2 = (R + 2T_{ox} + 2T_{gate2})^2 - (R + 2T_{ox})^2 \quad (9\text{-}17)$$

$$(R + 2T_{ox} + 2T_{gate2})^2 - (R + 2T_{ox})^2 < \frac{\epsilon_x \cdot 4Rl}{\epsilon_x \cdot T_{ox}} \cdot T_{space2} \quad (9\text{-}18)$$

If the conditional formula (9-18) is satisfied, the formula (9-13) is satisfied. Thus, the above values are assigned to the formula (9-18) to obtain the following formula (9-19) (unit in the formulas (9-19): nm (FIG. 63):

$$800 \cdot T_{space2} > 4T_{gate2}^2 + 48T_{gate2} \Rightarrow C_{ov2} < C_g \quad (9\text{-}19)$$

Typically, the length of one side of the first silicon pillar 810 is set in the range of 0.25 nm to 25 μm, and the film thickness of the gate oxide layer 310 is set in the range of 0.5 to 100 nm. Further, the length of the gate 210 is set in the range of 5 nm to 10 μm, and the dielectric constant $\epsilon_X$ of the interlayer film is set in the range of 3.9 to 7.6. In this structure, conditions satisfying the formula (9-1) will be calculated. Given that: the peripheral length of the first silicon pillar 810 is 25 μm; the film thickness of the gate oxide layer 310 is 0.5 nm; the length of the gate 210 is 10 μm, and the dielectric constant $\epsilon_X$ of the interlayer film is 3.9. The gate capacitance $C_g$ is expressed as the following formula (9-20) which is a relational expression of the dielectric constant $\epsilon_{OX}$ of the gate oxide layer 310, the length l of the gate 210, the peripheral length w of the first silicon pillar 810, and the film thickness $T_{ox}$ of the gate oxide layer 310, and the cross-sectional area S2 of the gate 210 is expressed as the following formula (9-21). Thus, the formulas (9-20) and (9-21) are assigned to the formula (9-13) to obtain the following conditional formula (9-22) representing a relationship between the cross-sectional area S2 of the gate 210, and the distance $T_{space2}$ between the gate 210 and the second silicon pillar 820:

$$C_g = \frac{\epsilon_{ox} \cdot 4R \cdot l}{T_{ox}} \quad (9\text{-}20)$$

$$S2 = (R + 2T_{ox} + 2T_{gate2})^2 - (R + 2T_{ox})^2 \quad (9\text{-}21)$$

$$(R + 2T_{ox} + 2T_{gate2})^2 - (R + 2T_{ox})^2 < \frac{\epsilon_x \cdot 4Rl}{\epsilon_x \cdot T_{ox}} \cdot T_{space2} \quad (9\text{-}22)$$

If the conditional formula (9-22) is satisfied, the formula (9-13) is satisfied. Thus, the above values are assigned to the formula (9-22) to obtain the following formula (9-23), and then the following formula (9-24) is obtained from the formula (9-23) (unit in the formulas (9-23) and (9-24): μm):

$$2.0e6 \cdot T_{space2} > 4T_{gate2}^2 + 1.0e2T_{gate2} \Rightarrow C_{ov1} < C_g \quad (9\text{-}23)$$

$$2.0e6 \cdot T_{space2} >> 4T_{gate2}^2 + 1.0e2T_{gate2} \Rightarrow C_{ov2} << C_g \quad (9\text{-}24)$$

Figure 63:
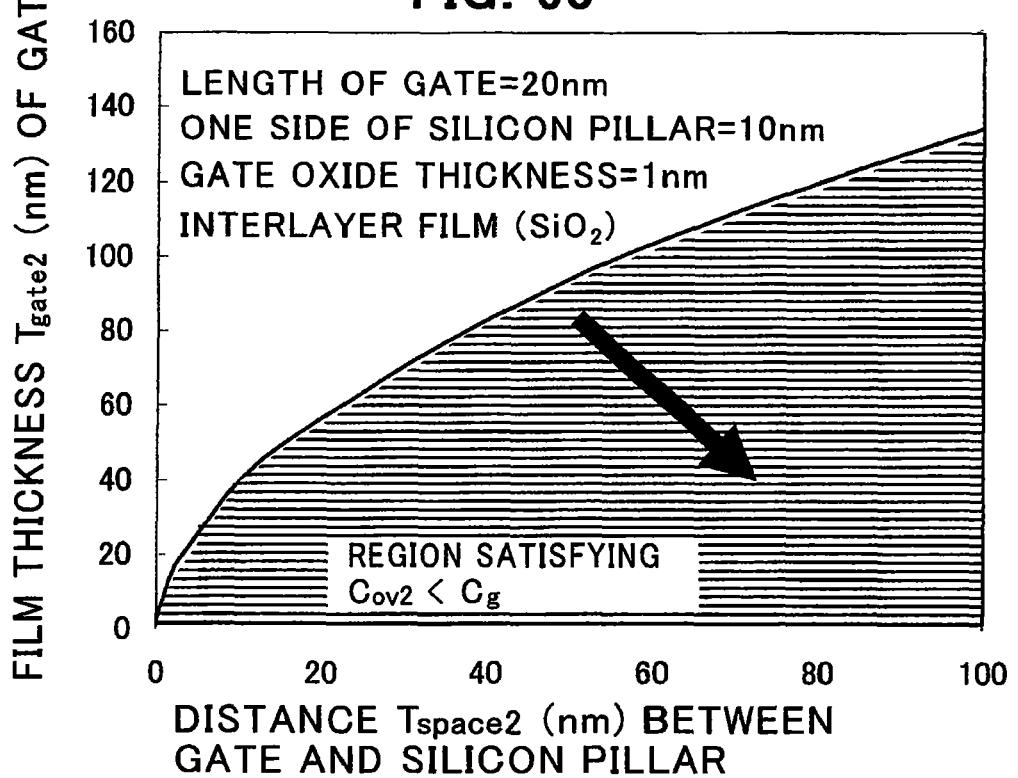
FIG. 63 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 57.

In FIG. 63, $C_{ov2}$ becomes less than $C_g$ in a region on the side of the arrowed direction.

Tenth Embodiment

Semiconductor Device

Figure 64:
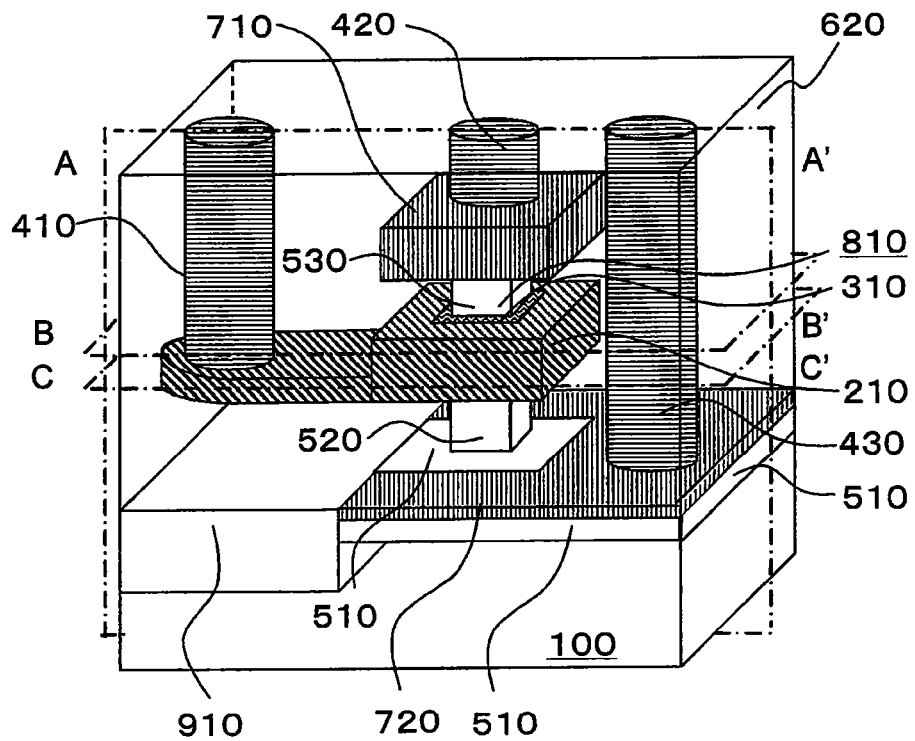
FIG. 64 is a bird's-eye view showing a semiconductor device according to a tenth embodiment of the present invention.
Figure 65:
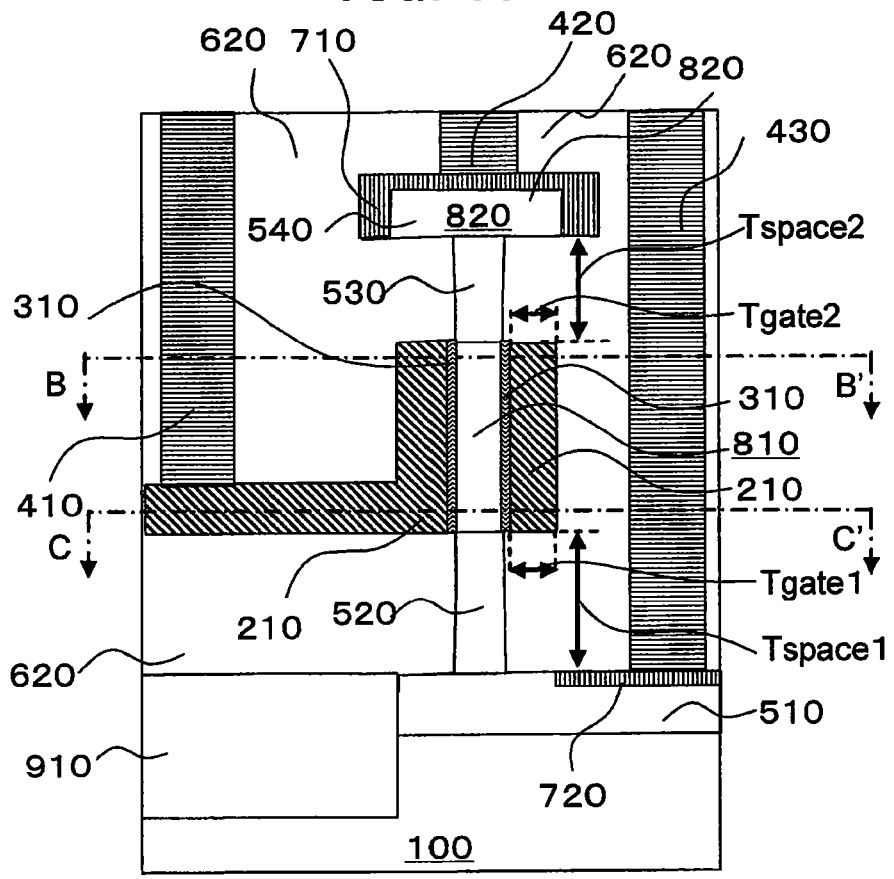
FIG. 65 is a sectional view of the semiconductor device, taken along the line A-A' in FIG. 64.
Figure 66:
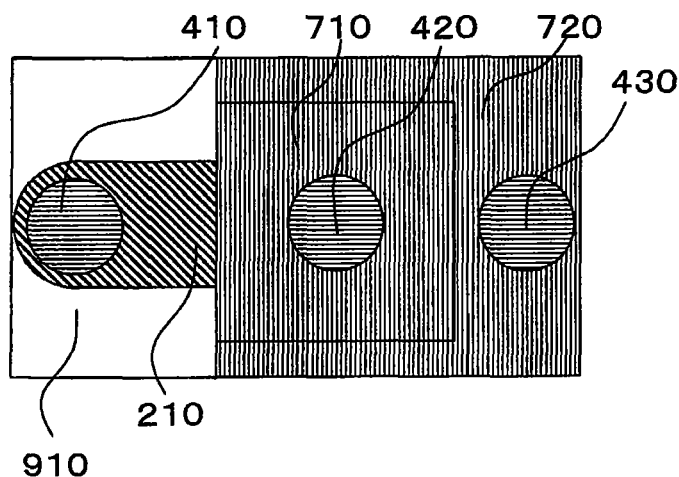
FIG. 66 is a top view of the semiconductor device in FIG. 64.
Figure 67:
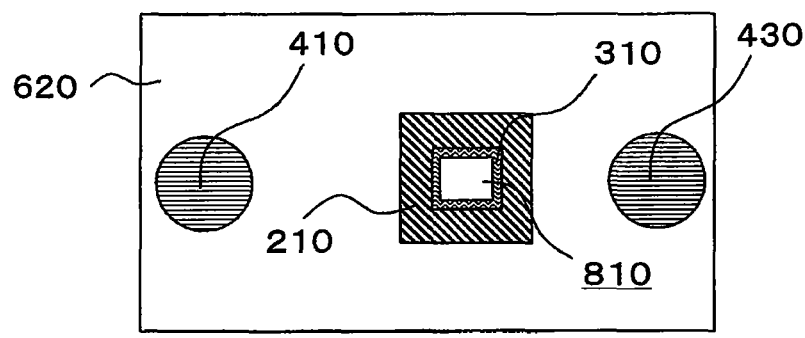
FIG. 67 is a sectional view of the semiconductor device, taken along the line B-B' in FIG. 65.
Figure 68:
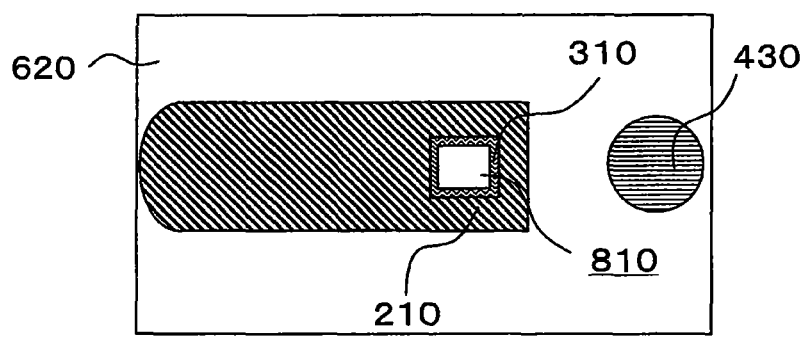
FIG. 68 is a sectional view of the semiconductor device, taken along the line C-C' in FIG. 65.

FIG. 64 is a schematic bird's-eye view showing a transistor in a semiconductor device according to the tenth embodiment of the present invention, wherein the semiconductor device according to the tenth embodiment is the same as that in the ninth embodiment, except that the interlayer film 610 made of $SiO_2$ is replaced by an interlayer film 620 made of SiN. FIG. 65 is a schematic sectional view taken along the cutting-plane line A-A' in FIG. 64, and FIG. 66 is a top view of the transistor in FIG. 64. FIG. 67 is a schematic sectional view taken along the cutting-plane line B-B' in FIG. 65, and FIG. 68 is a schematic sectional view taken along the cutting-plane line C-C' in FIG. 65. As with the ninth embodiment, in order to reduce a parasitic capacitance in the tenth embodiment, it is desirable that the parasitic capacitance $C_{ov1}$ between the gate 210 and the semiconductor substrate 100 is less than the gate capacitance $C_g$, as shown in the following formula (10-1):

$$C_{ov1} < C_g \quad (10\text{-}1)$$

Specifically, given that: the length of the gate 210 is 20 nm; the length of one side of the first silicon pillar 810 is 10 nm; and the film thickness $T_{ox}$ of the gate oxide layer 310 is 1.0 nm (EOT). Based on the formula (9-6) in the ninth embodiment, the following conditional formula (10-2) representing a relationship between the film thickness $T_{gate1}$ of the gate 210, and the distance $T_{space1}$ between the gate 210 and the semiconductor substrate 100, is obtained (unit in the formulas (10-2): nm) (FIG. 69):

$$4.1e2 \cdot T_{space1} > (2T_{gate1}+12)^2 - 1.4e2 \Rightarrow C_{ov1} < C_g \qquad (10\text{-}2)$$

Figure 69:
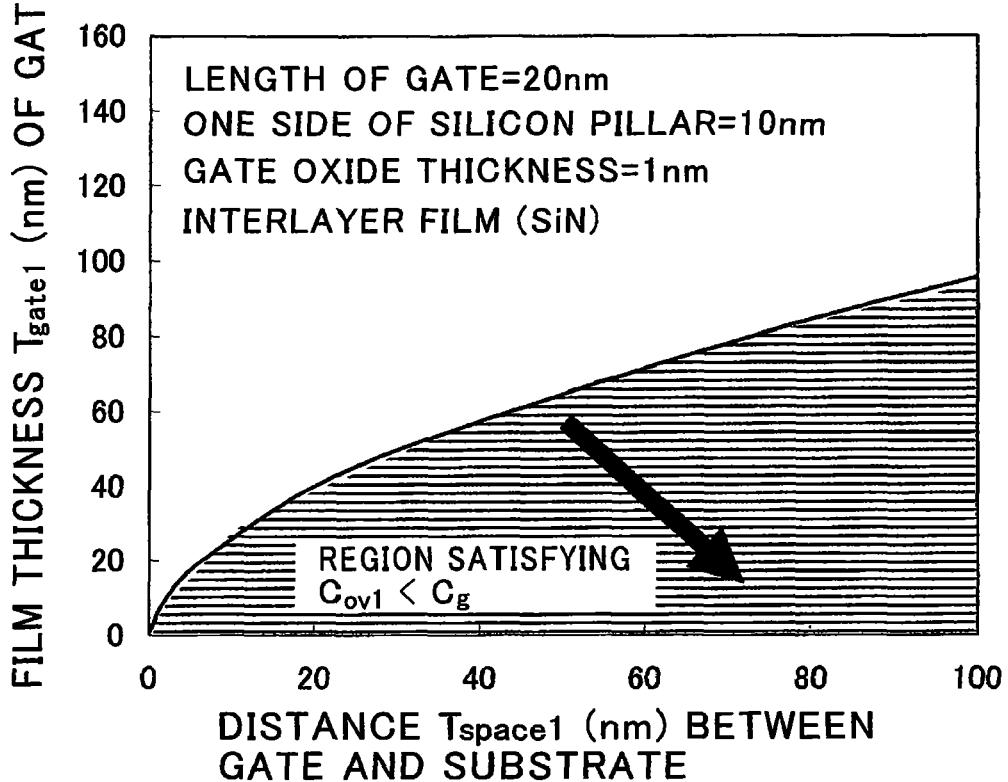
FIG. 69 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 64 where an interlayer film is made of SiN.

In FIG. 69, $C_{ov1}$ becomes less than $C_g$ in a region on the side of the arrowed direction.

Further, as with the ninth embodiment, in order to reduce the parasitic capacitance in the tenth embodiment where the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (10-3):

$$C_{ov2} < C_g \qquad (10\text{-}3)$$

Based on the formula (9-18) in the ninth embodiment, the following conditional formula (10-4) representing a relationship between the film thickness $T_{gate2}$ of the gate 210, and the distance $T_{space2}$ between the gate 210 and the second silicon pillar 820, is obtained (unit in the formula (10-4): nm) (FIG. 70):

$$4.1e2 \cdot T_{space2} > (2T_{gate2}+12)^2 - 1.4e2 \Rightarrow C_{ov2} < C_g \qquad (10\text{-}4)$$

Figure 70:
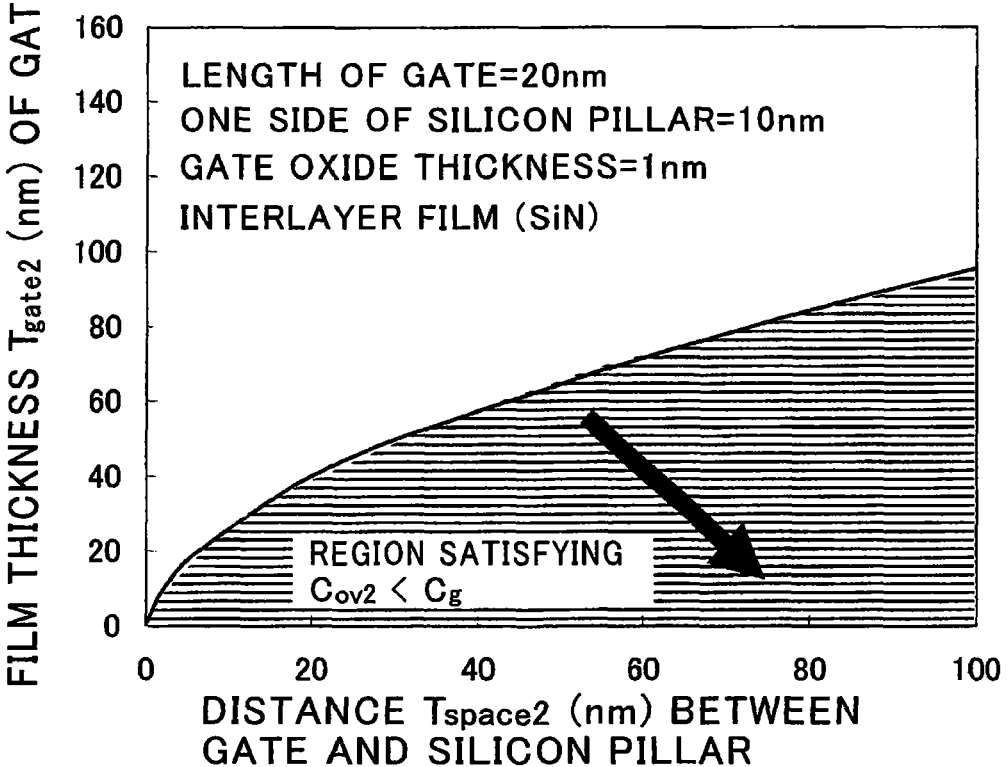
FIG. 70 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 64 where an interlayer film is made of SiN.

In FIG. 70, $C_{ov2}$ becomes less than $C_g$ in a region on the side of the arrowed direction.

Eleventh Embodiment

Semiconductor Device

Figure 71:
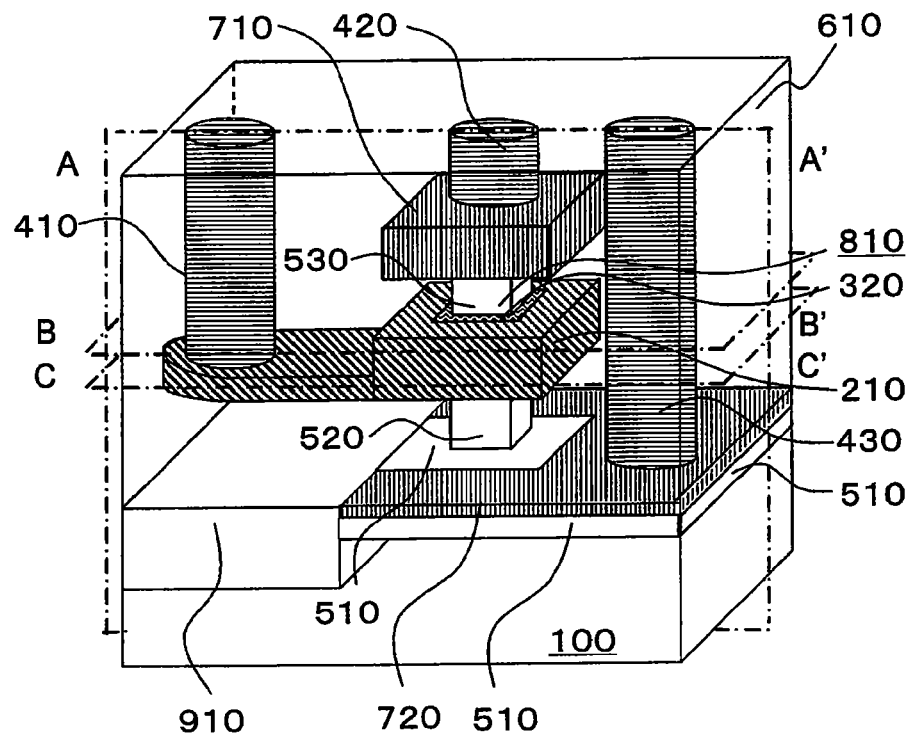
FIG. 71 is a bird's-eye view showing a semiconductor device according to an eleventh embodiment of the present invention.
Figure 72:
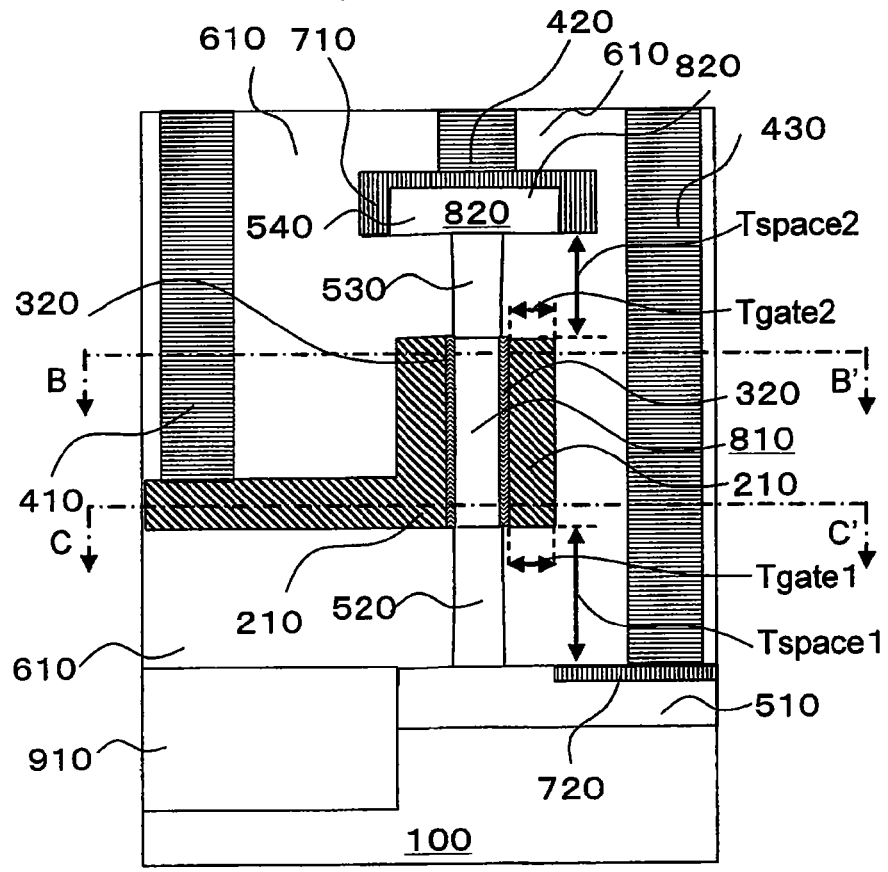
FIG. 72 is a sectional view of the semiconductor device, taken along the line A-A' in FIG. 71.
Figure 73:
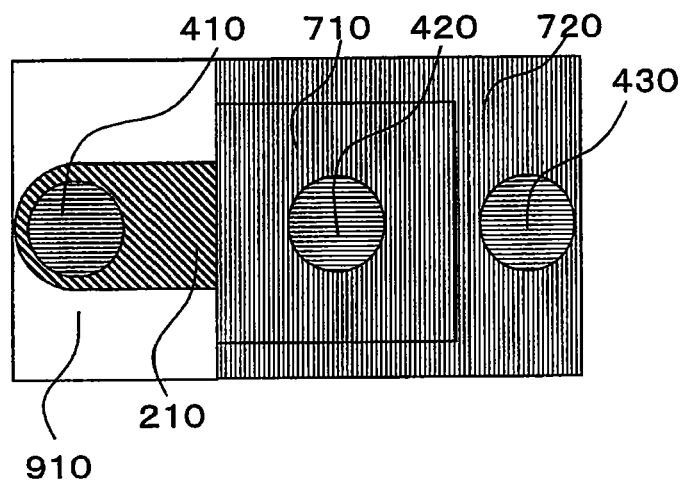
FIG. 73 is a top view of the semiconductor device in FIG. 71.
Figure 74:
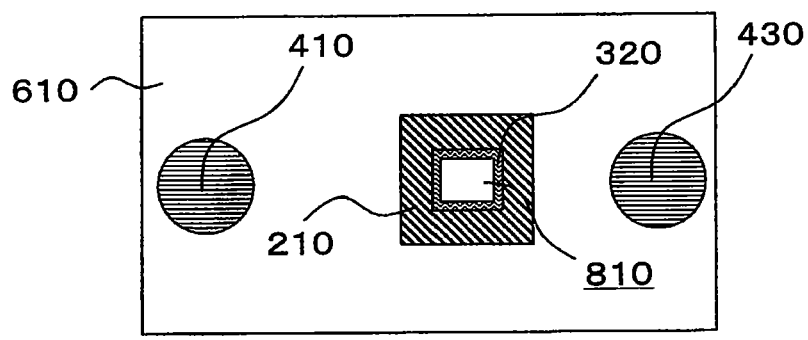
FIG. 74 is a sectional view of the semiconductor device, taken along the line B-B' in FIG. 72.
Figure 75:
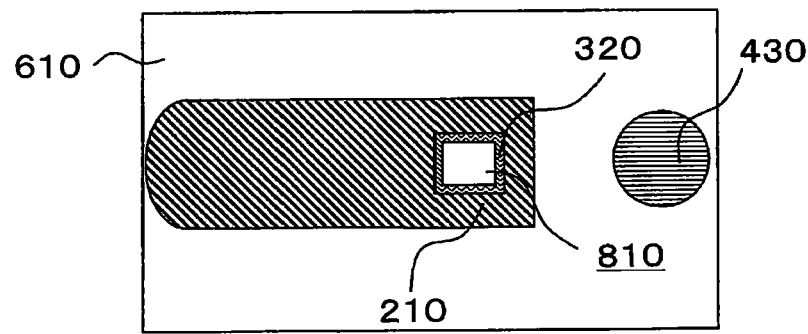
FIG. 75 is a sectional view of the semiconductor device, taken along the line C-C' in FIG. 72.

FIG. 71 is a schematic bird's-eye view showing a transistor in a semiconductor device according to the eleventh embodiment of the present invention, wherein the semiconductor device according to the eleventh embodiment is the same as that in the ninth embodiment, except that the gate oxide layer 310 made of $SiO_2$ is replaced by a gate oxide layer 320 made of $HfO_2$. FIG. 72 is a schematic sectional view taken along the cutting-plane line A-A' in FIG. 71, and FIG. 73 is a top view of the transistor in FIG. 71. FIG. 74 is a schematic sectional view taken along the cutting-plane line B-B' in FIG. 72, and FIG. 75 is a schematic sectional view taken along the cutting-plane line C-C' in FIG. 72. As with the ninth embodiment, in order to reduce a parasitic capacitance in the eleventh embodiment, it is desirable that the parasitic capacitance $C_{ov1}$ between the gate 210 and the semiconductor substrate 100 is less than the gate capacitance $C_g$, as shown in the following formula (11-1):

$$C_{ov1} < C_g \qquad (11\text{-}1)$$

Specifically, given that: the length of the gate 210 is 20 nm; the length of one side of the first silicon pillar 810 is 10 nm; and the film thickness $T_{ox}$ of the gate oxide layer 320 made of $HfO_2$ is 1.3 nm (EOT). Based on the formula (9-6) in the ninth embodiment, the following conditional formula (11-2) representing a relationship between the film thickness $T_{gate1}$ of the gate 210, and the distance $T_{space1}$ between the gate 210 and the semiconductor substrate 100, is obtained (unit in the formulas (11-2): nm) (FIG. 76):

$$5.3e2 \cdot T_{space1} > (2T_{gate1}+20)^2 - 4.2e2 \Rightarrow C_{ov1} < C_g \qquad (11\text{-}2)$$

Figure 76:
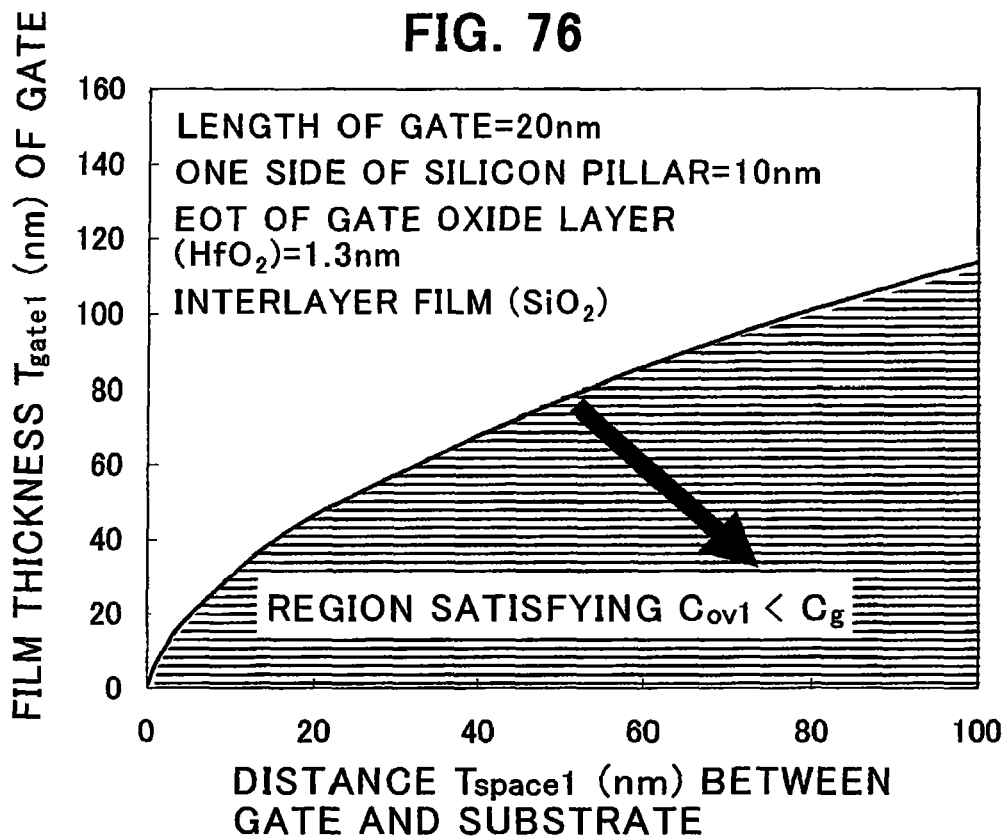
FIG. 76 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 71 where a gate oxide layer is made of $HfO_2$.

In FIG. 76, $C_{ov1}$ becomes less than $C_g$ in a region on the side of the arrowed direction.

Further, as with the ninth embodiment, in order to reduce the parasitic capacitance in the eleventh embodiment where the gate oxide layer 320 is made of $HfO_2$, instead of $SiO_2$, it is desirable that the parasitic capacitance $C_{ov2}$ between the gate 210 and the second silicon pillar 820 is less than the gate capacitance $C_g$, as shown in the following formula (11-3):

$$C_{ov2} < C_g \qquad (11\text{-}3)$$

Based on the formula (9-18) in the ninth embodiment, the following conditional formula (11-4) representing a relationship between the film thickness $T_{gate2}$ of the gate 210, and the distance $T_{space2}$ between the gate 210 and the second silicon pillar 820, is obtained (unit in the formula (11-4): nm) (FIG. 77):

$$5.3e2 \cdot T_{space2} > (2T_{gate2}+20)^2 - 4.2e2 \Rightarrow C_{ov2} < C_g$$

Figure 77:
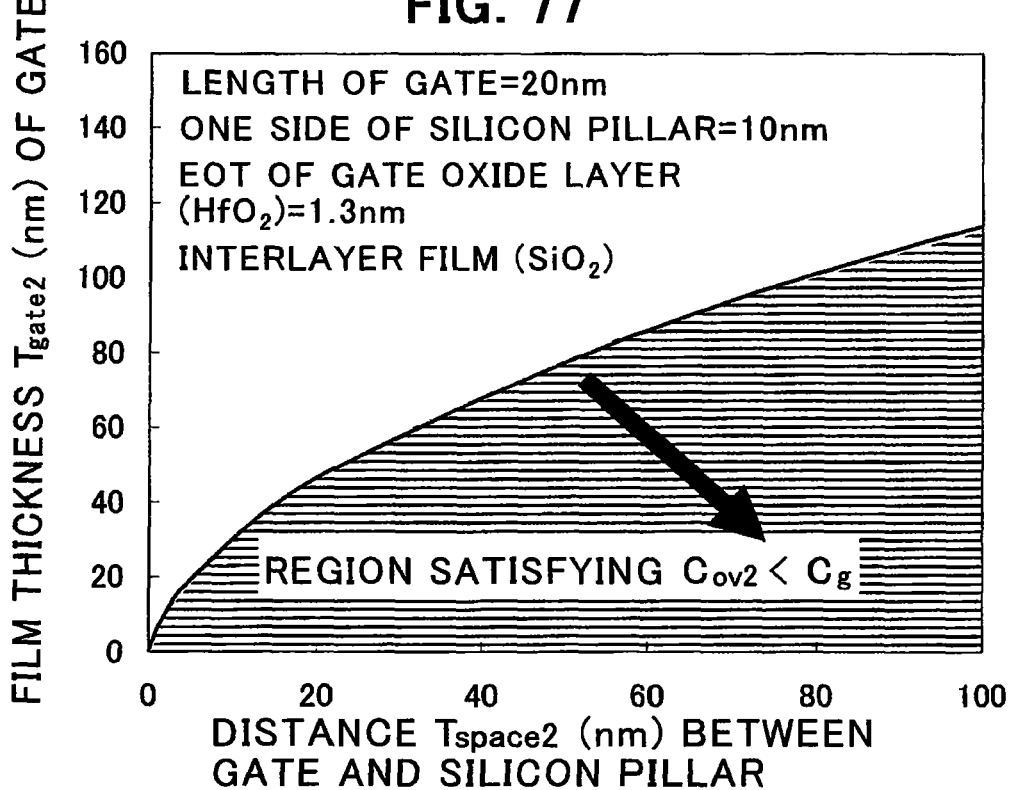
FIG. 77 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 71 where a gate oxide layer is made of $HfO_2$.

In FIG. 77, $C_{ov2}$ becomes less than $C_g$ in a region on the side of the arrowed direction.

Twelfth Embodiment

Semiconductor Device

Figure 78:
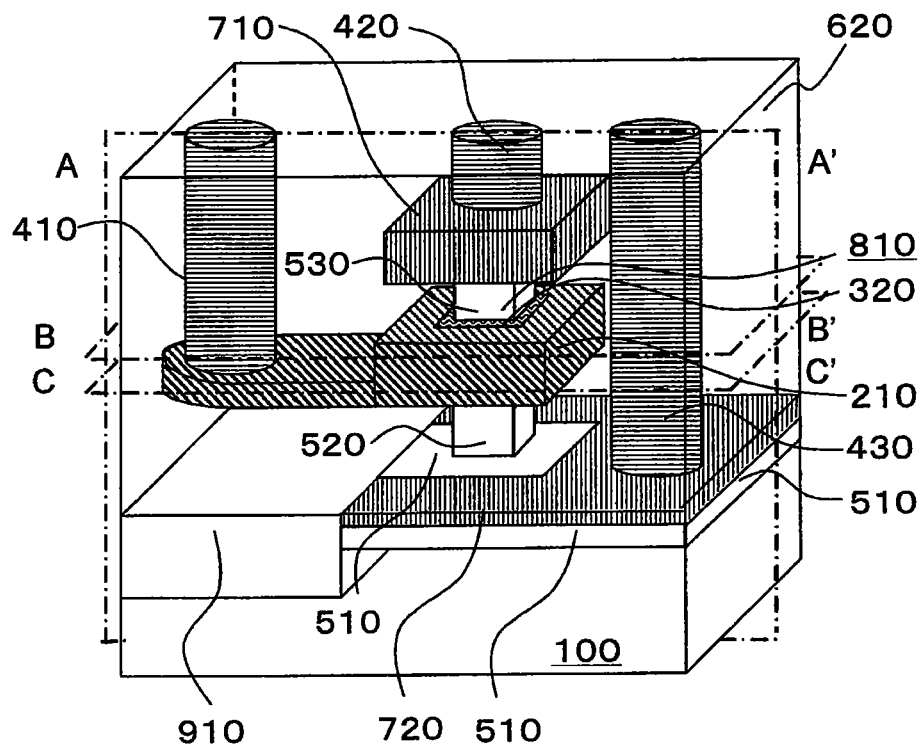
FIG. 78 is a bird's-eye view showing a semiconductor device according to a twelfth embodiment of the present invention.
Figure 79:
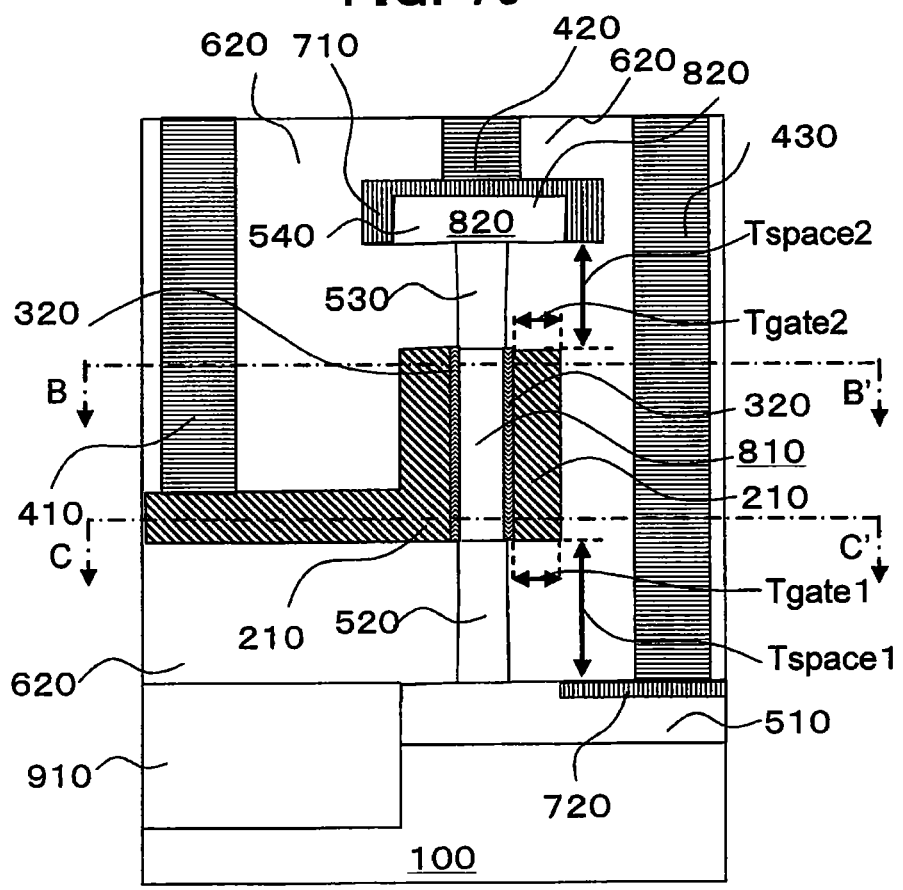
FIG. 79 is a sectional view of the semiconductor device, taken along the line A-A' in FIG. 78.
Figure 80:
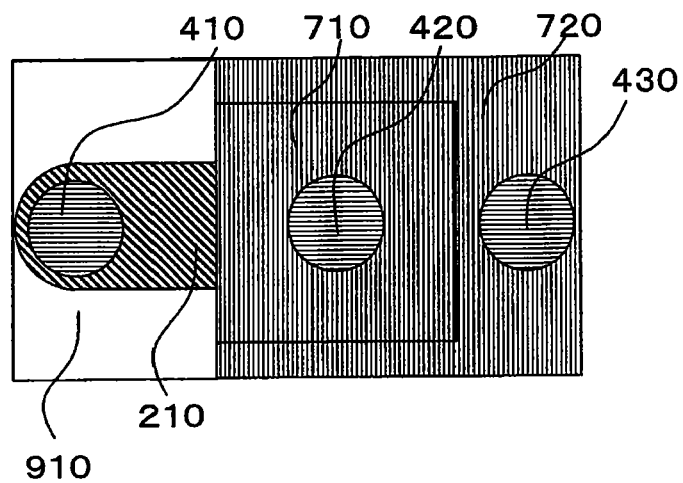
FIG. 80 is a top view of the semiconductor device in FIG. 78.
Figure 81:
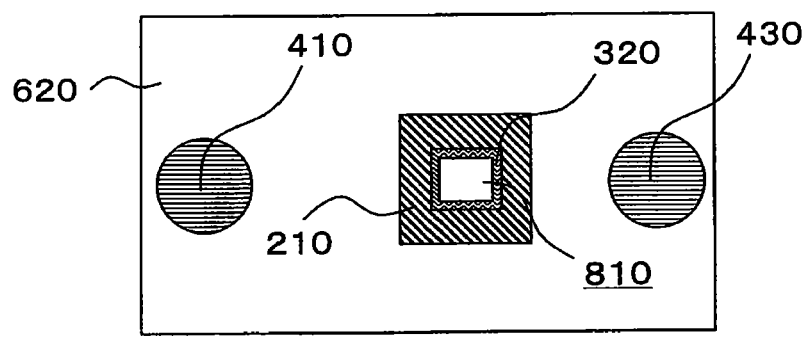
FIG. 81 is a sectional view of the semiconductor device, taken along the line B-B' in FIG. 79.
Figure 82:
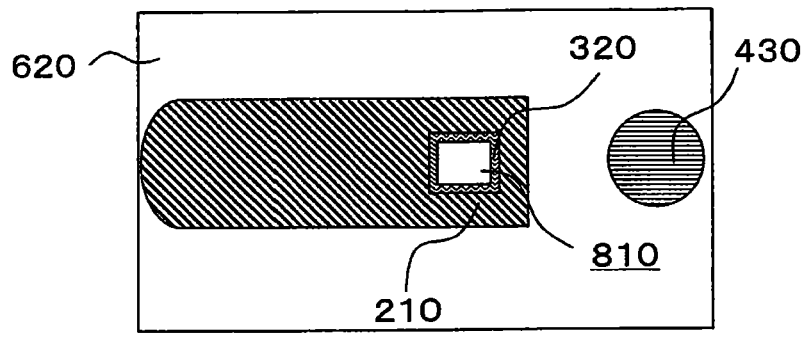
FIG. 82 is a sectional view of the semiconductor device, taken along the line C-C' in FIG. 79.

FIG. 78 is a schematic bird's-eye view showing a transistor in a semiconductor device according to the twelfth embodiment of the present invention, wherein the semiconductor device according to the twelfth embodiment is the same as that in the ninth embodiment, except that the gate oxide layer 310 made of $SiO_2$ is replaced by a gate oxide layer 320 made of $HfO_2$, and the interlayer film 610 made of $SiO_2$ is replaced by an interlayer film 620 made of SiN. FIG. 79 is a schematic sectional view taken along the cutting-plane line A-A' in FIG. 78, and FIG. 80 is a top view of the transistor in FIG. 78. FIG. 81 is a schematic sectional view taken along the cutting-plane line B-B' in FIG. 79, and FIG. 82 is a schematic sectional view taken along the cutting-plane line C-C' in FIG. 79. As with the ninth embodiment, in order to reduce a parasitic capacitance in the twelfth embodiment, it is desirable that the parasitic capacitance $C_{ove}$ between the gate 210 and the semiconductor substrate 100 is less than the gate capacitance $C_g$, as shown in the following formula (12-1):

$$C_{ov1} < C_g \qquad (12\text{-}1)$$

Specifically, given that: the length of the gate 210 is 20 nm; the length of one side of the first silicon pillar 810 is 10 nm; and the film thickness $T_{ox}$ of the gate oxide layer 320 made of $HfO_2$ is 1.3 nm (EOT). Based on the formula (9-6) in the ninth embodiment, the following conditional formula (12-2) representing a relationship between the film thickness $T_{gate1}$ of the gate 210, and the distance $T_{space1}$ between the gate 210 and the semiconductor substrate 100, is obtained (unit in the formulas (12-2): nm) (FIG. 83):

$$2.7e2 \cdot T_{space1} > (2T_{gate1}+20)^2 - 4.2e2 \Rightarrow C_{ov1} < C_g \qquad (12\text{-}2)$$

Figure 83:
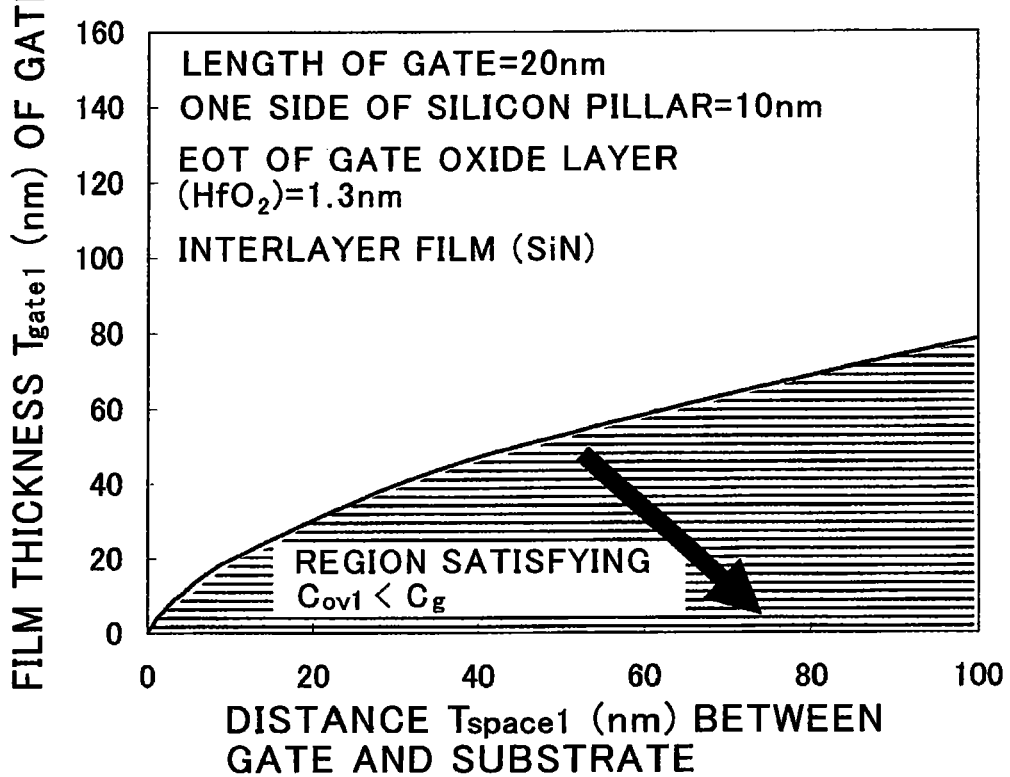
FIG. 83 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 78 where a gate oxide layer is made of $HfO_2$ and an interlayer film is made of SiN.

In FIG. 83, $C_{ov1}$ becomes less than $C_g$ in a region on the side of the arrowed direction.

Further, as with the ninth embodiment, in order to reduce the parasitic capacitance in the twelfth embodiment where the gate oxide layer 320 is made of $HfO_2$, instead of $SiO_2$, and the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (12-3):

$$C_{ov2} < C_g \qquad (12\text{-}3)$$

Based on the formula (9-18) in the ninth embodiment, the following conditional formula (12-4) representing a relationship between the film thickness $T_{gate2}$ of the gate 210, and the distance $T_{space2}$ between the gate 210 and the second silicon pillar 820, is obtained (unit in the formula (12-4): nm) (FIG. 84):

$$2.7e2 \cdot T_{space2} > (2T_{gate2}+20)^2 - 4.2e2 \Rightarrow C_{ov2} < C_g$$

Figure 84:
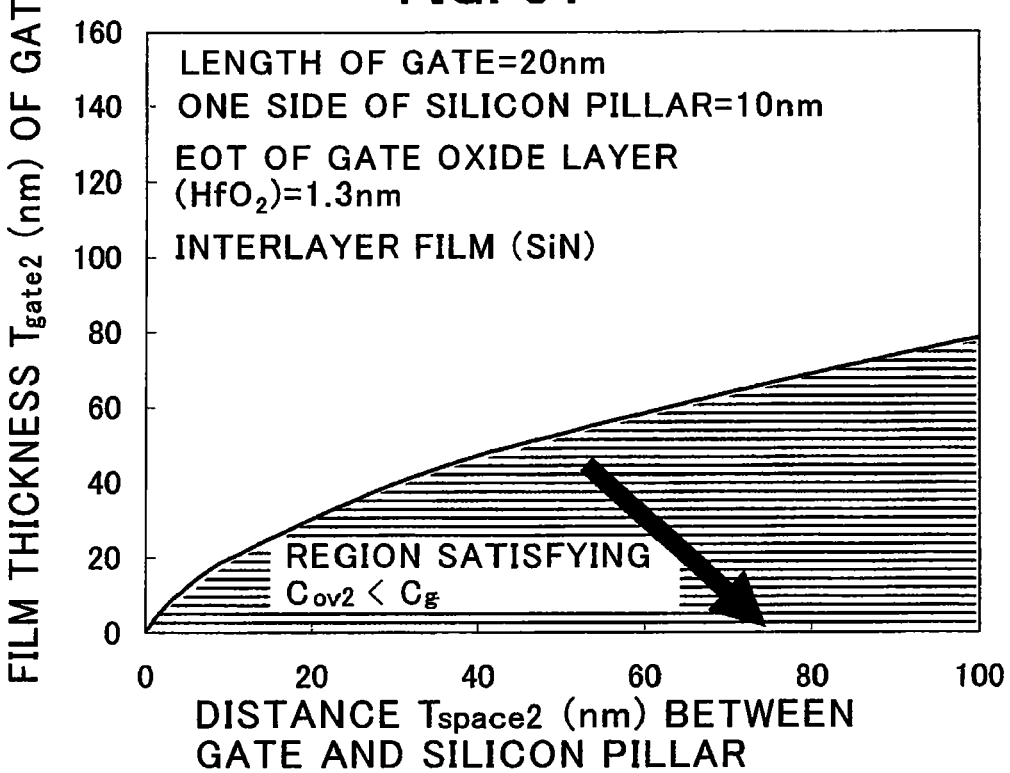
FIG. 84 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 78 where a gate oxide layer is made of $HfO_2$, and an interlayer film is made of SiN.

In FIG. 84, $C_{ov2}$ becomes less than $C_g$ in a region on the side of the arrowed direction.

Thirteenth Embodiment

Semiconductor Device

Each of thirteenth to sixteenth embodiments of the present invention is an example where a first silicon pillar 810 has a rectangular shape in cross-section.

In the thirteenth embodiment, an after-mentioned first insulating body 310 (gate oxide layer) is made of $SiO_2$, and an after-mentioned second insulating body 610 (interlayer film) is made of $SiO_2$.

Figure 85:
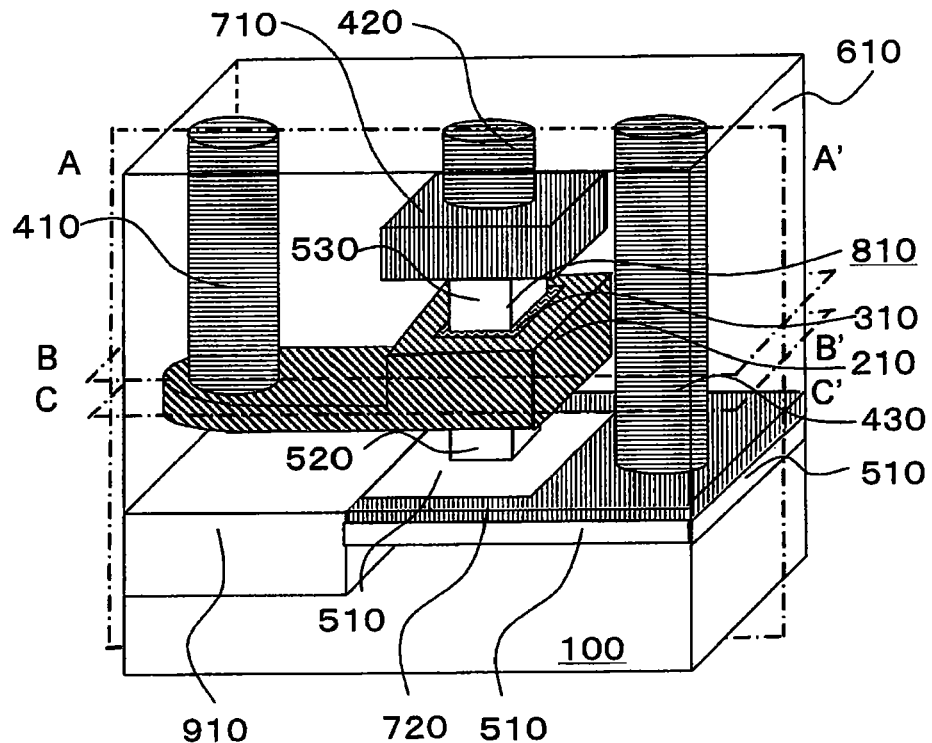
FIG. 85 is a bird's-eye view showing a semiconductor device according to a thirteenth embodiment of the present invention.
Figure 86:
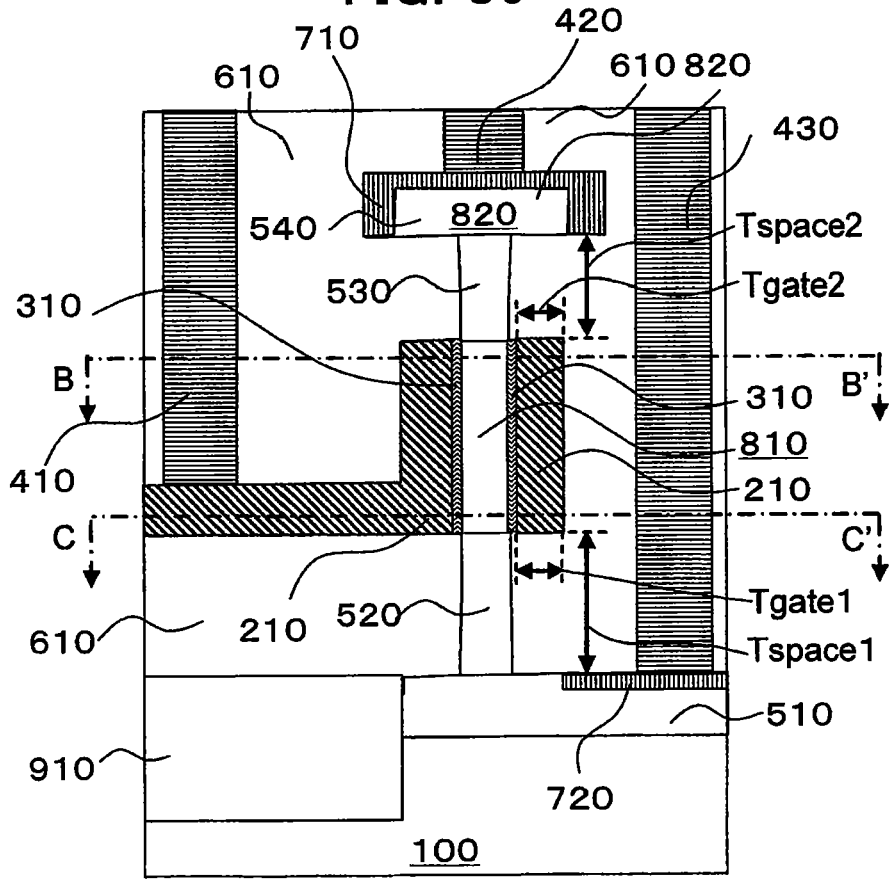
FIG. 86 is a sectional view of the semiconductor device, taken along the line A-A' in FIG. 85.
Figure 87:
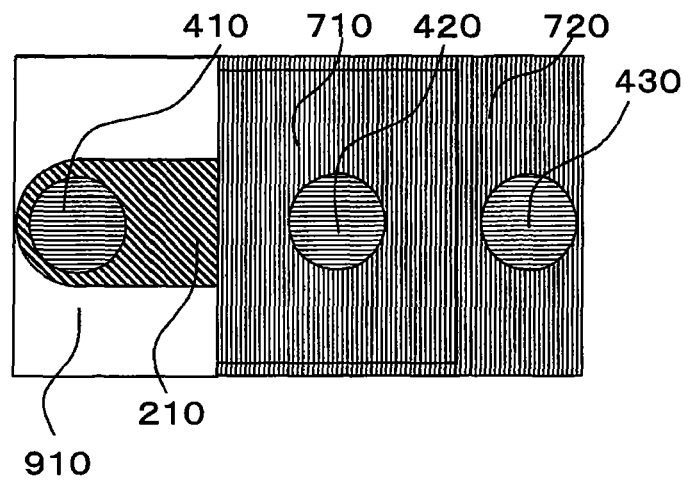
FIG. 87 is a top view of the semiconductor device in FIG. 85.
Figure 88:
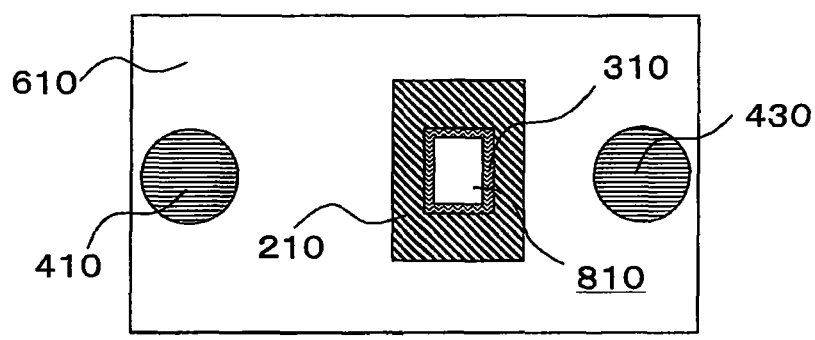
FIG. 88 is a sectional view of the semiconductor device, taken along the line B-B' in FIG. 86.
Figure 89:
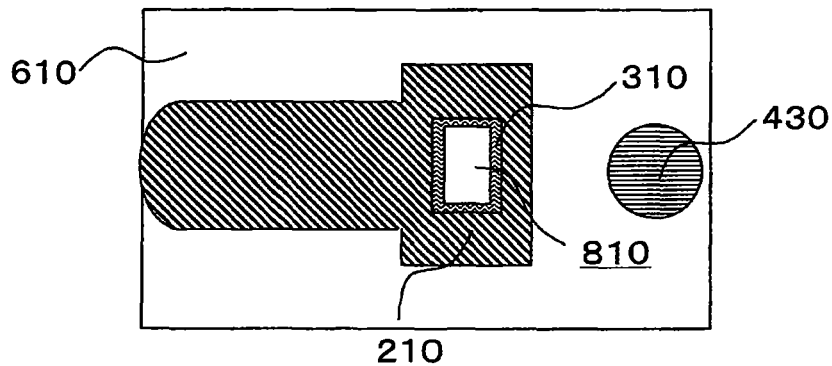
FIG. 89 is a sectional view of the semiconductor device, taken along the line C-C' in FIG. 86.

FIG. 85 is a schematic bird's-eye view showing a transistor in a semiconductor device according to the thirteenth embodiment of the present invention. FIG. 86 is a schematic sectional view taken along the cutting-plane line A-A' in FIG. 85, and FIG. 87 is a top view of the transistor in FIG. 85. FIG. 88 is a schematic sectional view taken along the cutting-plane line B-B' in FIG. 86, and FIG. 89 is a schematic sectional view taken along the cutting-plane line C-C' in FIG. 86. The semiconductor device according to the thirteenth embodiment comprises a cross-sectionally rectangular-shaped first silicon pillar 810 formed on a first-conductive type semiconductor substrate 100, a first insulating body 310 surrounding a part of a surface of the first silicon pillar 810, a gate 210 surrounding the first insulating body 310, and a second silicon pillar 820 formed on a top of the first silicon pillar 810. The gate 210 is disposed to be separated from the semiconductor substrate 100 by a second insulating body 610. Further, the gate 210 is disposed to be separated from the second silicon pillar 820 by the second insulating body 610.

The semiconductor device further comprises a second-conductive type high-concentration impurity region 520 formed in a part of the first silicon pillar 810, a second-conductive type high-concentration impurity region 530 formed in a part of the first silicon pillar 810, a second-conductive type high-concentration impurity region 510 formed in a part of the semiconductor substrate 100, a second-conductive type high-concentration impurity region 540 formed in a part of the second silicon pillar 820, a silicide region 720 formed in a part of the second-conductive type high-concentration impurity region 510, a silicide region 710 formed in the second-conductive type high-concentration impurity region 540, a contact 430 formed on the silicide region 720, a contact 420 formed on the silicide region 710, a contact 410 formed on the gate 210, and an element isolation region 910 formed in the semiconductor substrate 100.

In order to reduce a parasitic capacitance in the thirteenth embodiment, it is desirable that a parasitic capacitance $C_{O31}$ between the gate 210 and the semiconductor substrate 100 is less than a gate capacitance $C_g$, as shown in the following formula (13-1):

$$C_{ov1} < C_g \quad (13\text{-}1)$$

Specifically, given that: a length of the gate 210 is 20 nm; a short side and a long side of the first silicon pillar 810 are 10 nm and 20 nm, respectively; a film thickness $T_{ox}$ of the gate oxide layer 310 is 1 nm; and the interlayer film is made of $SiO_2$. A relationship of the capacitance $C_{ov1}$ between the gate 210 and the semiconductor substrate 100, a dielectric constant $\epsilon_X$ of the interlayer film 610, a cross-sectional area S1 of the gate 210, and a distance $T_{space1}$ between the gate 210 and the semiconductor substrate 100, is expressed as the following formula (13-2), and then the formula (13-2) is assigned to the formula (13-1) to obtain the following formula (13-3):

$$S1 < \frac{C_g}{\epsilon_x} T_{space1} \quad (13\text{-}2)$$

$$C_{ov1} = \frac{\epsilon_x S1}{T_{space1}} \quad (13\text{-}3)$$

The gate capacitance $C_g$ is expressed as the following formula (13-4) which is a relational expression of a dielectric constant $\epsilon_{OX}$ of the gate oxide layer 310, the length l of the gate 210, respective lengths R, 2R of the short and long sides of the first silicon pillar 810, and the film thickness $T_{ox}$ of the gate oxide layer 310, and the cross-sectional area S1 of the gate 210 is expressed as the following formula (13-5). Thus, the formulas (13-4) and (13-5) are assigned to the formula (13-1) to obtain the following conditional formula (13-6) representing a relationship between the cross-sectional area S1 of the gate 210, and the distance $T_{space1}$ between the gate 210 and the semiconductor substrate 100:

$$C_g = \frac{\epsilon_{ox} \cdot 6R \cdot l}{T_{ox}} \quad (13\text{-}4)$$

$$S1 = \quad (13\text{-}5)$$
$$(R + 2T_{ox} + 2T_{gate1})(2R + 2T_{ox} + 2T_{gate1}) - (R + 2T_{ox})(2R + 2T_{ox})$$

$$(R + 2T_{ox} + 2T_{gate1})(2R + 2T_{ox} + 2T_{gate1}) - (R + 2T_{ox})(2R + 2T_{ox}) < \quad (13\text{-}6)$$
$$\frac{\epsilon_{ox} \cdot 6Rl}{\epsilon_x \cdot T_{ox}} \cdot T_{space1}$$

If the conditional formula (13-6) is satisfied, the formula (13-1) is satisfied. Thus, the above values are assigned to the formula (13-6) to obtain the following formula (13-7) (unit in the formula (13-7): nm) (FIG. 90):

$$1.2e3 \cdot T_{space1} > 4T_{gate1}^2 + 68T_{gate1} \Rightarrow C_{ov1} < C_g \quad (13\text{-}7)$$

Typically, the length of one side of the first silicon pillar 810 is set in the range of 0.25 nm to 25 μm, and the film thickness of the gate oxide layer 310 is set in the range of 0.5 to 100 nm. Further, the length of the gate 210 is set in the range of 5 nm to 10 μm, and the dielectric constant $\epsilon_X$ of the interlayer film is set in the range of 3.9 to 7.6. In this structure, conditions satisfying the formula (13-1) will be calculated. Given that: the length R of the short side of the first silicon pillar 810 is 25 μm; the film thickness of the gate oxide layer 310 is 0.5 nm; the length of the gate 210 is 10 μm, and the dielectric constant $\epsilon_X$ of the interlayer film is 3.9. The gate capacitance $C_g$ is expressed as the following formula (13-8) which is a relational expression of the dielectric constant $\epsilon_{OX}$ of the gate oxide layer 310, the length l of the gate 210, the length R of the short side of the first silicon pillar 810, and the film thickness $T_{ox}$ of the gate oxide layer 310, and the cross-sectional area S1 of the gate 210 is expressed as the following formula (13-9). Thus, the formulas (13-8) and (13-9) are assigned to the formula (13-3) to obtain the following conditional formula (13-10) representing a relationship between a film thickness $T_{gate1}$ of the gate 210, and the distance $T_{space1}$ between the gate 210 and the semiconductor substrate 100:

$$C_g = \frac{\epsilon_{ox} \cdot 6R \cdot l}{T_{ox}} \quad (13\text{-}8)$$

$$S1 = (R + 2T_{ox} + 2T_{gate1})(2R + 2T_{ox} + 2T_{gate1}) - \quad (13\text{-}9)$$
$$(R + 2T_{ox})(2R + 2T_{ox})$$

-continued $$(R + 2T_{ox} + 2T_{gate1})(2R + 2T_{ox} + 2T_{gate1}) - \qquad (13\text{-}10)$$
$$(R + 2T_{ox})(2R + 2T_{ox}) < \frac{\varepsilon_{ox} \cdot 6Rl}{\varepsilon_x \cdot T_{ox}} \cdot T_{space1}$$

If the conditional formula (13-10) is satisfied, the formula (13-1) is satisfied. Thus, the above values are assigned to the formula (13-10) to obtain the following formula (13-11), and then the following formula (13-12) is obtained from the formula (13-11) (unit in the formulas (13-11) and (13-12): μm):

$$3.0e6 \cdot T_{space1} > 4T_{gate1}^2 + 1.5e2T_{gate1} \Rightarrow C_{ov1} < C_g \qquad (13\text{-}11)$$

$$3.0e6 \cdot T_{space1} >> 4T_{gate1}^2 + 1.5e2T_{gate1} \Rightarrow C_{ov1} << C_g \qquad (13\text{-}12)$$

Figure 90:
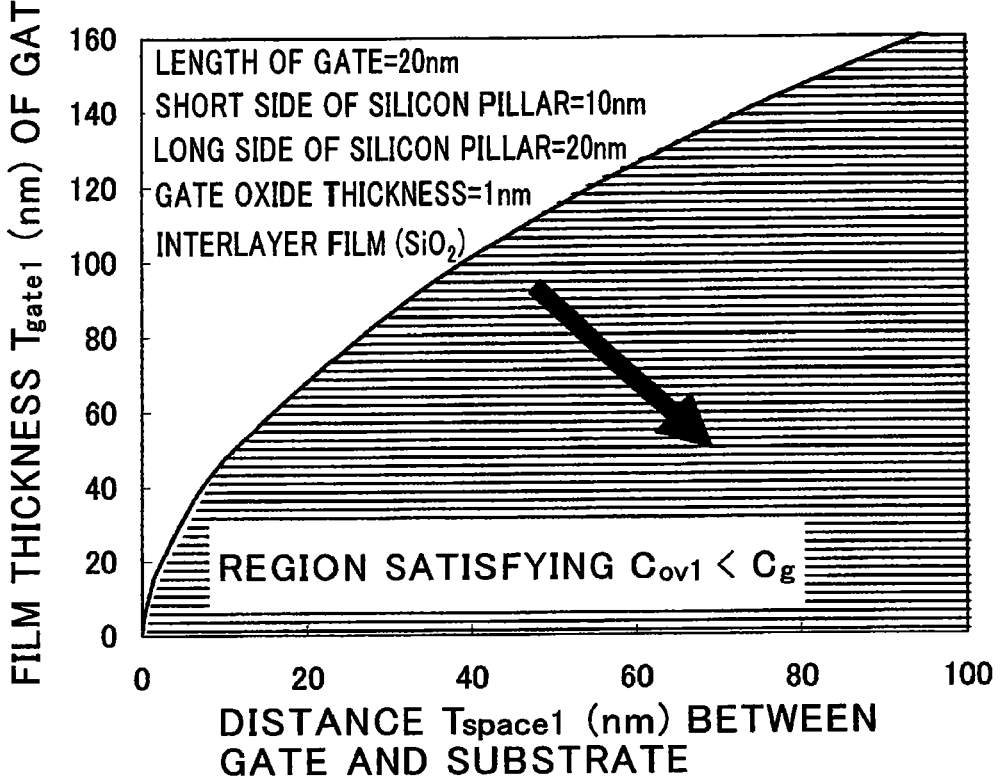
FIG. 90 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 85.

In FIG. 90, $C_{ov1}$ becomes less than $C_g$ in a region on the side of the arrowed direction.

Further, in order to reduce the parasitic capacitance in the thirteenth embodiment, it is desirable that a parasitic capacitance $C_{ov2}$ between the gate 210 and the second silicon pillar 820 is less than the gate capacitance $C_g$, as shown in the following formula (13-13):

$$C_{ov2} < C_g \qquad (13\text{-}13)$$

Specifically, given that: the length of the gate 210 is 20 nm; the length R of the short side of the first silicon pillar 810 is 10 nm; the film thickness $T_{ox}$ of the gate oxide layer 310 is 1 nm; and the interlayer film is made of $SiO_2$. A relationship of the capacitance $C_{ov2}$ between the gate 210 and the second silicon pillar 820, the dielectric constant $\varepsilon_x$ of the interlayer film 610, a cross-sectional area S2 of the gate 210, and a distance $T_{space2}$ between the gate 210 and the second silicon pillar 820, is expressed as the following formula (13-14), and then the formula (13-14) is assigned to the formula (13-13) to obtain the following formula (13-15):

$$S2 < \frac{C_g}{\varepsilon_x} T_{space2} \qquad (13\text{-}14)$$

$$C_{ov2} = \frac{\varepsilon_x S2}{T_{space2}} \qquad (13\text{-}15)$$

The gate capacitance $C_g$ is expressed as the following formula (13-16) which is a relational expression of the dielectric constant $\varepsilon_{ox}$ of the gate oxide layer 310, the length l of the gate 210, a peripheral length w (6R) of the first silicon pillar 810, and the film thickness $T_{ox}$ of the gate oxide layer 310, and the cross-sectional area S2 of the gate 210 is expressed as the following formula (13-17). Thus, the formulas (13-16) and (13-17) are assigned to the formula (13-16) to obtain the following conditional formula (13-18) representing a relationship between the cross-sectional area S2 of the gate 210, and the distance $T_{space2}$ between the gate 210 and the second silicon pillar 820:

$$C_g = \frac{\varepsilon_{ox} \cdot 6R \cdot l}{T_{ox}} \qquad (13\text{-}16)$$

$$S2 = (R + 2T_{ox} + 2T_{gate2})(2R + 2T_{ox} + 2T_{gate2}) - \qquad (13\text{-}17)$$
$$(R + 2T_{ox})(2R + 2T_{ox})$$

$$(R + 2T_{ox} + 2T_{gate2})(2R + 2T_{ox} + 2T_{gate2}) - \qquad (13\text{-}18)$$
$$(R + 2T_{ox})(2R + 2T_{ox}) < \frac{\varepsilon_{ox} \cdot 6Rl}{\varepsilon_x \cdot T_{ox}} \cdot T_{space2}$$

If the conditional formula (13-18) is satisfied, the formula (13-13) is satisfied. Thus, the above values are assigned to the formula (13-18) to obtain the following formula (13-19) (unit in the formulas (13-19): nm (FIG. 91):

$$1.2e3 \cdot T_{space2} > 4T_{gate2}^2 + 68T_{gate2} \Rightarrow C_{ov2} < C_g \qquad (13\text{-}19)$$

Typically, the length of one side of the first silicon pillar 810 is set in the range of 0.25 nm to 25 μm, and the film thickness of the gate oxide layer 310 is set in the range of 0.5 to 100 nm. Further, the length of the gate 210 is set in the range of 5 nm to 10 μm, and the dielectric constant $\varepsilon_x$ of the interlayer film is set in the range of 3.9 to 7.6. In this structure, conditions satisfying the formula (13-1) will be calculated. Given that: the peripheral length of the first silicon pillar 810 is 25 μm; the film thickness of the gate oxide layer 310 is 0.5 nm; the length of the gate 210 is 10 μm, and the dielectric constant $\varepsilon_x$ of the interlayer film is 3.9. The gate capacitance $C_g$ is expressed as the following formula (13-20) which is a relational expression of the dielectric constant $\varepsilon_{ox}$ of the gate oxide layer 310, the length l of the gate 210, the peripheral length w of the first silicon pillar 810, and the film thickness $T_{ox}$ of the gate oxide layer 310, and the cross-sectional area S2 of the gate 210 is expressed as the following formula (13-21). Thus, the formulas (13-20) and (13-21) are assigned to the formula (13-15) to obtain the following conditional formula (13-22) representing a relationship between the cross-sectional area S2 of the gate 210, and the distance $T_{space2}$ between the gate 210 and the second silicon pillar 820:

$$C_g = \frac{\varepsilon_{ox} \cdot 4R \cdot l}{T_{ox}} \qquad (13\text{-}20)$$

$$S2 = (R + 2T_{ox} + 2T_{gate2})(2R + 2T_{ox} + 2T_{gate2}) - \qquad (13\text{-}21)$$
$$(R + 2T_{ox})(2R + 2T_{ox})$$

$$(R + 2T_{ox} + 2T_{gate2})(2R + 2T_{ox} + 2T_{gate2}) - \qquad (13\text{-}22)$$
$$(R + 2T_{ox})(2R + 2T_{ox}) < \frac{\varepsilon_{ox} \cdot 6Rl}{\varepsilon_x \cdot T_{ox}} \cdot T_{space2}$$

If the conditional formula (13-22) is satisfied, the formula (13-23) is satisfied. Thus, the above values are assigned to the formula (13-22) to obtain the following formula (13-23), and then the following formula (13-24) is obtained from the formula (13-23) (unit in the formulas (13-23) and (13-24): μm):

$$3.0e6 \cdot T_{space2} > 4T_{gate2}^2 + 1.5e2T_{gate2} \Rightarrow C_{ov2} < C_g \qquad (13\text{-}23)$$

$$3.0e6 \cdot T_{space2} >> 4T_{gate2}^2 + 1.5e2T_{gate2} \Rightarrow C_{ov2} << C_g \qquad (13\text{-}24)$$

Figure 91:
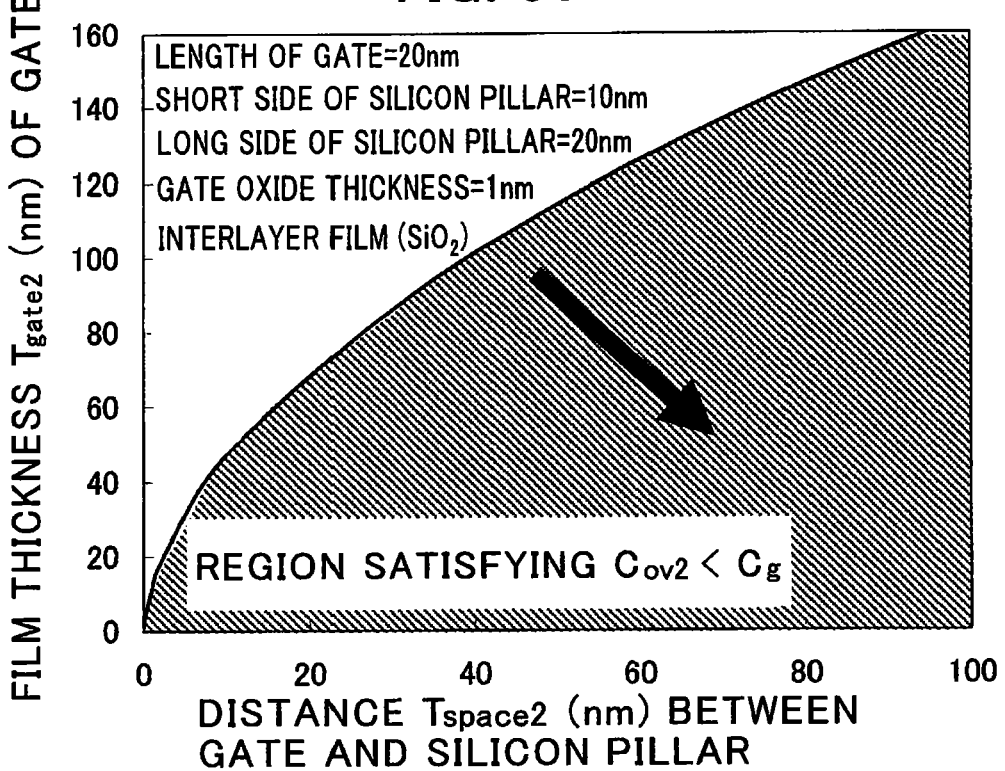
FIG. 91 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 85.

In FIG. 91, $C_{ov2}$ becomes less than $C_g$ in a region on the side of the arrowed direction.

Fourteenth Embodiment

Semiconductor Device

Figure 92:
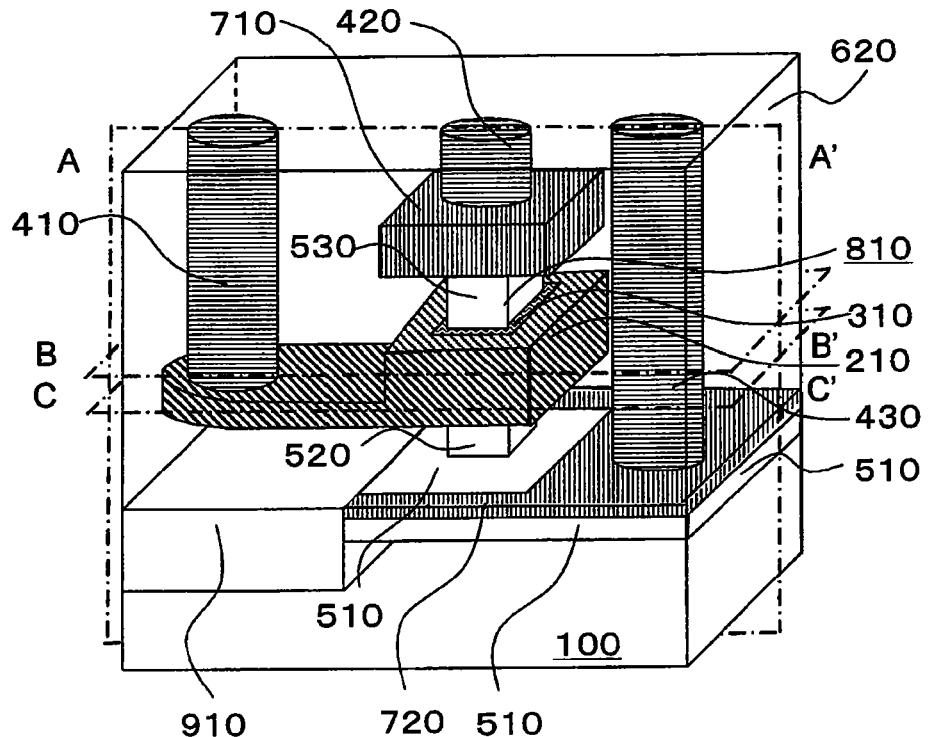
FIG. 92 is a bird's-eye view showing a semiconductor device according to a fourteenth embodiment of the present invention.
Figure 93:
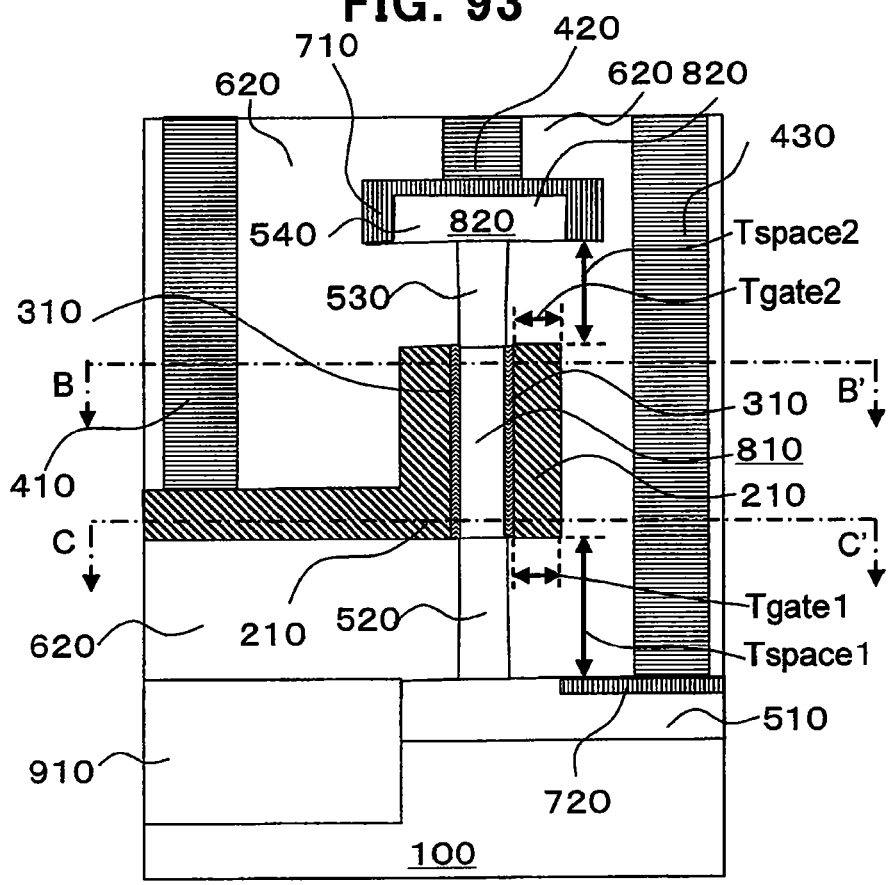
FIG. 93 is a sectional view of the semiconductor device, taken along the line A-A' in FIG. 92.
Figure 94:
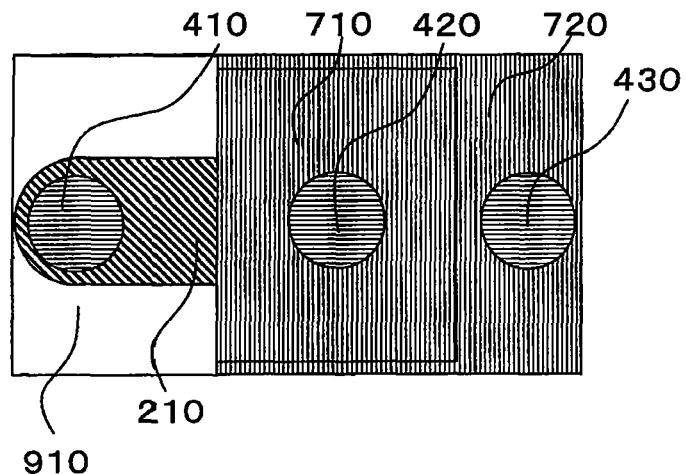
FIG. 94 is a top view of the semiconductor device in FIG. 92.
Figure 95:
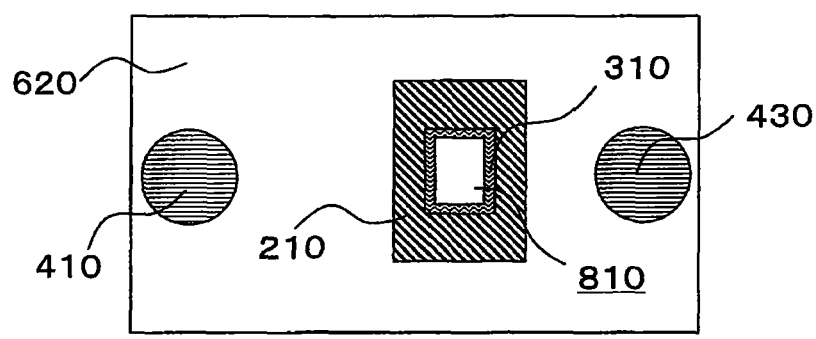
FIG. 95 is a sectional view of the semiconductor device, taken along the line B-B' in FIG. 93.
Figure 96:
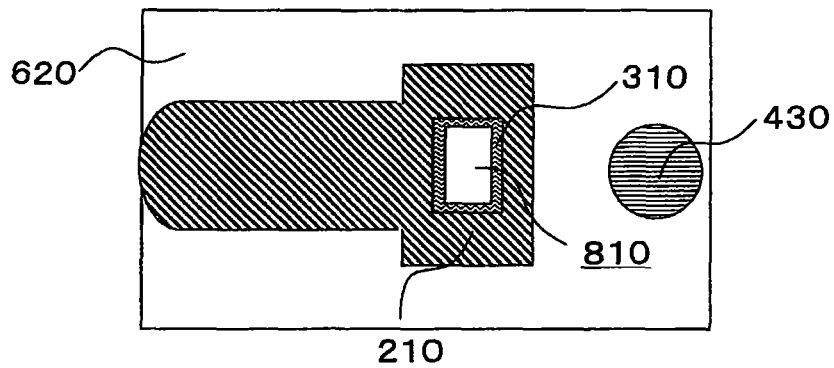
FIG. 96 is a sectional view of the semiconductor device, taken along the line C-C' in FIG. 93.

FIG. 92 is a schematic bird's-eye view showing a transistor in a semiconductor device according to the fourteenth embodiment of the present invention, wherein the semiconductor device according to the fourteenth embodiment is the same as that in the thirteenth embodiment, except that the interlayer film 610 made of $SiO_2$ is replaced by an interlayer film 620 made of SiN. FIG. 93 is a schematic sectional view taken along the cutting-plane line A-A' in FIG. 92, and FIG. 94 is a top view of the transistor in FIG. 92. FIG. 95 is a schematic sectional view taken along the cutting-plane line B-B' in FIG. 93, and FIG. 96 is a schematic sectional view taken along the cutting-plane line C-C' in FIG. 93. As with the thirteenth embodiment, in order to reduce a parasitic capacitance in the fourteenth embodiment, it is desirable that the parasitic capacitance $C_{ov1}$ between the gate 210 and the semiconductor substrate 100 is less than the gate capacitance $C_g$, as shown in the following formula (14-1):

$$C_{ov1} < C_g \tag{14-1}$$

Specifically, given that: the length of the gate 210 is 20 nm; the short and long sides of the first silicon pillar 810 are 10 nm and 20 nm, respectively; and the film thickness $T_{ox}$ of the gate oxide layer 310 is 1.0 nm (EOT). Based on the formula (13-6) in the thirteenth embodiment, the following conditional formula (14-2) representing a relationship between the film thickness $T_{gate1}$ of the gate 210, and the distance $T_{space1}$ between the gate 210 and the semiconductor substrate 100, is obtained (unit in the formulas (14-2): nm) (FIG. 97):

$$6.2e2 \cdot T_{space1} > 4T_{gate1}^2 + 68T_{gate1} \Rightarrow C_{ov1} < C_g \tag{14-2}$$

Figure 97:
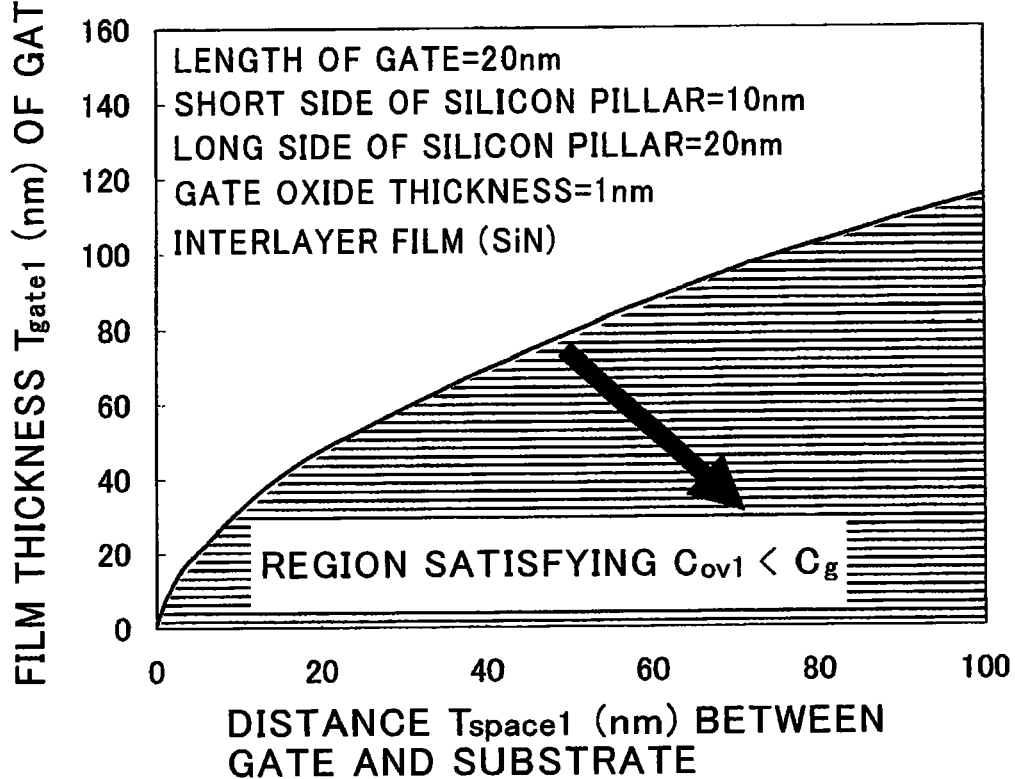
FIG. 97 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 92 where an interlayer film is made of SiN.

In FIG. 97, $C_{ov1}$ becomes less than $C_g$ in a region on the side of the arrowed direction.

Further, as with the thirteenth embodiment, in order to reduce the parasitic capacitance in the fourteenth embodiment where the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (14-3):

$$C_{ov2} < C_g \tag{14-3}$$

Based on the formula (13-18) in the thirteenth embodiment, the following conditional formula (14-4) representing a relationship between the film thickness $T_{gate2}$ of the gate 210, and the distance $T_{space2}$ between the gate 210 and the second silicon pillar 820, is obtained (unit in the formula (14-4): nm) (FIG. 98):

$$6.2e2 \cdot T_{space2} > 4T_{gate2}^2 + 68T_{gate2} \Rightarrow C_{ov2} < C_g \tag{14-4}$$

Figure 98:
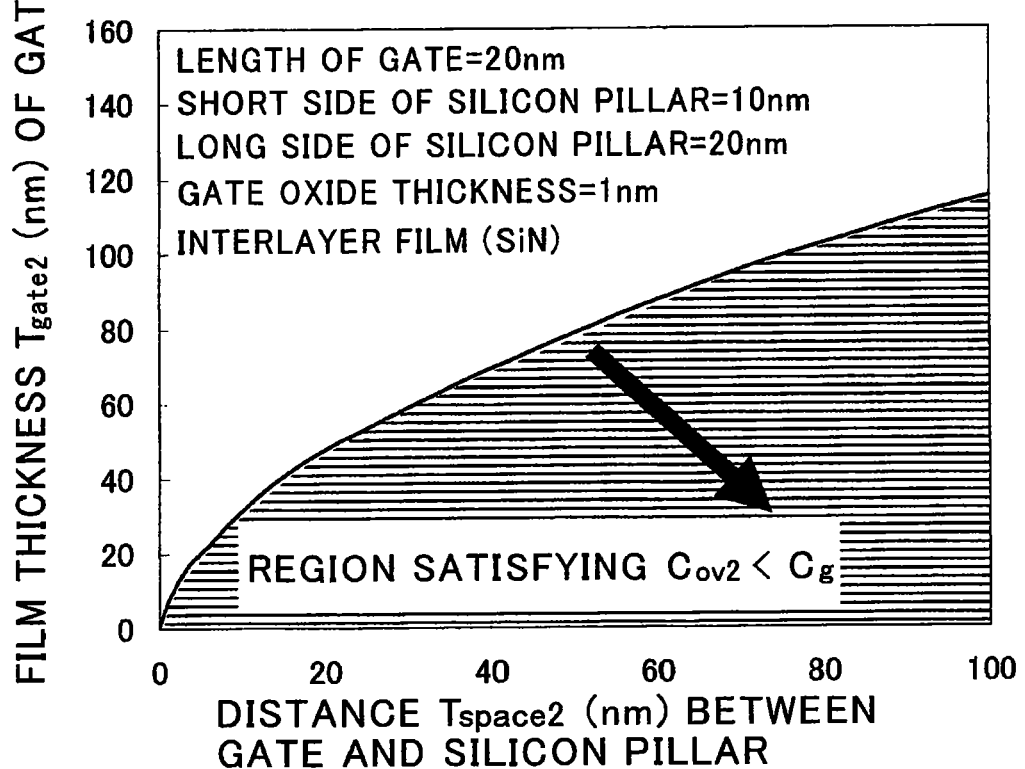
FIG. 98 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 92 where an interlayer film is made of SiN.

In FIG. 98, $C_{ov2}$ becomes less than $C_g$ in a region on the side of the arrowed direction.

Fifteenth Embodiment

Semiconductor Device

Figure 99:
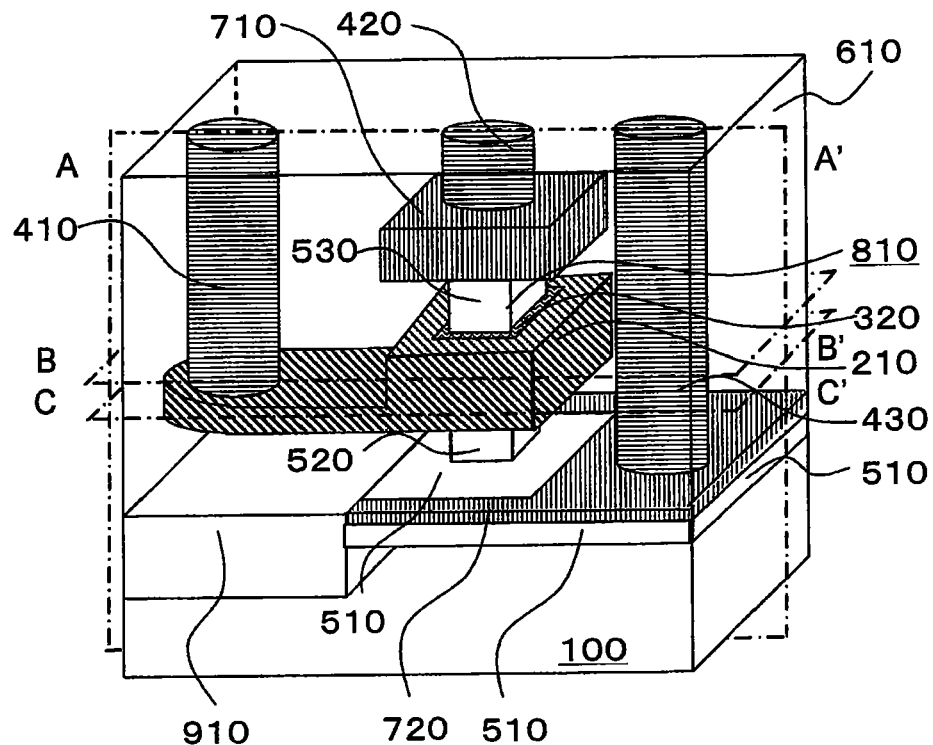
FIG. 99 is a bird's-eye view showing a semiconductor device according to a fifteenth embodiment of the present invention.
Figure 100:
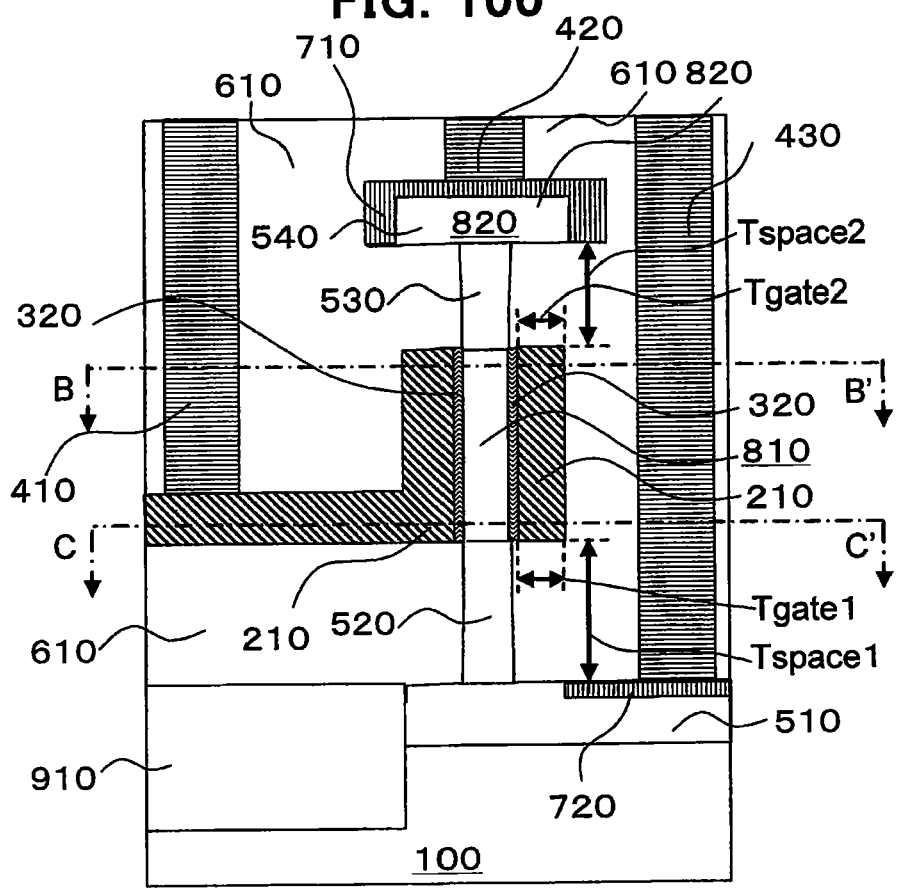
FIG. 100 is a sectional view of the semiconductor device, taken along the line A-A' in FIG. 99.
Figure 101:
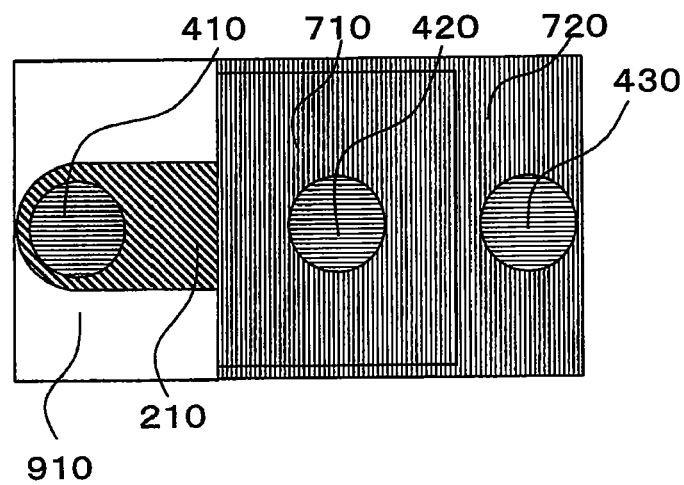
FIG. 101 is a top view of the semiconductor device in FIG. 99.
Figure 102:
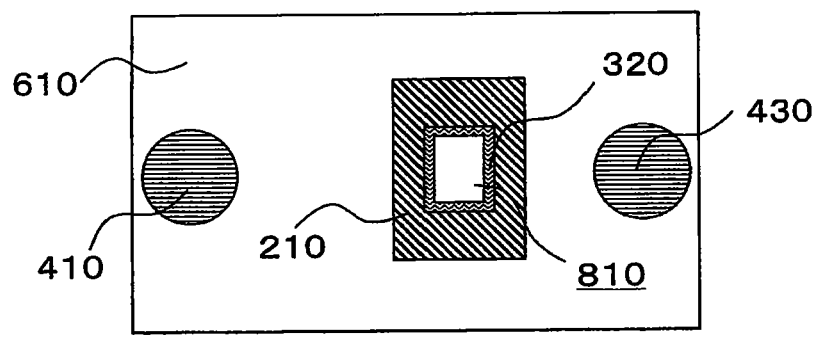
FIG. 102 is a sectional view of the semiconductor device, taken along the line B-B' in FIG. 100.
Figure 103:
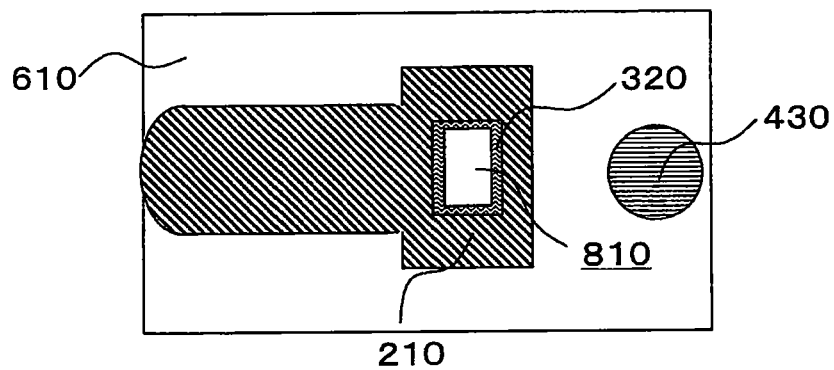
FIG. 103 is a sectional view of the semiconductor device, taken along the line C-C' in FIG. 100.

FIG. 99 is a schematic bird's-eye view showing a transistor in a semiconductor device according to the fifteenth embodiment of the present invention, wherein the semiconductor device according to the fifteenth embodiment is the same as that in the thirteenth embodiment, except that the gate oxide layer 310 made of $SiO_2$ is replaced by a gate oxide layer 320 made of $HfO_2$. FIG. 100 is a schematic sectional view taken along the cutting-plane line A-A' in FIG. 99, and FIG. 101 is a top view of the transistor in FIG. 99. FIG. 102 is a schematic sectional view taken along the cutting-plane line B-B' in FIG. 100, and FIG. 103 is a schematic sectional view taken along the cutting-plane line C-C' in FIG. 100. As with the thirteenth embodiment, in order to reduce a parasitic capacitance in the fifteenth embodiment, it is desirable that the parasitic capacitance $C_{ov1}$ between the gate 210 and the semiconductor substrate 100 is less than the gate capacitance $C_g$, as shown in the following formula (15-1):

$$C_{ov1} < C_g \tag{15-1}$$

Specifically, given that: the length of the gate 210 is 20 nm; the length R of the short side of the first silicon pillar 810 is 10 nm; and the film thickness $T_{ox}$ of the gate oxide layer 320 made of $HfO_2$ is 1.3 nm (EOT). Based on the formula (13-6) in the thirteenth embodiment, the following conditional formula (15-2) representing a relationship between the film thickness $T_{gate1}$ of the gate 210, and the distance $T_{space1}$ between the gate 210 and the semiconductor substrate 100, is obtained (unit in the formulas (15-2): nm) (FIG. 104):

$$8.0e2 \cdot T_{space1} > 4T_{gate1}^2 + 1.0e2T_{gate1} \Rightarrow C_{ov1} < C_g \tag{15-2}$$

Figure 104:
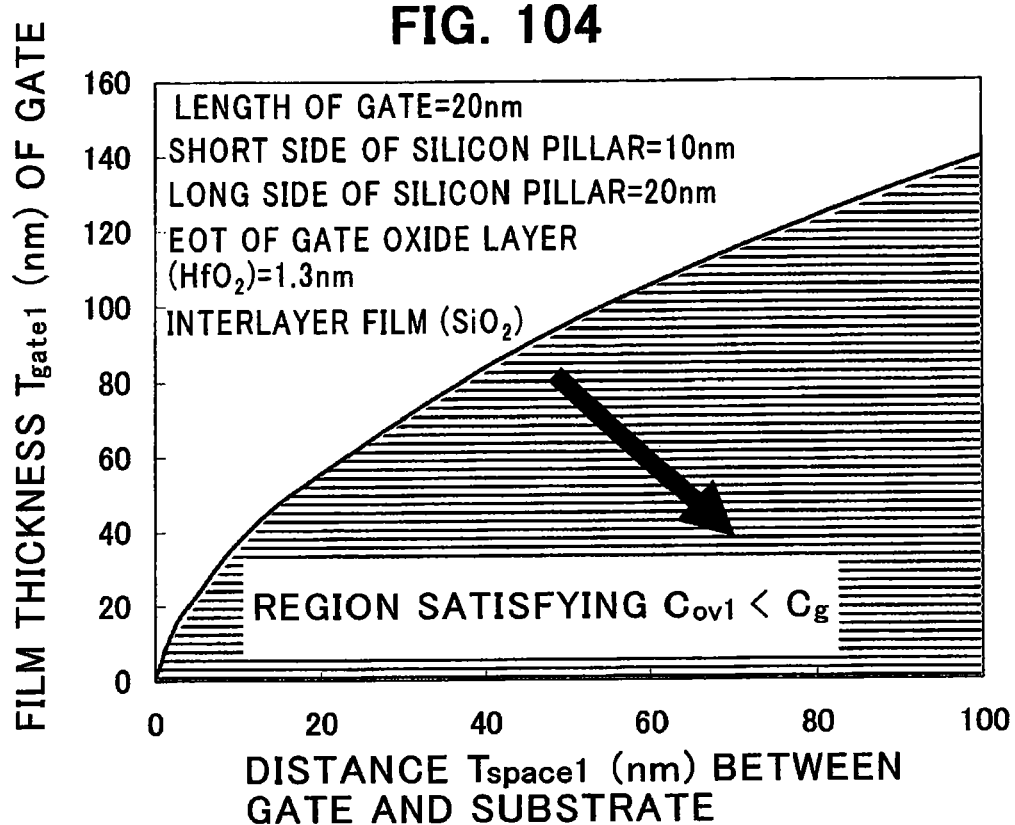
FIG. 104 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 99 where a gate oxide layer is made of $HfO_2$.

In FIG. 104, $C_{ov1}$ becomes less than $C_g$ in a region on the side of the arrowed direction.

Further, as with the thirteenth embodiment, in order to reduce the parasitic capacitance in the fifteenth embodiment where the gate oxide layer 320 is made of SiN, instead of $SiO_2$, it is desirable that the parasitic capacitance $C_{ov2}$ between the gate 210 and the second silicon pillar 820 is less than the gate capacitance $C_g$, as shown in the following formula (15-3):

$$C_{ov2} < C_g \tag{15-3}$$

Based on the formula (13-18) in the thirteenth embodiment, the following conditional formula (15-4) representing a relationship between the film thickness $T_{gate2}$ of the gate 210, and the distance $T_{space2}$ between the gate 210 and the second silicon pillar 820, is obtained (unit in the formula (15-4): nm) (FIG. 105):

$$8.0e2 \cdot T_{space2} > 4T_{gate2}^2 + 1.0e2T_{gate2} \Rightarrow C_{ov2} < C_g \tag{15-4}$$

Figure 105:
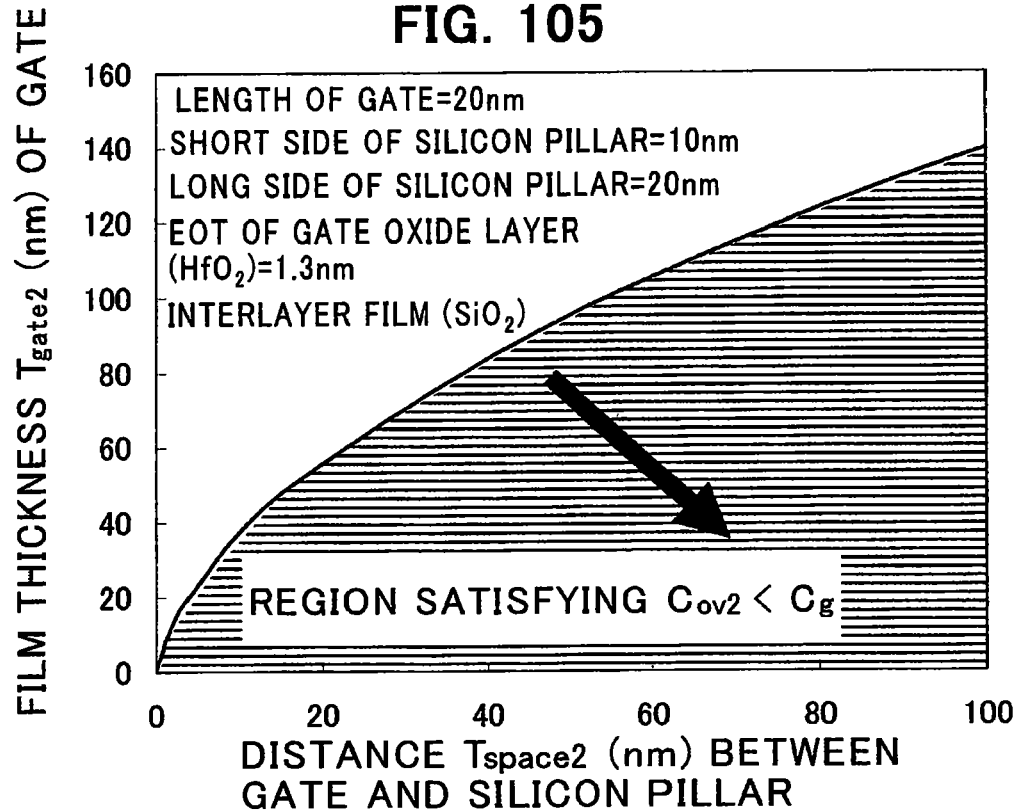
FIG. 105 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 99 where a gate oxide layer is made of $HfO_2$.

In FIG. 105, $C_{ov2}$ becomes less than $C_g$ in a region on the side of the arrowed direction.

Sixteenth Embodiment

Semiconductor Device

Figure 106:
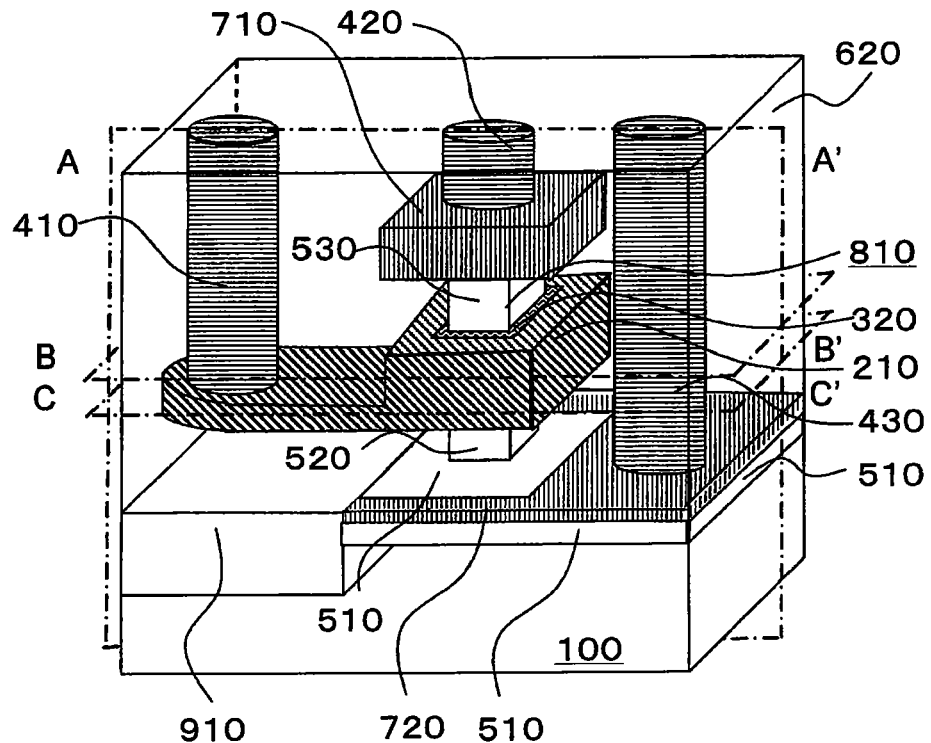
FIG. 106 is a bird's-eye view showing a semiconductor device according to a sixteenth embodiment of the present invention.
Figure 107:
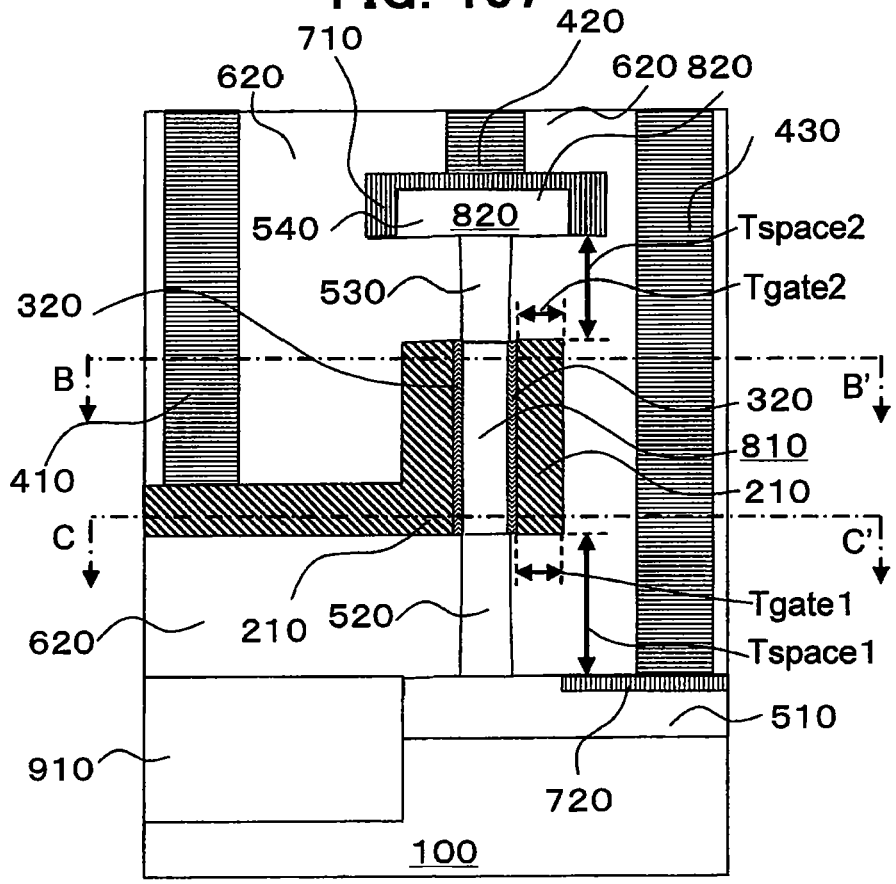
FIG. 107 is a sectional view of the semiconductor device, taken along the line A-A' in FIG. 106.
Figure 108:
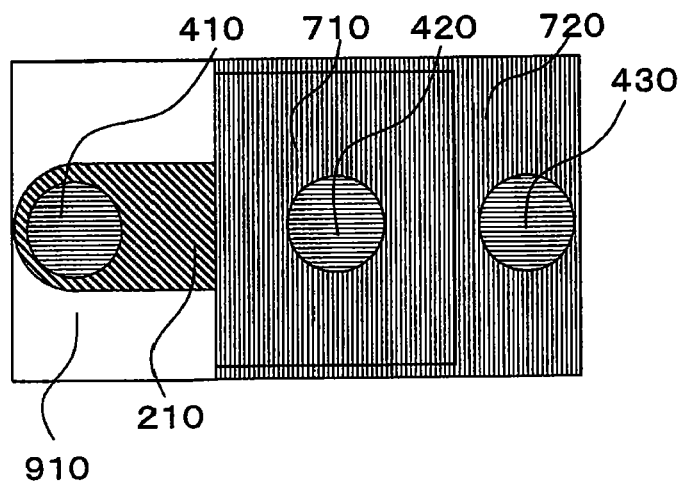
FIG. 108 is a top view of the semiconductor device in FIG. 106.
Figure 109:
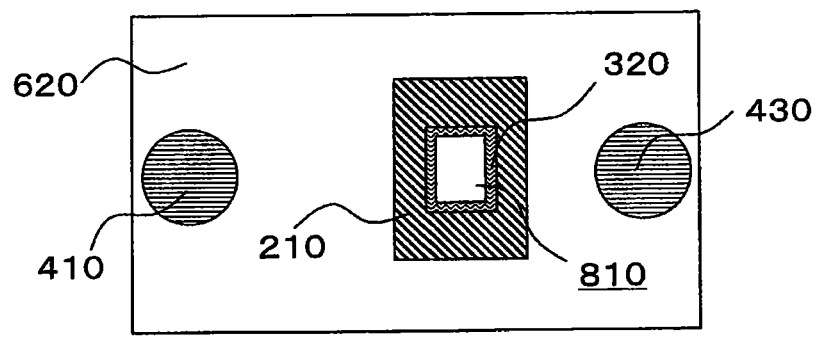
FIG. 109 is a sectional view of the semiconductor device, taken along the line B-B' in FIG. 107.
Figure 110:
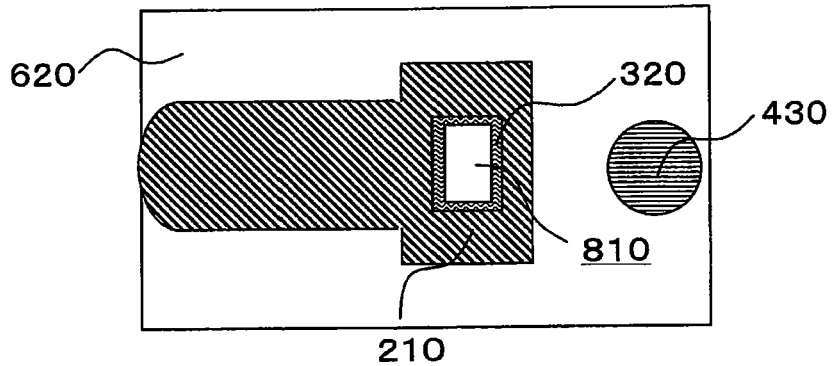
FIG. 110 is a sectional view of the semiconductor device, taken along the line C-C' in FIG. 107.

FIG. 106 is a schematic bird's-eye view showing a transistor in a semiconductor device according to the sixteenth embodiment of the present invention, wherein the semiconductor device according to the sixteenth embodiment is the same as that in the thirteenth embodiment, except that the gate oxide layer 310 made of $SiO_2$ is replaced by a gate oxide layer 320 made of $HfO_2$, and the interlayer film 610 made of $SiO_2$ is replaced by an interlayer film 620 made of SiN. FIG. 107 is a schematic sectional view taken along the cutting-plane line A-A' in FIG. 106, and FIG. 108 is a top view of the transistor in FIG. 106. FIG. 109 is a schematic sectional view taken along the cutting-plane line B-B' in FIG. 107, and FIG. 110 is a schematic sectional view taken along the cutting-plane line C-C' in FIG. 107. As with the thirteenth embodiment, in order to reduce a parasitic capacitance in the sixteenth embodiment, it is desirable that the parasitic capacitance $C_{ov1}$ between the gate 210 and the semiconductor substrate 100 is less than the gate capacitance $C_g$, as shown in the following formula (16-1):

$$C_{ov1} < C_g \tag{16-1}$$

Specifically, given that: the length of the gate 210 is 20 nm; the length R of the short side of the first silicon pillar 810 is 10 nm; and the film thickness $T_{ox}$ of the gate oxide layer 320 made of $HfO_2$ is 1.3 nm (EOT). Based on the formula (13-6) in the thirteenth embodiment, the following conditional formula (16-2) representing a relationship between the film thickness $T_{gate1}$ of the gate 210, and the distance $T_{space1}$ between the gate 210 and the semiconductor substrate 100, is obtained (unit in the formulas (16-2): nm) (FIG. 111):

$$4.1e2 \cdot T_{space1} > 4T_{gate1}^2 + 1.0e2T_{gate1} \Rightarrow C_{ov1} < C_g \tag{16-2}$$

Figure 111:
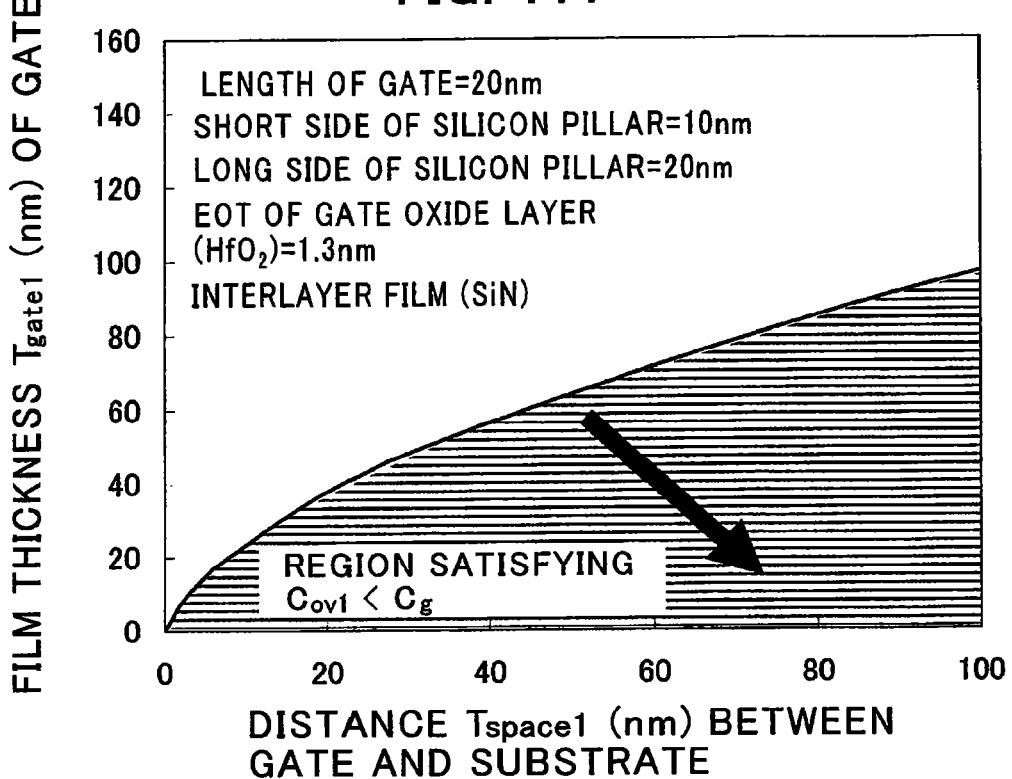
FIG. 111 is a graph showing a relationship between a cross-sectional area S1 of a gate, and a distance $T_{space1}$ between the gate and a semiconductor substrate, which is required for satisfying the condition: $C_{ov1}<C_g$, in the semiconductor device in FIG. 106 where a gate oxide layer is made of $HfO_2$ and an interlayer film is made of SiN.

In FIG. 111, $C_{ov1}$ becomes less than $C_g$ in a region on the side of the arrowed direction.

Further, as with the thirteenth embodiment, in order to reduce the parasitic capacitance in the sixteenth embodiment where the gate oxide layer 320 is made of SiN, instead of $SiO_2$, and the interlayer film 620 is made of SiN, instead of $SiO_2$, it is desirable that the parasitic capacitance $C_{ov2}$ between the gate 210 and the second silicon pillar 820 is less than the gate capacitance $C_g$, as shown in the following formula (16-3):

$$C_{ov2} < C_g \qquad (16\text{-}3)$$

Based on the formula (13-18) in the thirteenth embodiment, the following conditional formula (16-4) representing a relationship between the film thickness $T_{gate2}$ of the gate 210, and the distance $T_{space2}$ between the gate 210 and the second silicon pillar 820, is obtained (unit in the formula (16-4): nm) (FIG. 112):

$$4.1e2 \cdot T_{space2} > 4T_{gate2}^2 + 1.0e2 T_{gate2} \Rightarrow C_{ov2} < C_g \qquad (16\text{-}4)$$

Figure 112:
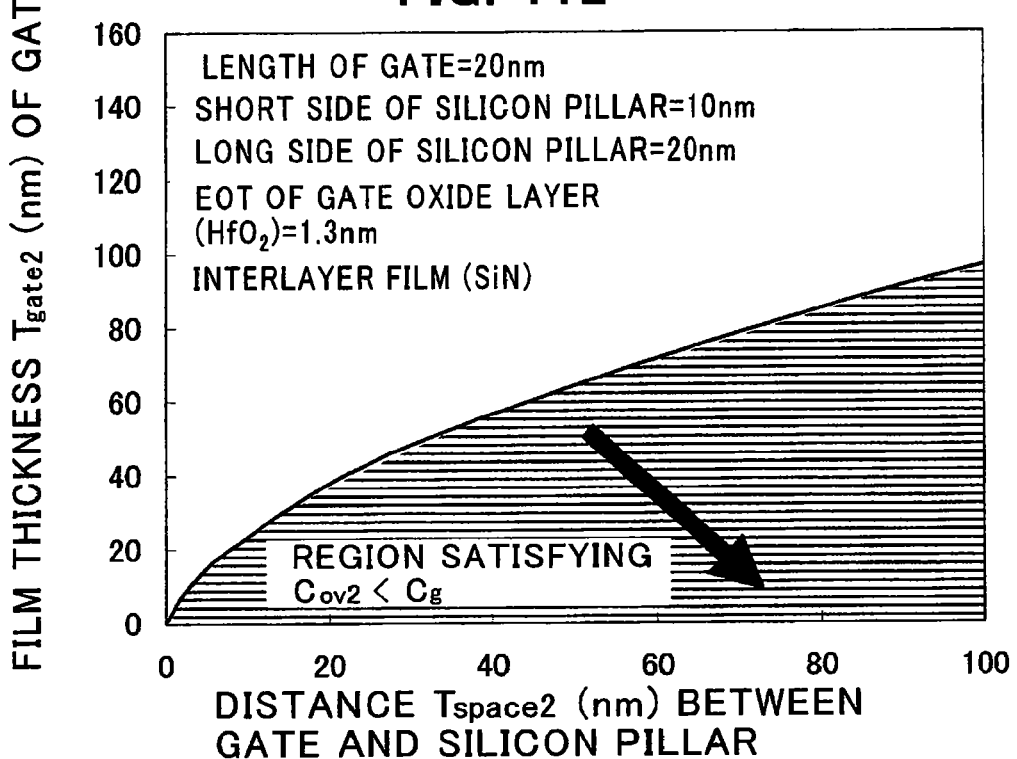
FIG. 112 is a graph showing a relationship between a cross-sectional area S2 of the gate, and a distance $T_{space2}$ between the gate and a second silicon pillar, which is required for satisfying the condition: $C_{ov2}<C_g$, in the semiconductor device in FIG. 106 where a gate oxide layer is made of $HfO_2$, and an interlayer film is made of SiN.
Figure 113:
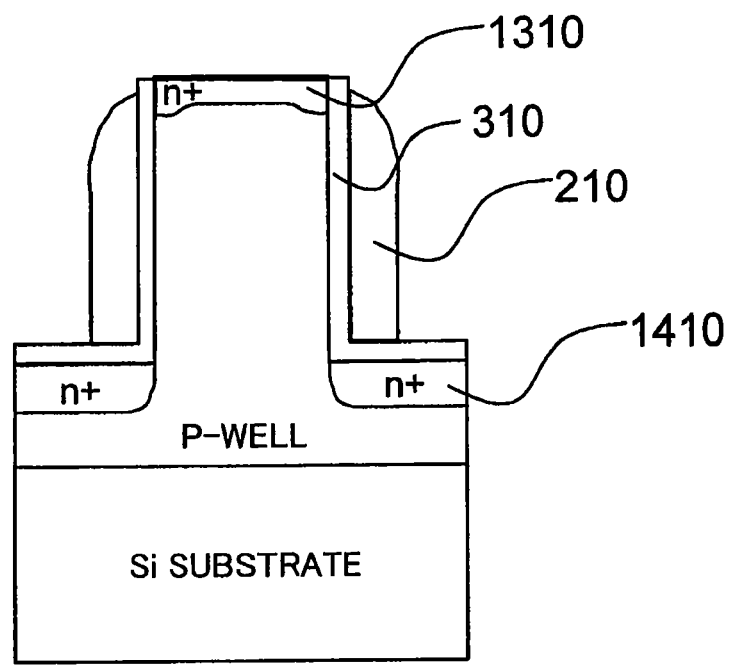
FIG. 113 is a sectional view showing one example of a conventional SGT.
Figure 114:
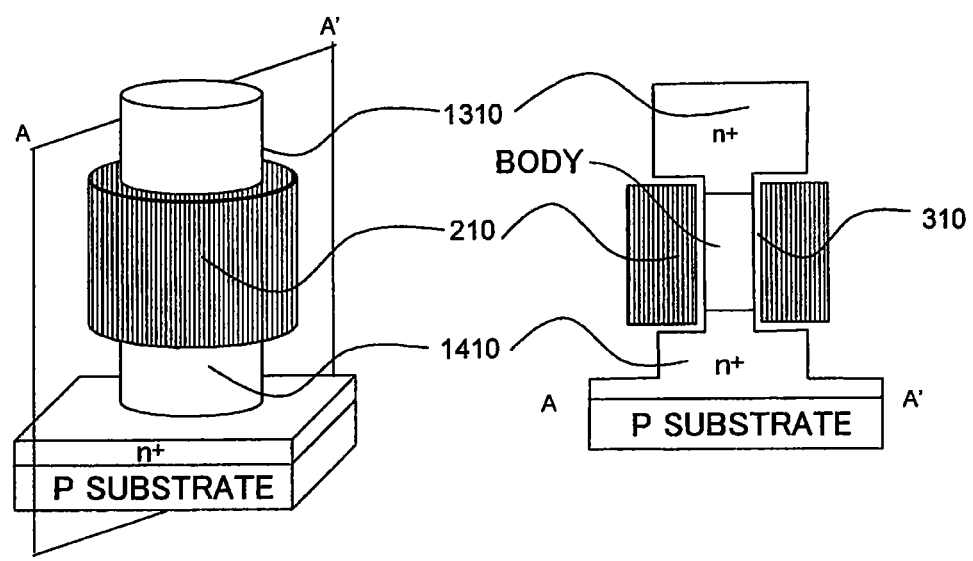
FIG. 114 is a bird's-eye view showing one example of a conventional SGT, and a sectional view taken along the line A-A' therein
Figure 115:
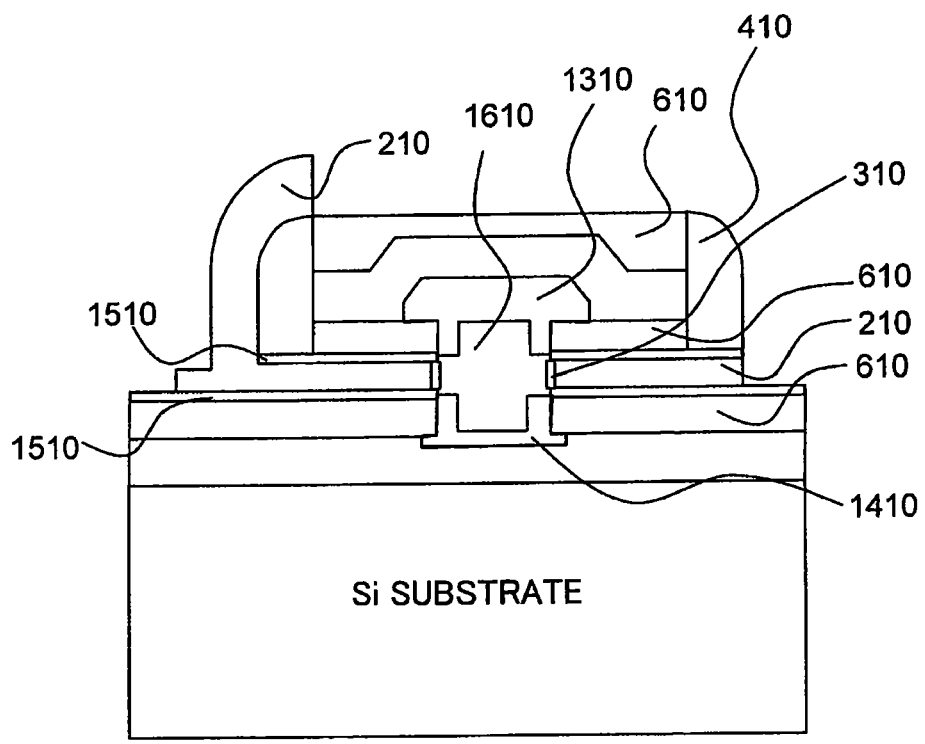
FIG. 115 is a sectional view showing one example of a conventional SGT designed to reduce a parasitic capacitance.
Figure 116:
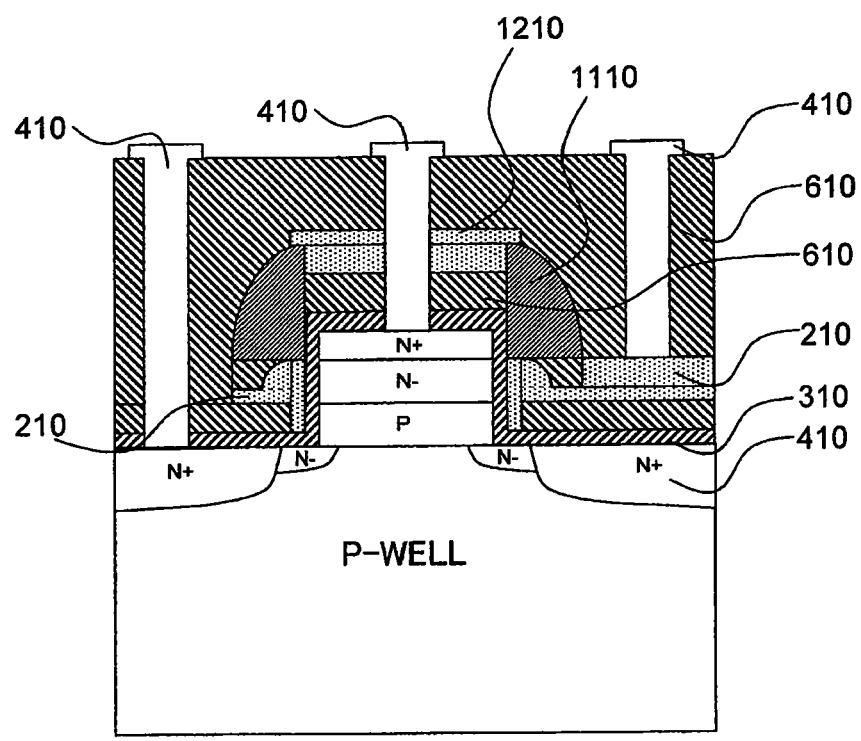
FIG. 116 is a sectional view showing another example of the conventional SGT designed to reduce a parasitic capacitance.

In FIG. 112, $C_{ov2}$ becomes less than $C_g$ in a region on the side of the arrowed direction.

As above, the present invention provides a semiconductor device which comprises a second-conductive type impurity region formed in a part of a first-conductive type semiconductor substrate, a first silicon pillar of an arbitrary cross-sectional shape formed on the second-conductive type impurity region, a first insulating body surrounding a part of a surface of the first silicon pillar, a gate surrounding the first insulating body, and a second silicon pillar which is formed on the first silicon pillar and which includes a second-conductive type impurity region, wherein: the gate is disposed to be separated from the semiconductor substrate by the first insulating body and is disposed to be separated from the second silicon pillar by a second insulating body; and each of the capacitance between the gate and the semiconductor substrate, and the capacitance between the gate and the second silicon pillar, is less than a gate capacitance.

Thus, the present invention can reduce a parasitic capacitance of a semiconductor device to provide a semiconductor device for a high-speed and low-power consumption ULSI (ultra large-scale integration) circuit.

What is claimed is:
1. A semiconductor device comprising:
   a first-conductive type semiconductor substrate
   a second-conductive type impurity region formed in a part of the first-conductive type semiconductor substrate;
   a first silicon pillar of an arbitrary cross-sectional shape formed on the second-conductive type impurity region;
   a first insulating body surrounding a part of a surface of the first silicon pillar;
   a gate surrounding the first insulating body;
   a second silicon pillar which is formed on the first silicon pillar and which includes a second-conductive type impurity region and a diameter of the second silicon pillar being wider than a diameter of the first silicon pillar,
   a second insulating body surrounding a remaining surface of the first silicon pillar which is not surrounded by the first insulating body, the second insulating body surrounding the gate and the second silicon pillar,
   wherein the first silicon pillar includes a second-conductive type high-concentration impurity region adjacent the second-conductive type impurity region formed in the part of the semiconductor substrate, and a second-conductive type high-concentration impurity region adjacent the second silicon pillar;
   wherein:
   the gate is disposed to be separated from the semiconductor substrate by the second insulating body and is disposed to be separated from the second silicon pillar by the second insulating body; and
   the capacitance between the gate and the semiconductor substrate is less than a gate capacitance, or the capacitance between the gate and the second silicon pillar is less than the gate capacitance.

2. The semiconductor device according to claim 1, wherein a cross-sectional area (unit: $nm^2$) of the gate is less than a value derived by multiplying a distance (unit: nm) between the gate and the semiconductor substrate separated by the second insulating body, by $2 \times 10^9$, or is less than a value derived by multiplying the distance (unit: nm) between the gate and the second silicon pillar separated by the second insulating body, by $2 \times 10^9$.

3. The semiconductor device according to claim 1, wherein:
   a thickness $T_{gate1}$ (unit: μm) of one of opposite ends of the gate and a distance $T_{space1}$ (unit: μm) between the gate and the semiconductor substrate separated by the second insulating body satisfy the following relational expression:

$$2.0e6 \cdot T_{space1} > \pi T_{gate1}^2 + 1.0e2 T_{gate1}; \text{ or}$$

the thickness $T_{gate2}$ (unit: μm) of the other end of the gate, and a distance $T_{space2}$ (unit: μm) between the gate and the second silicon pillar separated by the second insulating body, satisfy the following relational expression:

$$2.0e6 \cdot T_{space1} > \pi T_{gate1}^2 + 1.0e2 T_{gate1}.$$

4. The semiconductor device according to claim 1, wherein:
   the first silicon pillar is comprised of a cross-sectionally square-shaped silicon pillar; and
   each of the first insulating body surrounding the part of the surface of the first silicon pillar and the gate surrounding the first insulating body has a cross-sectionally square shape.

5. The semiconductor device according to claim 4, wherein:
   a thickness $T_{gate1}$ (unit: μm) of one of opposite ends of the gate and a distance $T_{space1}$ (unit: μm) between the gate and the semiconductor substrate separated by the second insulating body satisfy the following relational expression:

$$2.0e6 \cdot T_{space1} > 4 T_{gate1}^2 + 1.0e2 T_{gate1}; \text{ or}$$

the thickness $T_{gate2}$ (unit: μm) of the other end of the gate and a distance $T_{space2}$ (unit: μm) between the gate and the second silicon pillar separated by the second insulating body satisfy the following relational expression:

$$2.0e6 \cdot T_{space1} > 4 T_{gate1}^2 + 1.0e2 T_{gate1}.$$

6. The semiconductor device according to claim 1, wherein:
   the first silicon pillar is comprised of a cross-sectionally rectangular-shaped silicon pillar; and
   each of the first insulating body surrounding the part of the surface of the first silicon pillar and the gate surrounding the first insulating body has a cross-sectionally rectangular shape.

7. The semiconductor device according to claim 6, wherein:
   a thickness $T_{gate1}$ (unit: μm) of one of opposite ends of the gate and a distance $T_{space1}$ (unit: μm) between the gate and the semiconductor substrate separated by the second insulating body satisfy the following relational expression:

$$3.0e6 \cdot T_{space1} > 4T_{gate1}^2 + 1.5e2 T_{gate1}; \text{ or}$$

the thickness $T_{gate2}$ (unit: μm) of the other end of the gate, and a distance $T_{space2}$ (unit: μm) between the gate and the second silicon pillar separated by the second insulating body, satisfy the following relational expression:

$$3.0e6 \cdot T_{space2} > 4T_{gate2}^2 + 1.5e2 T_{gate2}.$$

8. The semiconductor device according to claim 1, wherein the second insulating body is made of $SiO_2$ or SiN, or has a layered structure of $SiO_2$ and SiN.

9. The semiconductor device according to claim 1, wherein the first insulating body is made of one selected from the group consisting of $SiO_2$, $HfO_2$, and SiON.

10. The semiconductor device according to claim 1, wherein the gate is made of a material selected from the group consisting of TaN, TiN, NiSi, $Ni_3Si$, $Ni_2Si$, PtSi, $Pt_3Si$, and W.

11. The semiconductor device according to claim 1, which further comprises a silicide region formed in a part of the second-conductive type impurity region formed in the part of the semiconductor substrate, and a silicide region formed in a part of a second-conductive type high-concentration impurity region of the second silicon pillar.

\* \* \* \* \*